US006552721B1

(12) United States Patent
Ishikawa

(10) Patent No.: US 6,552,721 B1
(45) Date of Patent: *Apr. 22, 2003

(54) GRAPHIC DATA GENERATING APPARATUS, GRAPHIC DATA GENERATION METHOD, AND MEDIUM OF THE SAME

(75) Inventor: Masayuki Ishikawa, Chiba (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/155,287

(22) PCT Filed: Jan. 26, 1998

(86) PCT No.: PCT/JP98/00293
§ 371 (c)(1),
(2), (4) Date: Sep. 24, 1998

(87) PCT Pub. No.: WO98/33146
PCT Pub. Date: Jul. 30, 1998

(30) Foreign Application Priority Data

Jan. 24, 1997 (JP) .............................. 9-011767

(51) Int. Cl.$^7$ .......................... G06F 3/14; G06T 17/40

(52) U.S. Cl. ..................... 345/418; 473/757; 473/848; 473/850

(58) Field of Search ............................. 345/419, 420, 345/418, 850, 440, 861, 441, 664, 653, 153, 679, 757, 848, 326, 328, 347, 583, 744, 473, 866, 502; 707/501, 513, 1.2, 10, 104, 1; 703/11, 6; 709/203, 218, 463, 42

(56) References Cited

U.S. PATENT DOCUMENTS

| | | | | |
|---|---|---|---|---|
| 5,396,621 A | * | 3/1995 | Mac Gregor | 345/347 |
| 5,469,539 A | * | 11/1995 | Usuda | 345/440 |
| 5,610,653 A | * | 3/1997 | Abecasis | 345/328 |

(List continued on next page.)

FOREIGN PATENT DOCUMENTS

| | | | |
|---|---|---|---|
| JP | 6-35657 | 2/1994 | G06F/3/14 |
| JP | 9-81781 | 3/1997 | G06F/15/62 |

OTHER PUBLICATIONS

Gorgon Lescinsky et al., Interactive scne manipulation in the virtue3d system, Web3d'O2, 2/24–28, 2002, ACM.*

C. Morningstar et al. The Lessons of Lucasfilm's Habitat, *Cyberspace: First Steps*, MIT Press 1992, pp. 273–301.

R. Lea et al., "Community Place: Architecture and Performance," Proceedings of the Second Symposium on Virtual Reality Modeling Language, Feb. 1996, pp. 41–50.

(List continued on next page.)

*Primary Examiner*—Jeffery Brier
*Assistant Examiner*—Wesner Sajous
(74) *Attorney, Agent, or Firm*—Oblon, Spivak, McClelland, Maier & Neustadt, P.C.

(57) ABSTRACT

The present invention relates to a technique for switching file scopes comprised of sets of nodes referred to by a file being edited. Therefore, a scene graph editing tool 424 edits the hierarchical structure of objects and invisible nodes (script nodes). A user displays in a hierarchical tree format the nodes referring to the VRML content being edited in a "Conductor" window of a menu screen. A scene graph editing tool 424 restricts the nodes being edited in the routing and the script preparation to the file scope shown in the scene graph window. A user changes to the nodes referred to by the VRML file after the change in accordance with the change of the VRML file being edited. In this case, a match between script nodes is ensured.

67 Claims, 45 Drawing Sheets

U.S. PATENT DOCUMENTS

| | | | | | |
|---|---|---|---|---|---|
| 5,630,131 | A | * | 5/1997 | Palevich | 345/326 |
| 5,712,964 | A | * | 1/1998 | Kamada | 345/418 |
| 5,815,154 | A | | 9/1998 | Hirschtick et al. | 345/356 |
| 5,838,906 | A | | 11/1998 | Doyle et al. | 395/200.32 |
| 5,926,179 | A | | 7/1999 | Matsuda et al. | 345/355 |
| 5,956,028 | A | | 9/1999 | Matsui et al. | 345/329 |
| 5,956,038 | A | * | 9/1999 | Rekimoto | 345/419 |
| 5,956,039 | A | * | 9/1999 | Woods | 345/419 |
| 5,966,129 | A | | 10/1999 | Matsukuma et al. | 345/418 |
| 5,982,372 | A | | 11/1999 | Brush, II et al. | 345/418 |
| 5,983,003 | A | | 11/1999 | Lection et al. | 395/200.32 |
| 5,995,107 | A | | 11/1999 | Berteig et al. | 345/420 |
| 5,999,944 | A | * | 12/1999 | Lipkin | 707/104 |
| 6,029,180 | A | * | 2/2000 | Murata et al. | 707/501 |
| 6,057,856 | A | | 5/2000 | Miyashita et al. | 345/435 |
| 6,061,695 | A | | 5/2000 | Slivka et al. | 707/513 |
| 6,088,698 | A | * | 7/2000 | Lipkin | 707/10 |
| 6,215,495 | B1 | * | 4/2001 | Grantham et al. | 345/419 |
| 6,253,167 | B1 | * | 6/2001 | Matsuda | 703/11 |
| 6,268,872 | B1 | * | 6/2001 | Matsuda | 345/473 |
| 6,262,734 | B1 | * | 7/2001 | Ishikawa | 345/357 |
| 6,281,900 | B1 | * | 8/2001 | Ishikawa | 345/356 |
| 6,377,255 | B1 | * | 4/2002 | Ishikawa | 345/418 |
| 6,401,237 | B1 | * | 6/2002 | Ishikawa | 717/2 |

OTHER PUBLICATIONS

S. Harrison et al., "Re–Placing Space: The Roles of Place and Space in Collaborative Systems," Proceedings of the ACM Conference on Computer Supporter Cooperative Work, Nov. 1996, pp. 67–76.

The Virtual Reality Modeling Language, Version 1.0 Specification, Nov. 11, 1995 (http://www.vrml.org/vrml1.O/vrml10C.html), p. 1.

E. Ladd, *Platinum Edition Using HTML 3.2, Java 1.1, & CGI*, MacMillian Computer Publishing, Nov. 1996, Chapters 52 & 55.

C. Blohm et al., Liquid Reality: Physics and Locales, from the Internet: http://www.vrmlsite.com/sep96/spotlight/lr/lr.html.

A. Scott, "The Marriage of Java and VRML," from the Internet: http://vrmlsite.com/sep96/spotlight/javavrml/javavrml.html.

A. Scott, "Introduction to Liveconnect & Live 3D," from the Internet: http://vrmlsite.com/nov96/spot6.html.

D. Nadeau et al., "The Virtual Reality Behavior System (VRBS): A Behaviour Language Protocol for VRML," Proceedings of the 1995 Symposium on Virtual Reality Modeling Language, Dec. 1995, p. 61.

P. Joel, "Javascripting VRML," from the Internet: http://vrmlsite.com/dec96/spot3.html.

T. Meyer et al., "Adding Behavior to VRML," Proceedings of the 1995 Symposium on Virtual Reality Modeling Language, Dec. 1995, pp. 45–51.

K. Murdock, *Laura Lemay's Web Workshop: 3D Graphics and VRML 2*, MacMillian Computer Publishing, Sep. 1996, Chapters 18, 20, & 21.

S. Matusuba, *Special Edition Using VRML*, MacMillian Computer Publishing, Feb. 1996, Chapter 28.

M. Morrison et al., *Java Unleashed*, MacMillian Publishing, Apr. 1996, Chapter 34.

K. Matsuda, "Latest Trends of VRML and Cyberpassage VRML 2.0 and Java," Part 1, Bit, vol. 28, No. 7, Jul. 1996, pp. 29–36, English Translation pp. 1–25.

K. Matsuda, "Latest Trends of VRML and Cyberpassage VRML 2.0 and Java," Part 2, Bit, vol. 28, No. 8, Aug. 1996, pp. 57–65, English Translation pp. 1–27.

Y. Honda, "Latest Trends of VRML and Cyberpassage VRML+Network=Cyberspace?" Part 3, Bit, vol. 28, No. 9, Sep. 1996, pp. 29–36, English Translation pp. 1–.

Y. Honda, "Latest Trends of VRML and Cyberpassage How To Build Multi–Usser Environment Using Cyberspace," Part 4, Bit, vol. 28, No. 10, pp. 49–58, English Translation pp. 1–27.

S. Chen et al., "The Out of Box Experience: Lessons Learned Creating Compelling VRML 2.0 Content," Proceedings of the Second Symposium on Virtual Reality Modeling Language, Feb. 1997, pp. 83–92.

W. Broll., "Populating the Internet: Supporting Multiple Users and Shared Applications with VRML," Proceedings of the Second Symposium on Virtual Reality Modeling Language, Feb. 1997, pp. 33–40.

M. Pesce, "VRML Browsing & Building Cyberspace," New Riders Publishing 1995, pp. 43–81.

"Sony Beings OEM Sales of Community Place VRML 2.0 3D Internet Browser and Multi–User Server Software," Jan. 30, 1997 Press Release, Material Collected from the Internet, http://www.world.sony.com/corporateinfo/news–e/199701/9701–30/index.html, 3 pages.

"VRML 2.0 Laboratory–How to Create," Material Collected from the Internet, Mar. 8, 2000, http://www.ses.co.jp/ses/staff/kan/howto1.html, 5 pages.

Virtual Reality Modeling Language Version 2.0, ISO/IEC CD 14772, Aug. 4, 1996.

Application No. 09/155,283, Sep. 24, 1998.
Application No. 09/155,288, Sep. 24, 1998.
Application No. 09/155,281, Sep. 24, 1998.
Application No. 09/155,282, Sep. 24, 1998.

* cited by examiner

PRIMITIVE BAR

POINT OF INTEREST

POINT OF INTEREST

POINT OF INTEREST

DISPLAY AND SETTING OF SENSOR NODE REGION

PARALLEL VIEW
POP-UP

TOP VIEW

WIRE FRAME

ATTENTION

ATTENTION

ATTENTION

ATTENTION PROCESSING

FIG. 26  ROUTING

ROUTING

EXAMPLE OF VRML
CONTENT OF PRODUCTION

SCENE GRAPH WINDOW

LIGHT-ON

ATTRIBUTE WINDOW

ATTRIBUTE WINDOW

ROUTE WINDOW

SCRIPT EXPERT

SCRIPT EXPERT

```
C:\PROGRAM FILES\SONY\COMMUNITY PLACE CONDUCTOR\BIN\SC1.java

// This file was generated by Community Place Conductor Version 1.0 Alpha
//
import vrml.*;
import vrml.node.*;
import vrml.field.*;

public class SC1 extends Script {
        // Declare eventOut Field(s)
        // CPC_VER_DECL begin
        private SFColor m_outColor:
        // CPC_VER_DECL end // Declare initialize()
        public void initialize() {
                // This method is called..
                // CPC_INIT begin
                m_outColor = (SFColor) getEventOut ("outColor"):
                // CPC _INIT end
        }
        // CPC_HANDLER begin
        private void_inBOOLCB (ConstSFBool ev) {
                System. out. println("_inBoolCB() called: "+ ev.getValue()):
        }
        // CPC_HANDLER end
```

32:1    Overwrite

\SC1.java/

Finished.

*FIG. 39*

SCRIPT ATTRIBUTE

ROUTE WINDOW

GRAPHIC DATA GENERATING APPARATUS, GRAPHIC DATA GENERATION METHOD, AND MEDIUM OF THE SAME

TECHNICAL FIELD

The present invention relates to a graphic data generating apparatus, a graphic data generation method, and a medium for the same, more particularly relates to a graphic data generating apparatus, a graphic data generation method, and a medium for the same able to be used for comprehensive editing of a script etc. activated in accordance with an operation of a client (user) with respect to a shape and position of a three-dimensional graphic able to be used for expression of an object in a three-dimensional virtual space and with respect to a displayed three-dimensional image.

More specifically, the present invention relates to a graphic data generating apparatus switching (changing) a file scope of an object in a three-dimensional virtual space, a graphic data generating method for the same, and medium for mediating a program executing that method. When a user selects a content to be edited in a "Conductor" window etc. of a menu screen, a scene graph editing tool in the content preparation software tool operates and displays the nodes referring to the selected file in for example a hierarchical tree format. The set of the nodes referred to by the edited file is called the "file scope". The present invention relates to a technique for improving the switching of such a file scope.

BACKGROUND ART

As a description language capable of comprehensive handling three-dimensional information using the framework of the WWW (World Wide Web) providing various types of information on the Internet, that globally constructed computer network, the VRML (virtual reality modeling language) has been known.

First, an explanation will be given of the historical background up to the development of the VRML.

As an information system able to be used on the Internet, the WWW developed by the Swiss CERN (European Center for Nuclear Research) is known. The WWW was designed to enable text, images, sound, and other multimedia data to be viewed and heard by a hyper text format and asynchronously transfers to personal computers and other terminal equipment information stored in WWW servers based on protocol called HTTP (Hyper Text Transfer Protocol). The WWW is basically comprised of servers and browsers.

A WWW server is comprised of server software known as an HTTP daemon and HTML (Hyper Text Makeup Language) files storing hyper text information. A "daemon" is a program which manages and processes information in the background when working on UNIX.

Hyper text information is expressed by a description language called the HTML. Hyper text is described by HTML by the expression of the logical structure of sentences by format designations known as "tags" surrounded by "<" and ">". Links with other information are described by link information known as "anchors". When designating a location of information by anchors, a URL (Uniform Resource Locator) is used.

The protocol for transferring a file described in HTML on a TCP/IP (Transmission Control Protocol/Internet Protocol) network is HTTP. HTTP functions to send a request for transfer of information from a client to a WWW server and transfer hyper text information of an HTML file to the client.

A WWW browser is often used as the environment for uses of the WWW. "Browse" means to freely view. A browser executes the work for inquiring about information to a server in accordance with an operation of a user. A WWW browser is Netscape Navigator (trademark of Netscape Communications Corporation of the U.S.) and other client software. It is possible to use a WWW browser to browse through files, that is, home pages, of WWW servers on the globally expanding Internet, corresponding to a URL, and possible to successively follow back linked home pages to access various sources of information on the WWW—called "net surfing".

In recent years, the WWW has further expanded. Specifications for description languages for three-dimensional graphics, called VRML, have been formulated enabling description of three-dimensional spaces and setting hyper text links for objects drawn by three-dimensional graphics and enabling a used to successively/access of WWW servers while following back the links. VRML browsers are being developed for displaying three-dimensional spaces described based on such VRML specifications.

Details of VRML are described for example in the reference "VRML o Shiru: 3-Jigen Denno Kukan no Kochiku to Buraujingu (Learn About VRML: Building and Browsing Three-Dimensional Computer Space)", written by Mark Pesce, translated by Koichi Matsuda, Terunao Kamachi, Shoichi Takeuchi, Yasuaki Honda, Junichi Toshimoto, Masayuki Ishikawa, Ken Miyashita, and Kazuhiro Hara, first edition published Mar. 25, 1996, published by Prentis Hall, ISBN4-931356-37-0 (original work: "VRML: Browsing and Building Cyberspace", Mark Pesce, 1995 New Readers Publishing, ISBN 1-56205-498-8) and the reference "VRML no Saishin Doko to CyberPassage (Recent Trends in VRML and CyberPassage)", Koichi Matsuda and Yasuaki Honda, bit (published by Kyoritsu)/1996, Vol. 28, No. 7, pp. 29 to 36, No. 8, pp. 57 to 65, No. 9, pp. 29 to 36, and No. 10, pp. 49 to 58).

The formal and complete specifications in "The Virtual Reality Modeling Language Version 2.0", ISO/IEC CD 14772, Aug. 4, 1996 are disclosed at the following home page address:

http://www.vrml.org/Specifications/VRML2.0/FINAL/spec/ind ex.html

The Japanese language version is disclosed at the following home page address:

http://www.webcity.co.jp/info/andoh/vrml2.0/spec-jp/index.html

As a VRML 2.0 browser and shared server software, for example, the present applicant, Sony Corporation, has developed and is marketing "Community Place (trademark) Browser/Bureau". The β-version (test version) can be downloaded from the Internet home page http://vs.sony.co. jp).

In the VRML 2.0, it is possible to describe and express autonomous behavior of an object in a three-dimensional virtual space. When using VRML 2.0 to prepare VRML content where an object moves around in a three-dimensional virtual space, normally the following process of work is undergone. Note that below the set of a VRML file, script file, etc. for realizing behaviors of a series of objects in a single virtual space is called "VRML content".

Routine for Preparing VRML Content

The general routine for preparing VRML content is described below.

(1) Preparation of Model

The shape, position, etc. of an object (model) arranged in a virtual space are described based on VRML 2.0 to prepare a basic VRML file.

(2) Description of Sensor Node

TouchSensors generating events in the case of click operation by a mouse (pointing operation) on objects in the virtual space, a TimeSensor generating an event when a predetermined time arrives, and other sensor nodes are added to the VRML file.

(3) Description of Routing

The description of the routing for transmission of events generated in accordance with pointing operations with respect to objects to which sensor nodes have been added is added to the VRML file.

(4) Description of Script Node

The description of a script node for transfer of events transmitted by the routing to and from an external script is added to the VRML file.

(5) Preparation of Script File

A script (program) in the Java language (Java is a trademark of Sun Microsystems of the U.S.) for realizing predetermined behavior for objects in the virtual space based on events transmitted through the script node is described to prepare a script file.

The desired VRML content is prepared by the process of description of the above (1) to (5).

When desiring to prepare VRML content accompanying the autonomous behavior of an object in a virtual space based on VRML 2.0, an existing authoring software, called a modeler, for example, 3D Studio Max (trademark), or other software is used to prepare the shape of the object or animation and output the same in the VRML 2.0 format. When the modeler does not support the VRML 2.0 format, it is necessary to use a converter etc. to convert to the VRML 2.0 format.

Further, descriptions of various sensor nodes etc. defined by the VRML 2.0 are added to the VRML file using a text editor, scripts in the Java language are prepared using a text editor, corresponding script nodes are added, routes are added, etc. repeatedly.

Finally, when confirming the actual operation, a VRML browser compatible with VRML 2.0 is activated and the behavior of the object is confirmed by a click operation by a mouse etc.

This method of preparing VRML content features an extremely large amount of complicated work and remarkably poor work efficiency. For example, when adding a field to a script node, it is necessary to revise both the script file and the VRML file. Further, it is necessary to maintain a match between the two.

When designating routing of an event as well, further, it is necessary to ensure a match of the type of the event (format of data). If the format of description of the event etc. is mistaken, when reading by a VRML browser, a composition error will arise and it is necessary to again revise the file. Further, each time a node is added, re-reading by the VRML browser is necessary, so the work efficiency is extremely poor.

Points have been found in the performance of the interactive operation in the conventional method which should be improved. One example of a defect in the interaction is the trouble and inefficiency of the confirmation operation when preparing a world. FIG. 1 is a flow chart of the routine of a conventional method of preparation of a world. The production of the world is classified in two parts. In the first, the model is produced, and in the second, the interaction is produced. Details will be discussed later in comparison with embodiments of the present invention, but while confirmation is necessary when preparing a world, in the conventions method of preparation shown in FIG. 1, as illustrated at step 108, it is necessary to separately use a VRML browser. That is, each time an user is confirming an object in a three-dimensional space expressed by a revised VRML file, it is necessary to activate a VRML browser and designate reading of the revised VRML file or, even when a VRML browser has already been activated, to designate repeat reading of the revised file. The work efficiency in preparing the VRML content was therefore extremely poor.

Further, when a user selects a content to be edited in a "Conductor" window etc. which will be explained later of a menu screen, a scene graph editing tool in the content preparation software tool operates and displays the nodes referring to the selected file in for example a hierarchical tree format. The set of the nodes referred to by the edited file is called the "file scope". It has been desired to improve the switching of such a file scope.

DISCLOSURE OF THE INVENTION

An object of the present invention is to provide a graphic data generating apparatus, a graphic data generating method, and a medium storing a program for execution of the graphic data generating method which realize improved file scope processing able to switch file scopes of an object in a virtual space without error and while maintaining a match.

According to a first aspect of the present invention, there is provided a graphic data generating apparatus comprising a display processing means for displaying a three-dimensional object in an editing window of a display device; an operation instructing means for giving an operation instruction for a displayed object; and a file scope processing means for processing a file scope comprising a set of nodes of a program referred to by a file to be edited, the file scope processing means co-operating with the display processing means and processing the file scope based on an operation instruction given by the operation instructing means.

Preferably, the file scope processing means limits the nodes covered by the editing to the file scope displayed in the window.

According to a second aspect of the present invention, there is provided a graphic data generating apparatus comprising a display processing means for displaying a three-dimensional object in an editing window of a display device; an operation instructing means for giving an operation instruction for a displayed object; a node preparing means for preparing nodes of a program for realizing an event generated in response to an operation instruction from the operation instructing means with respect to a displayed object; and a match holding means for changing the substance of objects and nodes based on a change of substance in any of the objects and nodes in a scope referring to other objects and other nodes or referred to by other objects and nodes to hold the match.

Preferably, further there is provided an editing means for editing the prepared objects and nodes; a selecting means for selecting one of the graphic objects and nodes in response to an operation instruction of the operation instructing means; and an editing coverage restricting means for restricting the coverage of the editing to within a scope including the selected one of the objects and nodes.

Preferably, there is provided a selecting means for selecting one of the graphic objects and nodes in response to an operation instruction of the operation instructing means, and the display processing means operates linked with the selecting means and displays the objects and nodes in the scope including the selected one of the objects and nodes.

Preferably, the match holding means has a first processing means for changing all corresponding data transfer portions of objects and nodes in the same scope to conform with a changed data transfer portion when there is a change in a data transfer portion in one of the graphic objects and nodes transferring data between objects and nodes and a second processing means for changing names of objects and nodes in the same scope so as to be referred to be different names with each reference when objects and nodes are referred to overlappingly by the same node in the said object and node.

According to a third aspect of the present invention, there is provided a graphic data generating method corresponding to the first aspect, that is, a graphic data generating method including the steps of: displaying a three-dimensional data generating method in an editing window of a display device and processing a file scope, comprised of a set of nodes of a program referred to by a file being edited, based on an operation instruction.

Preferably, in the file scope processing, the nodes covered by the editing are limited to the file scope displayed in the window.

According to a fourth aspect of the present invention, there is provided a graphic data generating method corresponding to the second embodiment, that is, a graphic data generating method including the steps of: displaying a three-dimensional object in an editing window of a display device, preparing a program for realizing an event generated in response to an operation on the displayed object, and maintaining a match by changing the substance of objects and nodes based on a change in substance in one of the objects and nodes in a scope referring to other objects and nodes or referred to by other objects and nodes.

Preferably, a medium for mediating the program edits the prepared objects and nodes, selects one of the nodes and nodes in accordance with an operation instruction, and includes the selected one of the objects and nodes in the coverage of the editing.

More preferably, the method includes the steps of: selecting one of the objects and nodes in response to an operation instruction and displaying objects and nodes in a scope containing the selected one of the objects and nodes.

More preferably, the medium for mediating the program performs a first processing for changing all corresponding data transfer portions of objects and nodes in the same scope to conform with a changed data transfer portion when there is a change in a data transfer portion in one of the graphic objects and nodes transferring data between objects and nodes and performs a second processing for changing names of objects and nodes in the same scope so as to be referred to be different names with each reference when objects and nodes are referred to overlappingly by the same node in the said object and node or performs one of the same.

According to a fifth aspect of the present invention, there is provided a medium for mediating a program corresponding to the third aspect, that is, a medium for mediating a program for executing a graphic data generating method including the steps of: displaying a three-dimensional object in an editing window of a display device and processing a file scope comprising a set of nodes of a program referred to by a file being edited based on an operation instruction.

The medium for mediating the program preferably includes a program limiting the nodes being edited to the file scope displayed in the window in the file scope processing.

According to a sixth aspect of the present invention, there is provided a medium for mediating a program corresponding to the fourth aspect, that is, a medium for mediating a program executing a graphic data generating method including the steps of displaying a three-dimensional object in an editing window of a display device; preparing nodes of a program for realizing an event generated in response to an operation instruction with respect to a displayed object; and changing the substance of objects and nodes based on a change of substance in any of the objects and nodes in a scope referring to other objects and other nodes or referred to by other objects and nodes to hold a match.

The medium for mediating the program preferably edits the prepared objects and nodes; selects one of the objects and nodes in response to an operation instruction; and restricts the coverage of the editing to within a scope including the selected one of the objects and nodes.

Preferably, the medium for mediating the program includes a program for displaying the objects and nodes in a scope including the one of the objects and nodes selected in response to the operation instruction.

The medium for mediating the program further preferably contains a program performing a first processing for changing all corresponding data transfer portions of objects and nodes in the same scope to conform with a changed data transfer portion when there is a change in a data transfer portion in one of the graphic objects and nodes transferring data between objects and nodes, and performs a second processing for changing names of objects and nodes in the same scope so as to be referred to be different names with each reference when objects and nodes are referred to overlappingly by the same node in the said object and node or performs one of the same.

The program is mediated in a computer system or is transferred through a network including a server apparatus.

Preferably, the editing covers editing at the time of routing and preparing a script, and the file scope is defined as a hierarchical tree structure.

More preferably, the file is a VRML file.

BRIEF DESCRIPTION OF THE DRAWINGS

The above objects and features and other objects and features of the present invention will become clearer from the following description given with reference to the attached drawings, in which:

FIG. 38 to FIG. 44 show examples of the display in a window when preparing second VRML content;

BEST MODE FOR CARRYING OUT THE INVENTION

Embodiments of the graphic data generating apparatus, graphic data generating method, and medium for mediating a program for executing the graphic data generating method will be explained next.

Network System

Figure 2:
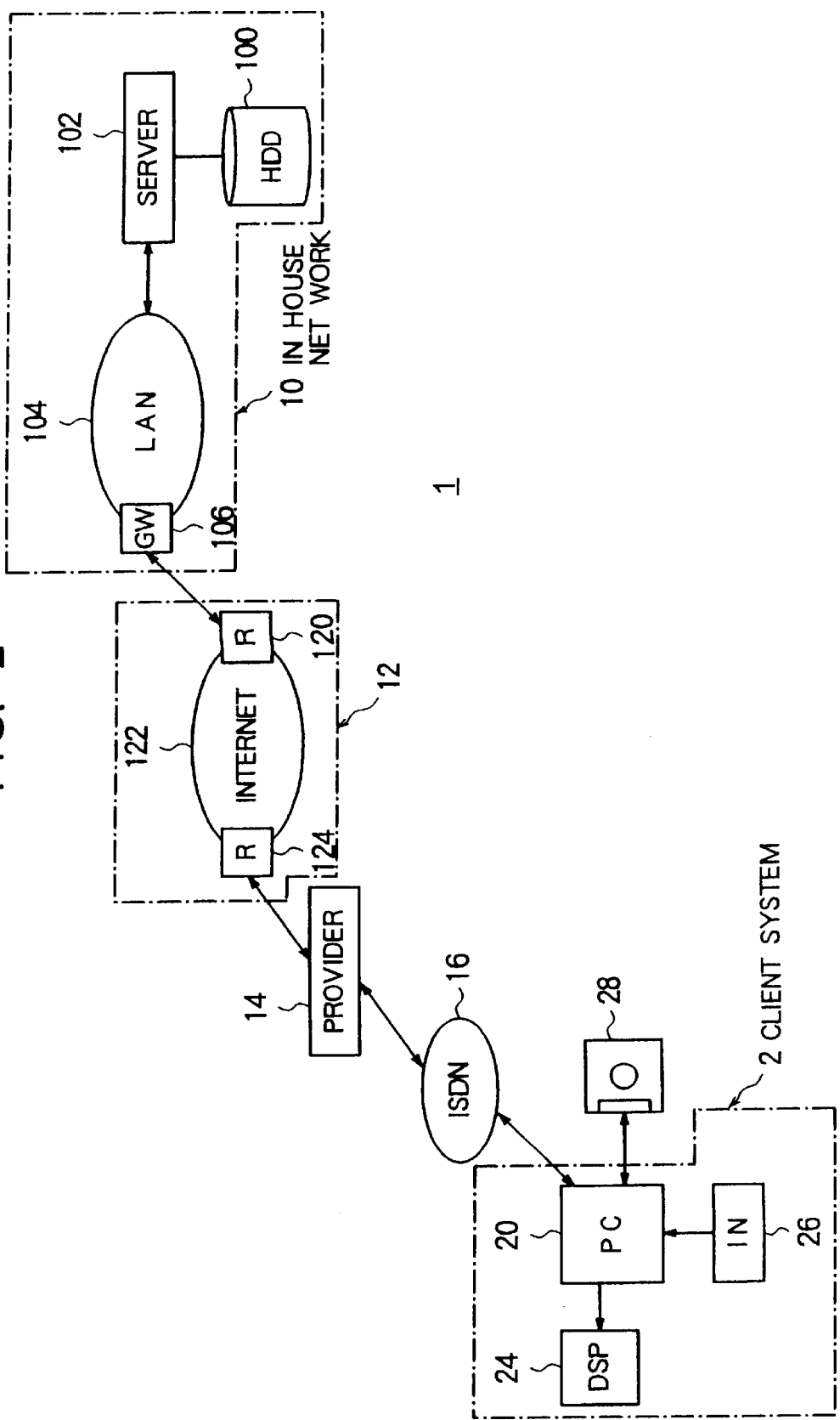
FIG. 2 is a view of the configuration of a network system comprehensively handling a three-dimensional virtual space to which a graphic data generating apparatus of the present invention is applied.

FIG. 2 is a view of the configuration of a network system 1 for comprehensively handling a three-dimensional virtual space according to one example of application of the graphic data generating apparatus, graphic data generating method, and medium of the present invention.

The network system 1 is constituted by an in-house network 10, an Internet system 12, an Internet provider 14, an ISDN (integrated services digital network) net 16, and a client (subscriber) system 2 connected to each other.

The network system 1 may have a plurality of in-house networks 10, Internet systems 12, internet providers 14, client systems 2, etc., but for simplification of illustration, in FIG. 2, just one of each of them is illustrated.

The in-house network 10 is constituted by a hard disk drive 100, a server apparatus 102, a LAN (local area network) 104, and a gateway server (GWS) 106.

The Internet system 12 connected to the in-house network 10 is constituted by router devices 120 and 124 and a digital communications line 122.

An Internet provider 14 is provided between the Internet system 12 and the ISDN net 16.

In the network system 1 shown in FIG. 2, the in-house network 10 and the client (subscriber) system 2 are connected through the Internet system 12, the Internet provider 14, and the ISDN net 16. In this specification, the LAN 104, Internet system 12, Internet provider 14, and ISDN net 16 are referred to as the "network". This network transfers data between the server apparatus 102 and the client system 2.

The client system 2 connected to the ISDN net 16 is constituted by a computer system having a personal computer (PC) 20, a display device (DSP) 24, and an input device (IN) 26. A storage device 28 is connected to the computer system. As the computer system, however, while the display device 24, input device 26, and external storage device 28 connected to the personal computer (PC) 20 constitute part of the computer system, they may be provided externally as well. In the present embodiment, the explanation will be made of the case where the display device 24 and input device 26 constitute part of the computer system, while the external storage device 28 is provided outside the computer system.

Server Apparatus 102

The server apparatus 102 of the in-house network 10 is a server apparatus such as the "Community Place" (trademark) (for example, http://vs.sony.co.jp/) which acquires through the network etc. VRML content, that is, VRML content comprised of a VRML file showing the shape and position of a three-dimensional object described by the user by VRML 2.0 and a script file described by the user by the Java language or other programming language and activated in accordance with an operation by the user on the object, stores the same in the hard disk drive 100, and manages the results of the storage.

Below, the set of the VRML file (extension.wrl), the script file in the Java language (extension.java), etc. will be called the VRML content.

The server device 102 sends the VRML content of the three-dimensional virtual space stored in the hard disk drive 100 to the client system 2 via the server apparatus 102, LAN 104, Internet system 12, Internet provider 14, and ISDN net 16 (hereinafter these communication nodes in the network system 1 will be also simply referred to all together as the "network") and displays the same on the display device 24.

Further, the server apparatus 102, in response to a request of the client system 2, transfers a content preparation software tool, that is, a program, stored in for example the hard disk drive 100 through the network to the client system 2. Alternatively, it may distribute a content preparation software tool, that is, a program, to the client system 2 in a state stored in a floppy disk 280 or a magneto-optic disk 282.

Explanation of Medium for Program

As the graphic data generation apparatus, graphic data generation method, and medium for the program for executing the method of the present invention, the following explanation will be made mainly of the configuration and operation at the client system 2, but the "medium" in the present invention not only includes a recording medium storing a computer program for realizing the graphic data generation method of the present invention, but does not merely mean a program storing medium and also means a program transmission medium when downloading to the client (subscriber) system 2 described in detail in the following embodiments a computer program through the network system 1 of FIG. 2 for the client system 2 to realize the graphic data generation method of the present invention. The reason is that as clear from the following explanation, when working the graphic data generation method of the present invention, it is possible to realize certain processing at any location without the restrictions of concentration. The present invention can be also realized by a localization.

Figure 3:
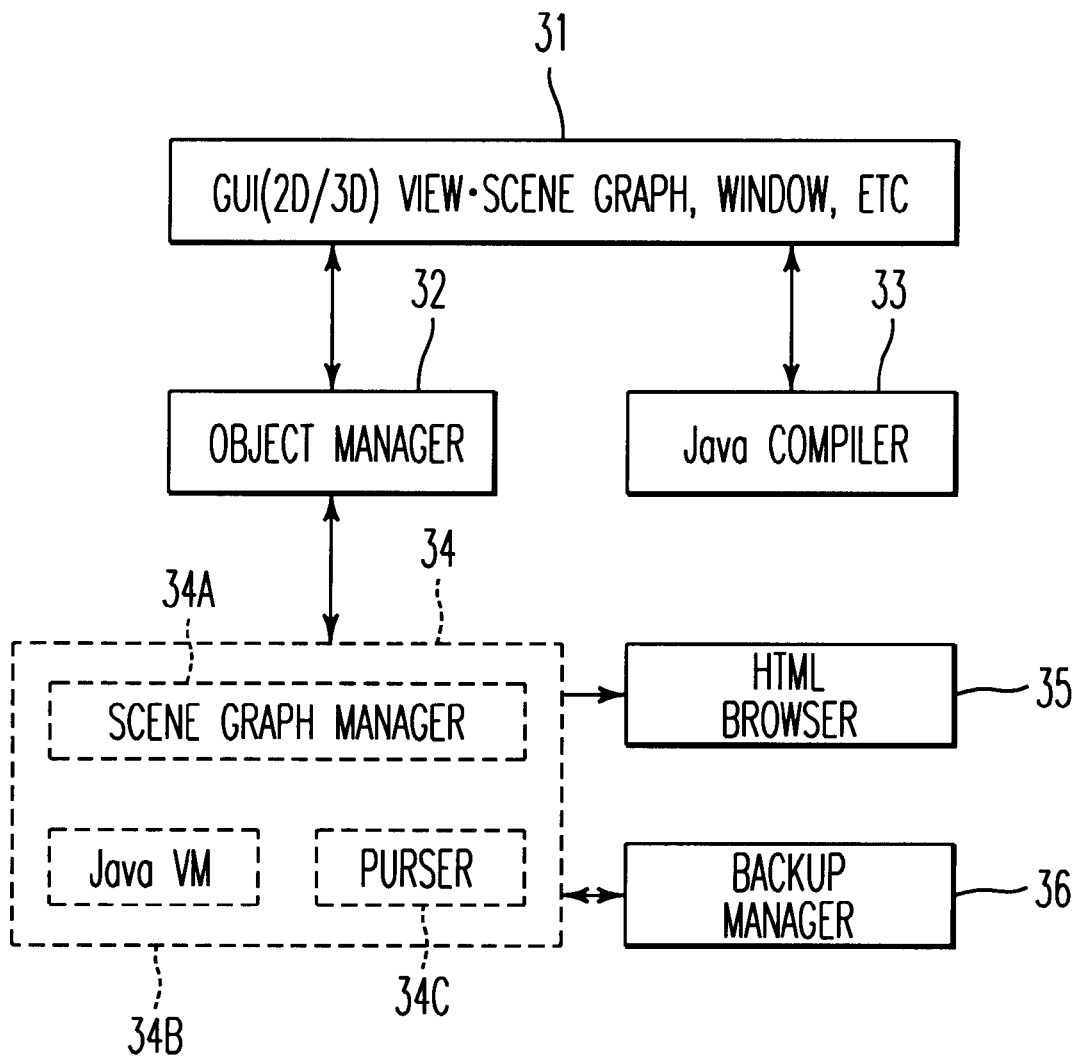
FIG. 3 is a view of the configuration of a content preparation software tool of the present invention.

FIG. 3 is a view of a graphic data generation method and graphic data generation apparatus, in particular a content preparation software tool 3 (Community Place (trademark) Conductor), of the present invention in a client (subscriber) system 2. The content preparation software tool 3 has a graphical user interface (GUI) 31, object manager 32, Java compiler 33, scene graph manager 34, Java VM 34B, purser 34C, HTML browser 35, and backup manager 36.

The graphical user interface portion 31 performs a variety of window displays.

The Java compiler 33, an external program, compiles Java programs. The scene graph manager 34 is a portion common with the browser. The scene graph manager 34A handles the hierarchical structure of the VRML nodes. The purser 34C analyzes the VRML file. The Java VM34B executes the script described by Java.

The HTML browser 35, an external program, is used for displaying an anchor node or displaying a help file of a VRML node described by the HTML format.

The portion 34 comprised of the scene graph manager 34A, Java VM 34B, and purser 34C may be used together with for example the Community Place (trademark) browser provided by Sony Corporation.

The backup manager 36 is enabled when the "Play" button on the screen of the display device is depressed by a mouse to enter the "Play" mode and starts preparations for backup of the field values. The stored field values are successively reproduced to restore the original screen when the "Stop" button is depressed. That is, the "Conductor" content preparation software tool is designed to enable everything from editing of the world to confirmation of operation. When the "Play" mode is entered by the user depressing the "Play" button, Conductor starts emulation of a browser. In this state, the states of the fields change, for example, an object starts to move, in accordance with interaction from the user. When however the "Stop" button on the screen of the display device is depressed by the mouse to return to the "normal editing mode", it is necessary to return completely to the "state before depressing the Play" button. What are necessary at this time are backup of the field values and processing for their restoration.

The backup manager 36 operates as follows. The backup manager 36 is enabled and starts preparation for backup of the field values when the "Play" mode is entered. When the field values are changed for the first time due to changes in a moving object etc., the original field values are stored. The field values are stored by the system of successively stacking them (stack system). When the "Stop" button is depressed, the stored values are successively reproduced (the stack is popped) to restore the state of display of the original window.

Like when dividing a file into a plurality of files when preparing a large sized program, it is preferable to divide a file into a plurality of files when a world has become large to a certain extent. The object manager 32 is the portion for managing the consistency in such a case.

The route editor (not shown) is used when defining an event between fields using a route text. In the present invention, a node is designated using the GUI 31, so there is no longer mistaken designation of names. Further, even if the user changes the nodes for a route, the route text can be automatically updated without error while the object manager 32 manages the DEF for each scope.

Script is used to make a more interactive world using Java and other languages, but script is known to be difficult to prepare due to the preparation of content. In particular, the portion connecting the Java language and VRML is difficult. In the present invention, to solve this problem, a Script Expert (not shown), explained in detail later, is provided.

Figure 4:
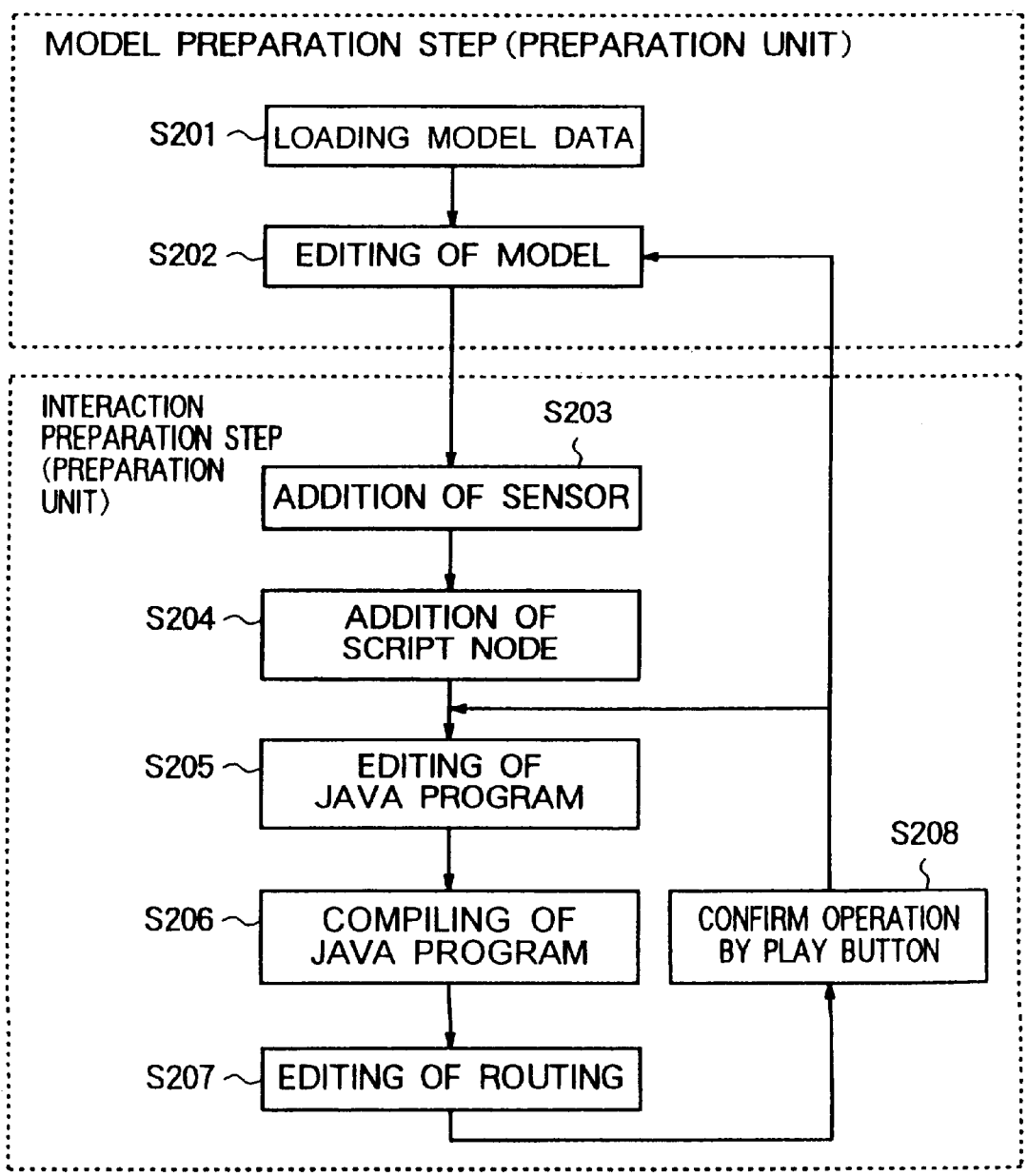
FIG. 4 is a flow chart of the method of preparation of VRML content executed by the content preparation software tool illustrated in FIG. 3.

FIG. 4 is a flow chart of the processing by the content preparation software tool 3. In the present invention, the defects of the above mentioned prior art are solved by omitting the manual work and using a GUI 31 to enable the work to be efficiently and automatically performed in whole tools. This will be explained briefly below. As explained above, the content preparation software tool 3 illustrated in FIG. 3 can execute any of the tasks at any portion of the network 1, but in the following, for simplification of the explanation, the case of execution mainly in the client system 2 will be explained.

The substance of the processing of FIG. 4 will be explained first. The processing of the content preparation software tool 3 may be roughly divided into (1) initialization, (2) preparation of a model, and (3) preparation of interaction.

At step 201, for example, model data is downloaded from the hard disk drive 100 to the hard disk drive 214 of the computer system 20. That is, a model described in VRML 2.0 is loaded in the computer system 20 of the client system 2. As the method of loading, it is possible to download the data from any portion of the network system 1 to the computer system 20.

At step 202, the model (object) is edited, for example, the model is rearranged, the attributes are changed, or other editing is performed.

At steps 203 to 207, the interaction is prepared. That is, at step 203, sensors are added, at step 204, a script node is added, at step 205, Java programs are compiled, and at step 207, routing is edited.

Figure 1:
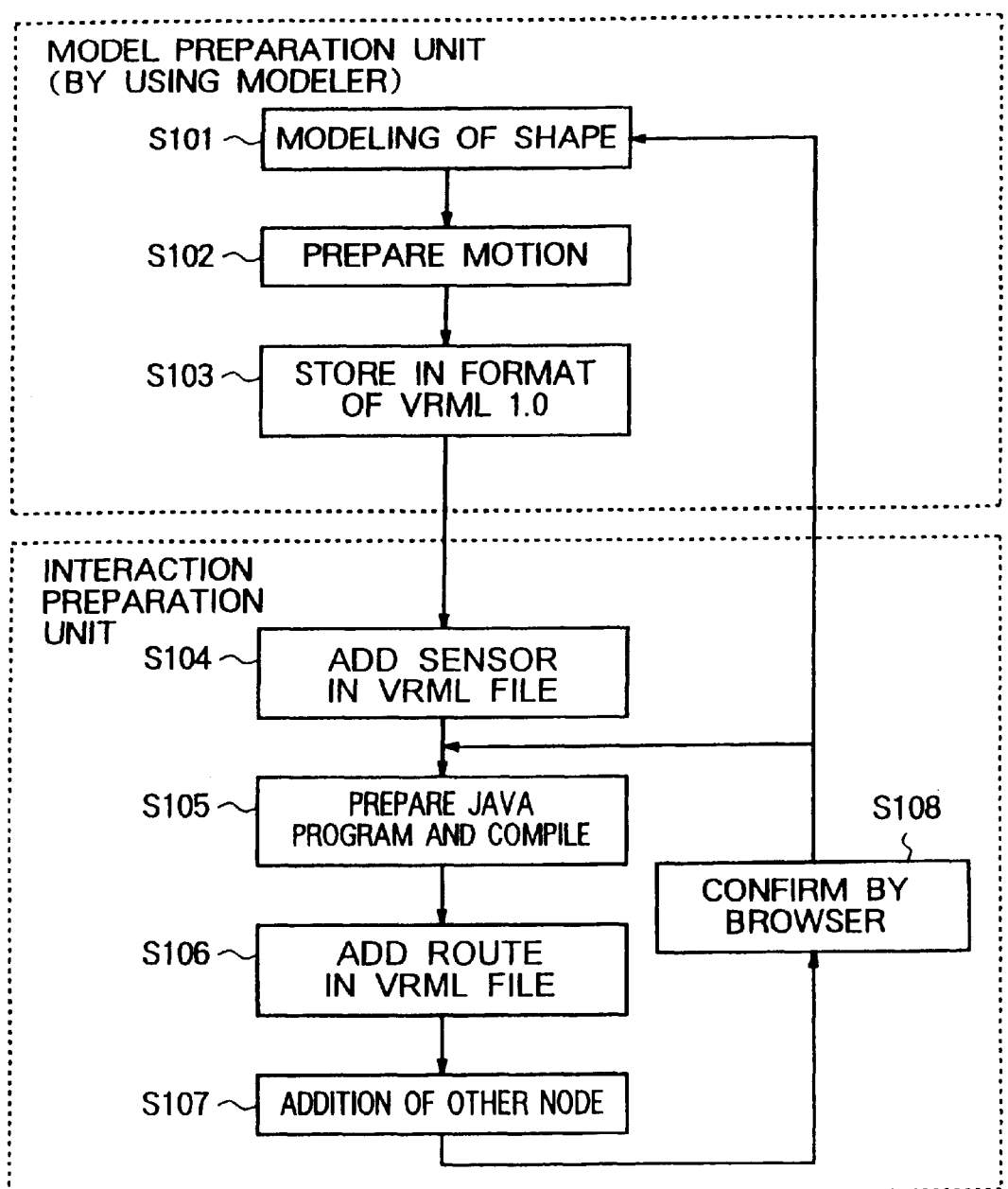
FIG. 1 is a flow chart of the method of preparation of VRML content.

At step 208, the operation of the results of the above processing is confirmed by depressing the "Play" button shown in the "Conductor" window (FIG. 10) of the screen of the display device by a mouse. The confirmation operation explained referring to FIG. 1 is performed by activating a browser after the end of the preparation of the VRML content. The operation of step 208 is possible at any time without activating the browser. Details will be given later with reference to FIG. 5 to FIG. 6, but according to the method of the present invention, that is, the content preparation software tool 3, if the user depresses the "Play" button, the editing screen, which is the "3D Perspective View" window (editing window) shown in FIG. 9, etc., that is, is displayed as it is as the substance of the prepared content instead of the display screen of the VRML browser.

Further, the addition of sensors, editing of routing, etc. may be performed by interactive operation by a graphical user interface (GUI) 31 in the content preparation software tool 3 of the present embodiment.

The content preparation software tool 3 is given the additional function called a Script Expert which prepares a template of a script by interactive operation and automatically compiles files when the user confirms the operation by an operation. Therefore, the content preparation software tool of the present embodiment is given the additional function of automatic compilation at the time of confirmation of operation. As a result, the content preparation software tool 3 of the present embodiment eliminates the need for performing this work by input of a character string of commands (command line). By these functions, it is possible to greatly shorten the time for the user to prepare content of the three-dimensional virtual space by VRML 2.0.

In the present invention, the addition of sensors at step 203 can be simply performed by a drag and drop operation.

Further, in the present invention, the editing of the routing at step 207 can be simply performed using a GUI.

Further, in the present invention, there is a function of checking the type of the event even when adding a route using the route editor and therefore it is possible to prevent the user from designating a mistaken route.

In particular, in the present invention, to overcome the disadvantages explained with reference to FIG. 1, as step 208, as explained above and as illustrated in FIG. 5, at any time and without activating the browser, (1) S211: when the "Play" button provided in the screen of the display device is depressed by the user as the predetermined first operation, (2) S212: the emulator is activated and it is made possible to confirm the operation at that time by the operation of the emulator. (3) S213: After the confirmation, when the "Stop" button provided in the screen of the display device is depressed by the user as the predetermined second operation, the normal editing mode is returned to. Due to this, when adding nodes or making changes in programs for the script nodes simultaneously with normal preparation of VRML content, it is possible to use the browser emulator and simply confirm the operation on the spot by just depressing the "Play" button. If a compilation error occurs as a result, it is possible to easily detect the error, immediately correct the error, and re-compile the files.

Figure 6:
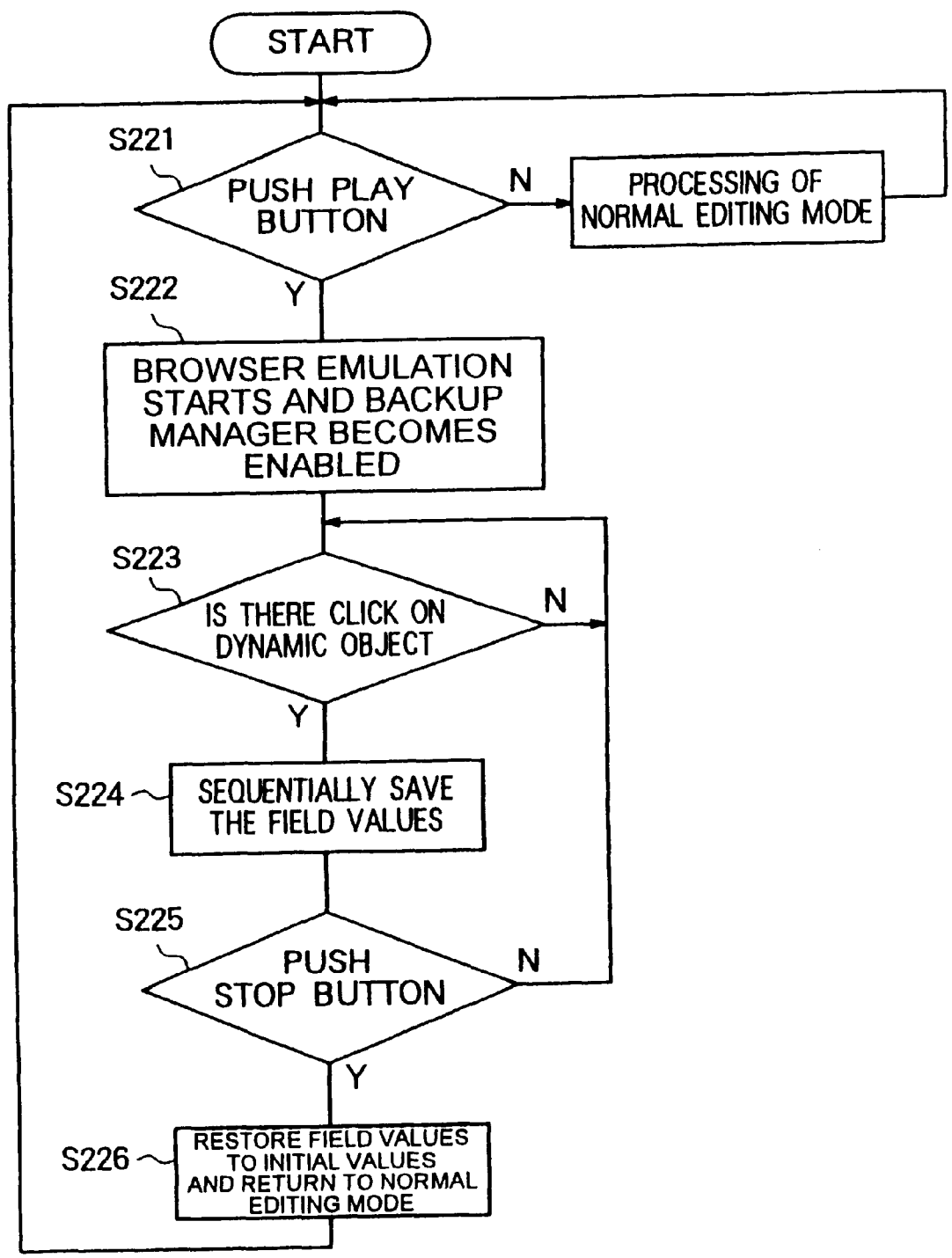
FIG. 6 is a flow chart illustrating the processing of a suitable confirmation operation in the process of preparation of the VRML content illustrated in FIG. 4.

In the above confirmation operation, preferably the backup manager 36 is made to operate linked with the browser emulator. That is, during the confirmation operation of step 208, as illustrated in FIG. 6, (1) S221: when the user depresses the "Play" button as the first predetermined operation, (2) S222: the browser emulator operates in the same way as above and the backup manager 36 is enabled and can perform backup. (3) S223: In this state, when for example a moving object starting to move by being clicked is clicked, (4) S224: the backup manager 36 successively stores the field values defining the behavior of motion of the object. (5) S225: If the user depresses the "Stop" button as the second predetermined operation, the confirmation operation ends, but (6) S226: the backup manager 36 successively restores the stored field values and resets the field values of the initial state. This enables restoration of the object in the original state before the confirmation operation. These operations may be achieved by just operation of the "Play" button and "Stop" button, therefore in addition to the improvement of the operability, the processing time can also be shortened.

Client (Subscriber) System 2 and Computer System 20

Figure 7:
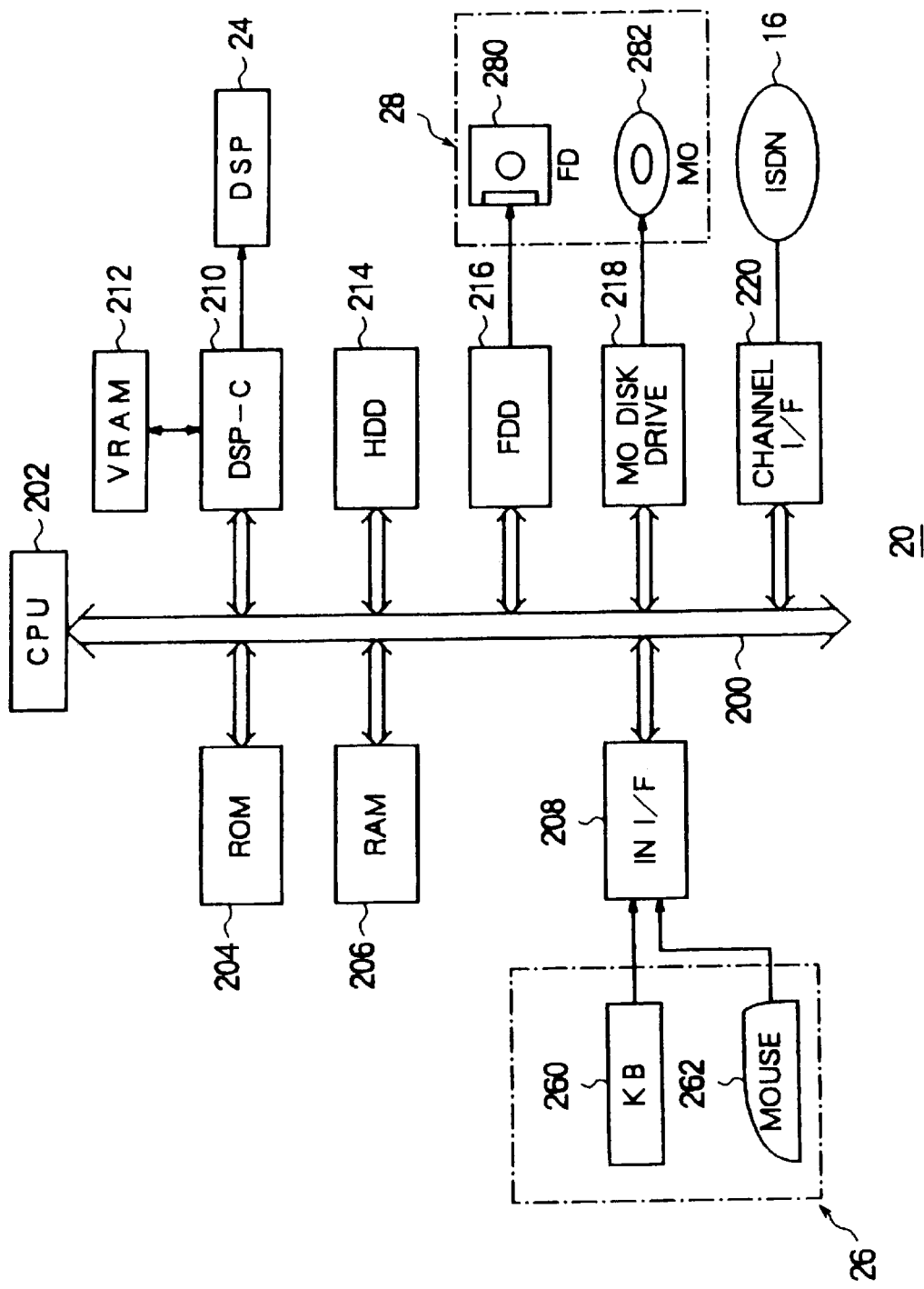
FIG. 7 is a view of the configuration of a computer system in the network shown in FIG. 2.

FIG. 7 is a view of the configuration of the computer system 20 shown in FIG. 2. In FIG. 7, the external storage device 28 illustrated in FIG. 2 is illustrated in detail as the floppy disk (FD) 280 and/or magneto-optical (MO) disk 282, while the input device 26 is illustrated as a keyboard (KB) 260 and/or mouse 262.

In working the invention, the display device 24 may be any color display device suitable for interactive information display and processing linked with a keyboard, mouse, or other data input means, for example, a color CRT display device or color liquid crystal display device. Below, in the specification, as the "display device 24", the explanation will refer to the case of a color CRT display device or color liquid crystal display device operating linked with a keyboard, mouse, or other data input means.

The computer system 20 is for example a computer designed for multi-media operations and having a communication function connected to for example the ISDN net 16. It is constituted by a CPU 202, a ROM 204, an input interface (IN I/F) 208, a display device 24 controller (DSP-C) 210, a video signal recording RAM (VRAM) 212, a hard disk drive (HDD) 214, a floppy disk drive (FDD) 216, an MO disk drive 218, and a line interface 220 connected via a bus 200.

The CPU 202 performs various operations explained below by operating various control programs stored in the ROM 204 and HDD 214. For example, the CPU 202 displays various image data on the display device 24 through the DSP-C 210 and receives as input the data from the KB 260 or data from the mouse 262 through the input interface 208. The CPU 202 stores the data in a floppy disk 280 serving as the external storage device 28 through the floppy disk drive 216 or reads data from the FD 280 or else stores the data in an MO disk 282 serving as the external storage device 28 through the MO disk drive 218 or reads data from the MO disk 282. The CPU 202 also communicates with the ISDN net 16 through the line interface 220.

The computer system 20 displays on the display device 24 the image of VRML content of the three-dimensional virtual space sent from the server apparatus 102 through the network including the ISDN 16 to display it to the user (client).

The computer system 20 installs the content preparation software tool 3 supplied from the server apparatus 102 via the network or the external storage device 28 in the hard disk drive 214, activates the content preparation software tool 3 in accordance with an operation of the client using the KB 260 or mouse 262 to prepare the VRML content of the three-dimensional virtual space, stores this in the hard disk drive 214, or uploads this via the network or the external storage device 28 (floppy disk 280 and/or MO disk 282) to the server apparatus 102.

Further, the computer system 20 changes the displayed color of an object pointed to or changes the substance of the display of the object in the three-dimensional virtual space in accordance with a pointing operation by the user using the input device 26 to an object displayed on the display device 24.

Display of Three-Dimensional Virtual Space

According to the client system 2 having a computer system 20, since it is possible to change the substance of the display in the display device 24 interactively in accordance with the operation of the user on an object in a three-dimensional virtual space, if the client system 2 is used, it is possible to create a realistic feeling where, like reality, the user itself makes the object move or touches the object to operate it and make it move or make a sound in a three-dimensional virtual space.

Further, the server apparatus 102 obtaining the VRML content of the three-dimensional virtual space from a client system 2 through the network stores the VRML content in the hard disk drive 100 and can disclose it to the subscribers of the Internet through the Internet system 12. When being accessed from a client system 2 through the network, the server apparatus 102 transfers the VRML content to the client system 2 through the network.

The computer system 20 of the client system 2 displays the three-dimensional virtual space based on the VRML content sent from the server apparatus 102 on the display device 24 by a browser.

When preparing VRML content of three-dimensional virtual space closed in the client system 2 and not sharing the VRML content of the three-dimensional virtual space with other users, it is sufficient to display the prepared VRML content as it is on the display device 24 by using the browser. It is not always necessary to transmit the prepared VRML content to the server apparatus 102.

Interaction Display: The user uses the mouse 262 to point to a desired position on the screen displayed on the display device 24 to input operation data for moving an object in a three-dimensional virtual space or operation input data for designating an object in a three-dimensional virtual space. The computer system 20 modifies the content of the three-dimensional virtual space in accordance with the operation data and uses the VRML browser to display the same on the display device 24.

Preferred Embodiments

Below, an explanation will be made of preferred embodiments of the present invention.

As explained above, in the past, interaction preparation work such as the addition of a sensor to the graphic data (VMRL file) of an object and routing was manually carried out by the user (client) using the text editor function, so careless mistakes easily occurred. Further, it cannot be learned whether or not the result of the interaction preparation work is correct until the confirmation using the VRML browser shown at step 108 in FIG. 1. Therefore it is necessary to activate the VRML browser for confirmation whenever modifying the interaction program, so the work efficiency is low and time is taken. This embodiment of the present invention was made so as to link up the operation of the model preparation and the operation of the interaction preparation editor so as to be able to comprehensively perform this work and so as to be able to perform the preparation work of content in the three-dimensional virtual space with a high efficiency and easily in a short time.

Figure 8:
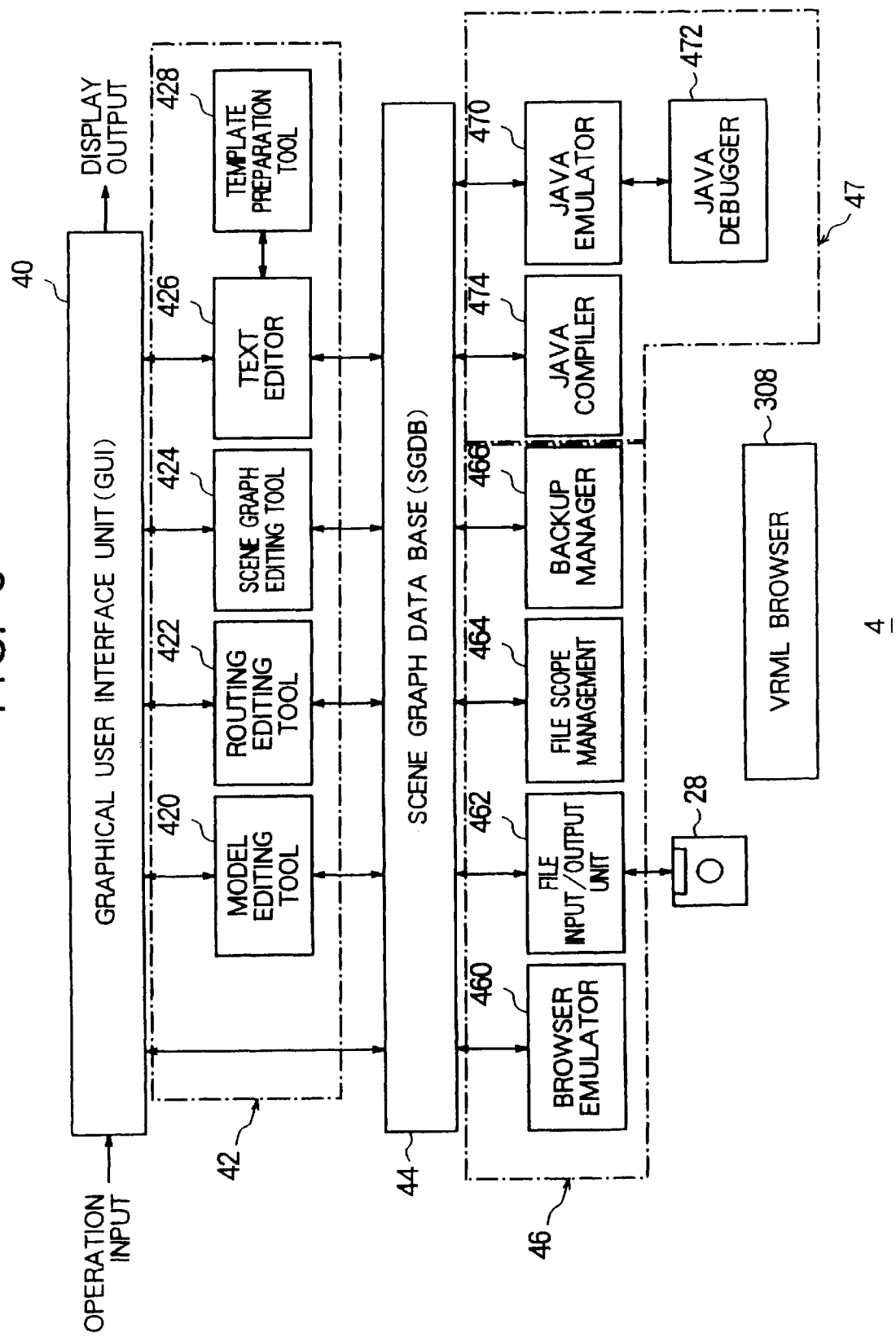
FIG. 8 is a view of the configuration of a content preparation software tool according to an embodiment of the content preparation software tool illustrated in FIG. 3.

FIG. 8 is a view of the configuration of the content preparation software tool 4 shown as an embodiment of the content preparation software tool 3 illustrated in FIG. 3. To perform the model preparation work and the interaction preparation work comprehensively and linked with each other, the content preparation software tool 4 comprises a graphical user interface (GUI) 40, an editing tool 42, a scene graph data base (SGDB) 44, a working tool 46, a script preparation unit 47, and a VRML browser 308.

The editing tool 42 is constituted by a model editing tool 420, a routing editing tool 422, a scene graph editing tool 424, a text editor 426, and a template preparation tool 428.

The working tool 46 is constituted by a browser emulator 460, a file input/output unit 462, a file scope management unit 464, and a backup restore unit 466.

The script preparation unit 47 is constituted by a Java emulator 470, a Java debugger 472, and a Java compiler 474.

The content preparation software tool 4 is for example stored in a hard disk drive 100 and input through the network system 1 or is stored in the network or an external storage device 28 (floppy disk 280 or MO disk 282) and input from the external storage device 28 to the computer system 20 and installed and used in the hard disk drive 214. That is, in the present embodiment, the example is explained of the case where the content preparation software tool 4 is realized in the computer system 20.

The constituent parts of the content preparation software tool 4 will be explained below.

Graphical User Interface (GUI) 40

The graphical user interface (GUI) 40 corresponds to the graphical user interface (GUI) 31 of FIG. 3 and displays an image used for the input of various data used for the preparation of VRML content of the three-dimensional virtual space through the PC 20 on the display device 24 in the form of a window.

Figure 9:
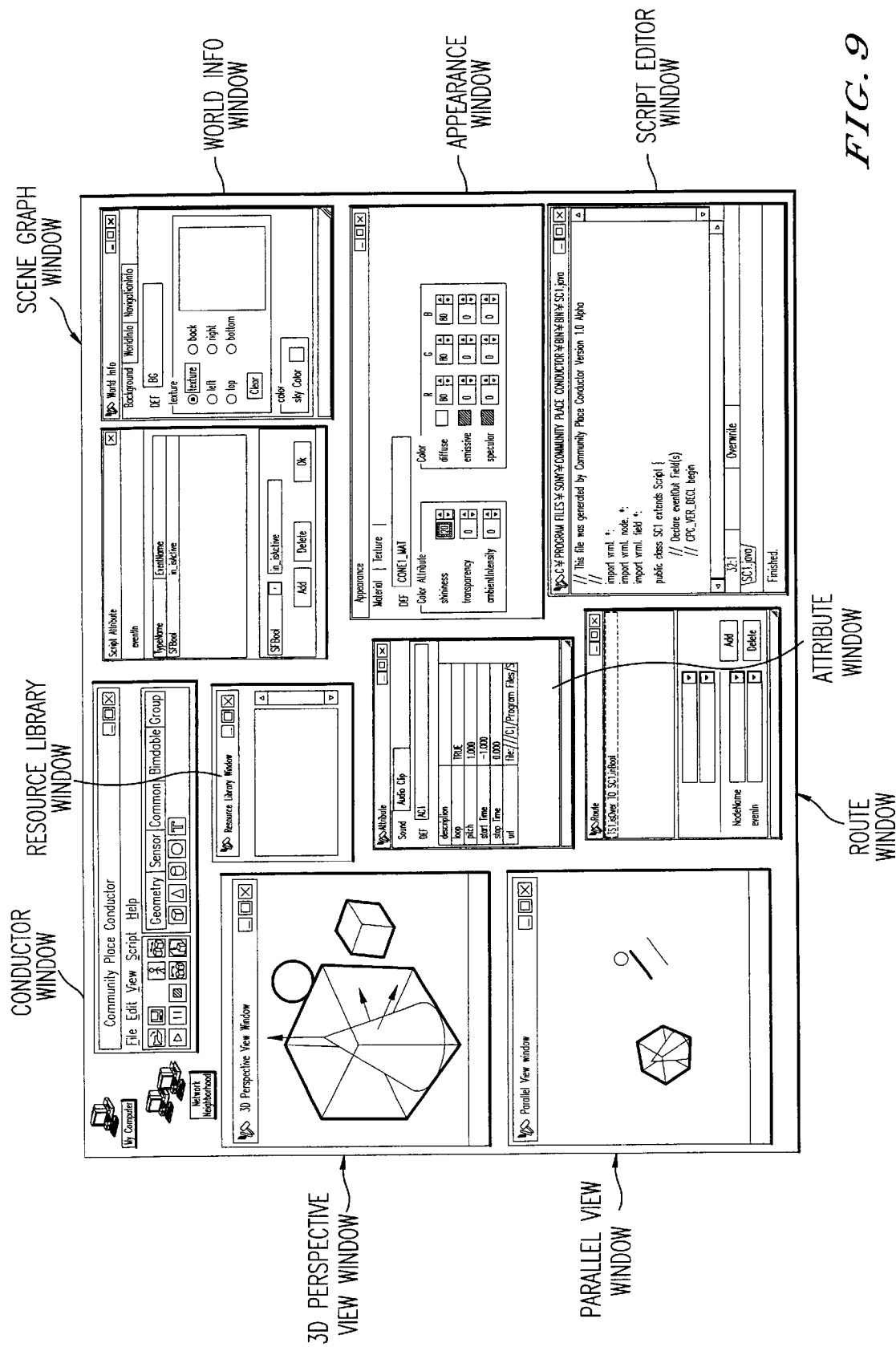
FIG. 9 shows windows displayed by a graphical interface portion of a content preparation software tool of FIG. 8 in a display device in a computer system.

FIG. 9 is a view of a GUI screen of a first embodiment displayed by the GUI 40 on the display device 24. The GUI screen illustrated in FIG. 9 has a "conductor" window, "3D Perspective View" window, "Parallel View" window, "Resource Library" window, "Scene Graph" window, "World Info" window, "Appearance" window, "Route" window, "Attribute" window, "Script Expert" window (not shown), and "Script Editor" window.

(1) The "Conductor" window is used for management of the Conductor as a whole.
(2) The "3D Perspective View" window is the portion for displaying an image three-dimensionally. In the following, the word is simplified as "3D window" for convenience.
(3) The "Parallel View" window is the portion for displaying an image by a parallel projection.
(4) The "Resource Library" window is the portion for managing the library.
(5) The "Scene Graph" window is the portion for displaying the hierarchical tree structure of worlds.
(6) The "World Info" window is the portion for setting the attributes of a world.
(7) The "Appearance" window is the portion for setting the color and texture of an object.
(8) The "Route" window is the portion for routing an event.
(9) The "Attribute" window is the portion for setting the attributes of the node and the name of the node.
(10) The "Script Expert" window is the portion for preparing a template of a script.
(11) The "Script Editor" window is the portion of the text editor for editing a Java file.

Figure 10A:
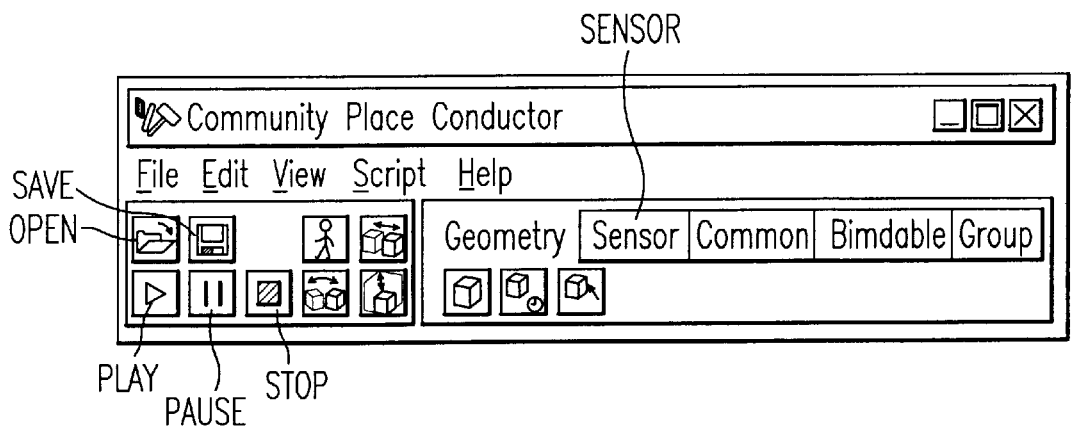
FIG. 10A to FIG. 10C are enlarged views of the CONDUCTOR window illustrated in FIG. 9.
Figure 10B:
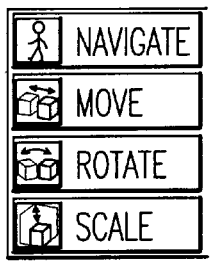
Figure 10C:
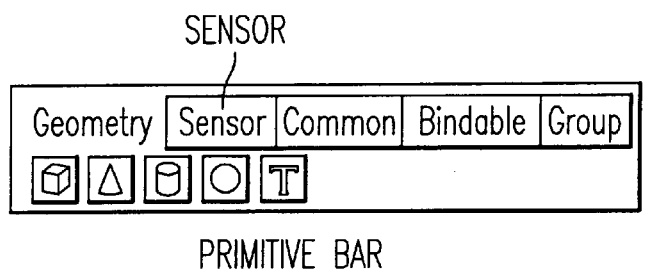

FIG. 10A is an enlarged view of the illustrated "Conductor" window, and FIG. 10B and FIG. 10C are enlarged views of FIG. 10A. The "Conductor" window is a window for managing the Conductor as a whole. By using the "Conductor" window, it is possible to newly prepare, read in, store, execute, and stop a world, switch the mouse mode, add or delete an object, etc.

(a) By selecting "New" in the file menu, it is possible to newly prepare a world.
(b) To read a world from a file, the "Open" button is depressed or "Open" is selected from the file menu.
(c) To store a world in a file, the "Save" button is depressed or "Save" is selected from the file menu.
(d) To confirm the operation of the world, the "Play" button is depressed.
(e) By depressing the "Pause" button during play, the play is stopped once. By depressing the "Pause" button again or depressing the "Play" button, the play is restarted. The conductor includes a mouse mode illustrated in FIG. 10B as an enlarged view.
(f) "Navigate (viewpoint motion)" is used when moving the viewpoint in the "2D/3D view" window.
(g) "Move" is used when moving the object.
(h) "Rotate" is used when rotating the object.
(i) "Scale" is used when changing the scale of the object.

Further, in the Conductor, a Primitive Bar illustrated enlarged in FIG. 10C is provided. When adding a primitive object like a box or cone, the object desired to be added is selected at the Primitive Bar and the "3D View" window is clicked. A "Sensor" is also provided in the Primitive Bar.

The GUI 40 receives the operation input data input by the user using the mouse 262 of the input device 26 to depress various buttons in a window displayed on the display device 24 or using the keyboard 260 and provides the required operation data to the tools of the editing tool 42 and the scene graph data base 44. That is, the GUI 40 provides a GUI environment to the user.

The GUI 40 receives the display output data from the editing tool 42 and the scene graph data base 44 and displays the received data in a predetermined window of the display device 24. The constituent parts of the editing tool 42, scene graph data base 44, and working tools 46 are activated in accordance with the operation data input to the GUI 40 and performs processing based on the operation data provided from the GUI 40.

VRML Browser 308

The VRML browser 308 confirms the final substance of the VRML content prepared in the computer system 20 and displays the VRML content acquired from the server apparatus 102 and in addition displays a help file linked with the operation of the constituent parts of the GUI 40 to the working tool 46. As the VRML browser 308 for example, it is possible to use the Community Place (trademark) browser provided by Sony Corporation. The Community Place browser will be explained as an example below.

Editing Tool 42

The editing tool 42, overall, provides the user with the functions necessary for the preparation of graphic data of an object in a three-dimensional virtual space and an interaction program. Below, the parts of the editing tool 42 will be explained.

Model Editing Tool 420

The processing functions of the model editing tool 420 will be listed below:
(1) The model editing tool 420 prepares graphic data indicating an attribute such as the size and color (shape) of the object, its position, and operation by using the data for the model preparation input by an operation of the user with respect to a model editing use window displayed on the display device 24.
(2) The model editing tool 420 outputs the prepared graphic data (attributes of the object) to the scene graph data base 44.
(3) The model editing tool 420 three-dimensionally displays this at a predetermined position of the model editing use window on the display device 24 via the GUI 40.
(4) The model editing tool 420 may also edit the graphic data read from the hard disk drive 214.
(5) The model editing tool 420 may also edit the graphic data read from a floppy disk 280 through a floppy disk drive 216 or from an MO disk 282 through an MO disk drive device 218.
(6) The model editing tool 420 may also edit the graphic data downloaded from the network to the computer system 20.

The model editing tool 420 having the above various functions executes the functions characterizing the present invention as explained below:
a. Object Display Function
Processing for rotation (by "Rotate" operation of "Conductor" window), motion (by "Move" operation of "Conductor" window), navigation (by "Navigate" operation of "Conductor" window), and scaling (by "Scale" operation of "Conductor" window) of object for viewing object from different viewpoints.
b. Object Scaling Function
The "Scale" of the "Conductor" window is used.
c. Sensor Node Region Display and Setting Function
Operates linked with the browser emulator 460.
d. Parallel View Function
f. Attention Function

Routing Editing Tool 422

The routing editing tool 422 performs the routing editing for establishing correspondence between the graphic data of the object named in the current scope (VRML file to be edited) and script and other nodes. Note that, at the time of routing, it is necessary to make the format of the field values of the nodes of the origination of routing and the destination of the routing match, for example, SFBool (Boolean value showing true or false).

Note that details of the routing editing processing using the routing editing tool 422 will be described later as the setting of the format of the input data.

Scene Graph Editing Tool 424

In VRML, it is possible to arrange the nodes hierarchically. The scene graph editing tool 424 edits the hierarchical structure of the objects and invisible nodes (script nodes etc.) As the hierarchical structure of the nodes, for example, a subnode F1 showing the leaves (VRML file), a subnode F2 showing the branches (VRML file), a subnode F3 showing the trunk (VRML file), and a subnode F4 showing the roots (VRML file) comprise hierarchically a main node F5 showing the tree as a whole (VRML file).

Text Editor 426

The text editor 426 has an editor function of a programming language suited to the preparation of a script (e.g., of the Java language), prepares a source program of the script, and, at the same time, automatically adds, deletes, or modifies the variables linked with the editing work on the script node.

Template Preparation Tool 428

The template preparation tool 428 is a tool used for the convenience of the user. It operates linked with the text editor 426, prepares a program (template) which becomes the prototype of the script by an interactive manner in accordance with the operation of the user with respect to a "Script Expert" window of the display device 24, and outputs the same to the text editor 426. The user can easily prepare a script by modifying according to need a source program (template of script) which is provided by the template preparation tool 428 and has been already completed to a certain extent.

Scene Graph Data Base (SGDB) 44

The SGDB 44 stores the data prepared by tools of the editing tool 42 in the RAM 206 of the computer 20, manages the stored data, and supplies the stored data immediately in accordance with requests of the constituent parts of the editing tool 42 and the working tool 46.

Working Tool 46

The working tool 46 provides to the client the functions required for the VRML content preparation work such as the confirmation of the prepared content, confirmation of the operation of the script, and the recording and reproduction of the data with respect to the input data 26. Below, an explanation will be given of the tools of the working tool 46.

Browser Emulator 460

The browser emulator 460 emulates the operation of the VRML browser 308 and provides the user with the same VRML content as in the case of use of the VRML browser 308. Therefore, for example, the browser emulator 460 is used when the user confirms the operation of the prepared VRML content.

The browser emulator 460 is activated in accordance with the depression of the "Play" button displayed in the "Conductor" window of the display device 24 or is activated by the depression of the "Play" button provided on the keyboard 260, stores the result of the emulation of the VRML content in the scene graph data base 44, displays the resultant VRML content in a "3D View" window (editing window) shown in FIG. 9, and modifies the substance of the display in accordance with an operation of the user. The browser emulator 460 stops operating in accordance with the depression of the "Stop" button displayed in the "Conductor" window. The GUI 40 displays the original editing use VRML content when the operation of the browser emulator 460 is stopped.

Note that in the confirmation of operation using the browser emulator 460, it is preferable that the changes of the field values arising due to motion of the moving object be successively stored and held, then, along with the end of the browser emulator 460 in accordance with the "Stop" button, the later explained backup manager 466 be simultaneously operated with the browser emulator 460 to restore the original state of display of the object.

File Input/Output Unit 462

The file input/output unit 462 records the graphic data of the VRML content [VRML file (extension .wrl)], script (extension Java), texture file (extension .bmp, .jpg, .gif) and the sound file (extension .wav, .mod) stored in the scene graph data base 44 on a hard disk drive 214, floppy disk 280, or MO disk 282 of a computer system 20. Further, the file input/output unit 462 outputs the various data of the VRML content read by the hard disk drive 214 etc. to the scene graph data base 44.

File Scope Management Unit 464

In VRML, one scope (range where name and routing attached to the node are valid) is given for every file of the graphic data (extension .wrl), and the node names and routings are managed in units of scopes. The file scope management unit 464 manages the node names in the scene graph data base 44, automatically prepares the node names, searches for the nodes, and propagates modifications with respect to the graphic data file to all of the nodes referred to whenever referring to a plurality of graphic data files with the same nodes.

Backup Manager 466

The backup manager 466 corresponds to the backup manager 36 of FIG. 3. If the browser emulator 460 activated by the "Play" button when confirming the substance of the VRML content displays a scene which can be interactively operated, the state of the nodes changes in accordance with the operation by the user, so the field values of the nodes end up changing and the original scene can no longer can be displayed unless being processed in some way. For this reason, the backup manager 466 receives and stores the initial states of the field values of the nodes (as field values) of the scene which is displayed at first in the "3D View" window (three-dimensional virtual space generated from the VRML file) from the scene graph data base 44 when the browser emulator 460 is activated in accordance with depression of the "Play" button of the "Conductor" window.

Further, the browser emulator 460 outputs the stored field values of the nodes to the scene graph data base 44 when the browser emulator 460 stops operating in accordance with depression of the "Stop" button of the "Conductor" window of the display device 24.

Due to this, the GUI 40 displays the original three-dimensional virtual space in the "3D View" window of the display device 24 based on the field values of the initial values of the nodes input to the scene graph data base 44.

Script Preparation Unit 47

The script preparation unit 47 has the functions of compiling, confirming the operation, and debugging the script prepared by the user using the text editor 426.

Java Compiler 474

The Java compiler 474 compiles source programs of the script of the Java language stored in the scene graph data base (SGDB) 44 to prepare the object program and outputs the same to the SGDB 44. In this embodiment, when the "Play" button of the "Conductor" window is depressed, the Java compiler 474 can automatically compile the source programs of the script, that is, the files having ".java" as extensions, to automatically prepare a file having ".class" as an extension.

Java Emulator 470 and Java Debugger 472

The Java emulator 470 and the Java debugger 472 operate as the interpreter of a program described by the Java language and are used by the user for confirming the operation and debugging the script program. That is, the Java emulator 470 emulates the operation of the object program of the script stored in the scene graph data base (SGDB) 44, and the Java debugger 472 outputs the state of the Java emulator 470 at the emulation operation and the generated error to the SGDB 44.

Characteristic Functions of Content Preparation Software Tool 4

Below, an explanation will be given of the substance of the processing characterizing the content preparation software tool 4 of the present embodiment.

Operation Confirmation Function and Backup Management Function (Browser Emulator 460, Backup Manager 466)

Figure 5:
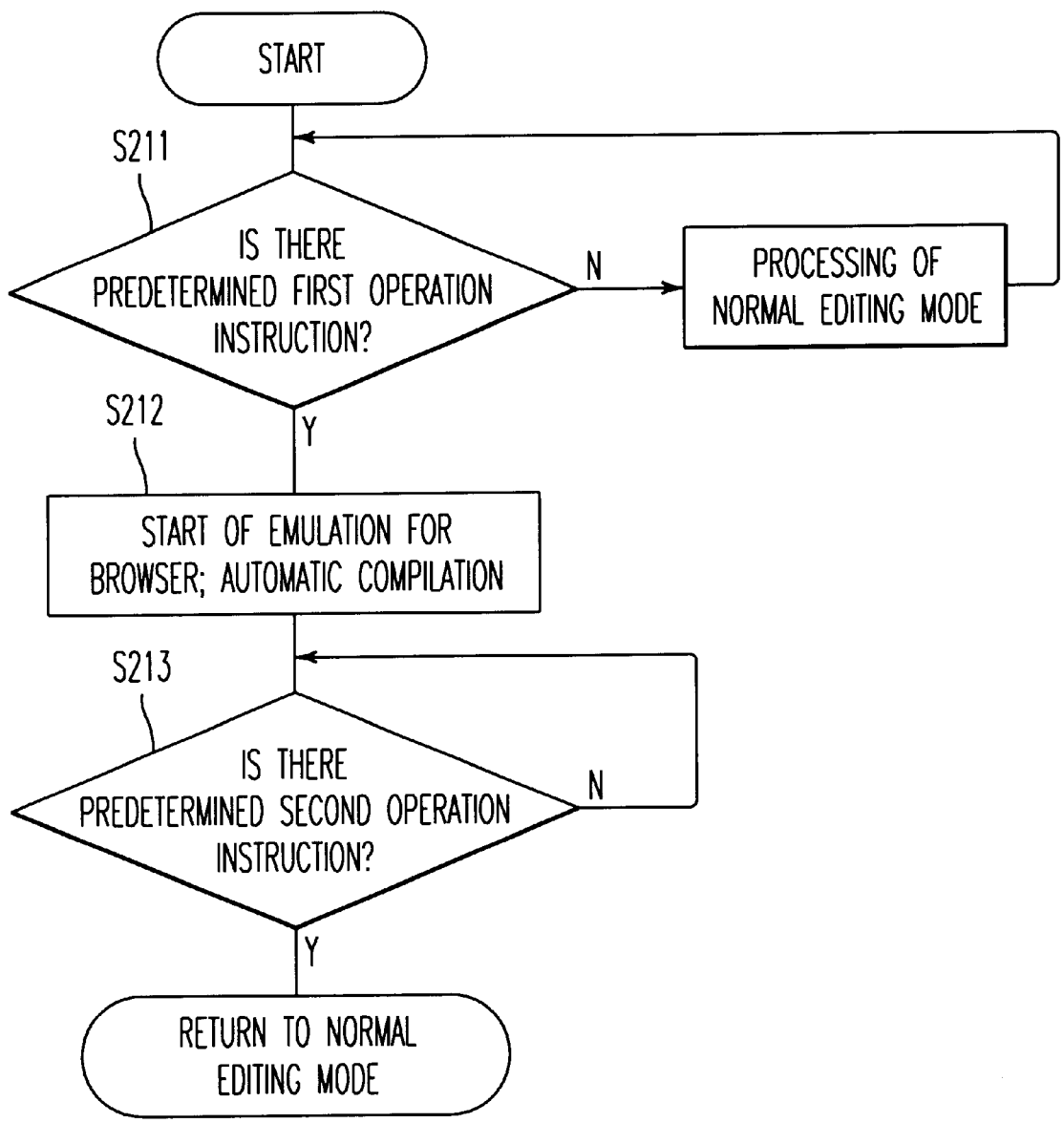
FIG. 5 is a flow chart illustrating the processing of a basic confirmation operation in the process of preparation of the VRML content illustrated in FIG. 4.

As explained referring to FIG. 4 to FIG. 6, when the user depresses the "Play" button displayed in the "Conductor" window in the screen of the display device 24 by the mouse 262 (FIG. 5, S301, FIG. 6, S311), the browser emulator 460 analyzes the VRML content prepared up to this point of time and displays it on the display device 24. Preferably, as illustrated in FIG. 6, the backup manager 466 also operates simultaneously and becomes able to back up field values. The backup manager 466 successively stores the field values of the nodes expressing a moving object when a moving object etc. is clicked (FIG. 6, S223) (S224). Further, when the "Stop" button is depressed (FIG. 6, S225), the normal editing mode is returned to and the backup manager 466 restores the field values (FIG. 6, S226).

That is, when the state of the VRML content at the time of starting the confirmation of operation is stored by the backup manager 466, the user depresses the "Stop" button displayed in the "Conductor" window in the screen of the display device 24 by the mouse 262, and the browser emulator 460 stops executing the VRML content, it is possible to return the VRML content to the field values at the time of starting the confirmation of operation and return the substance of the display of the object (model) of the window to that at the start of confirmation of operation.

By this operation confirmation and backup management function, the trouble of once storing the prepared VRML content in the hard disk drive 214 etc. and then activating the VRML browser to confirm the operation like in the prior art described with reference to FIG. 1 is unnecessary. In addition, the user can confirm the operation of the content prepared by the work up to then at any time during the VRML content preparation work.

File Automatic Preparation Function (Java Compiler 474)

When the user depresses the "Play" button of the "Conductor" window for confirmation of the substance of the VRML content, the Java compiler 474 automatically compiles source programs of the script, for example, files having ".java" as the extension, to automatically prepare an object program having ".class" as an extension for example.

Script Program Preparation and Debugging Function (Text Editor 426)

The user can use the text editor 426 to prepare a source program of the script by the Java language or other program language suited to the script preparation and compile the source programs prepared by using the Java compiler 474 to prepare the object program.

This object program is also executed when confirming the operation by the browser emulator 460 in addition to when operating the VRML content by the VRML browser 308.

Further, when adding a debug code to the source program and executing the same at the Java emulator 470, the Java debugger 472 displays the value of the input/output of the script, etc., and enables the debugging work of the script.

Template Automatic Preparation Function (Text Editor 426)

When the user sets the values of the input/output of the script node by an interactive manner, the template preparation tool 428 prepares a template of the source program of the script suited to this setting. The user can use the text editor 426 to add the required modifications to the template and thereby prepare the source program of the script for realizing the desired event. By this function, the user can eliminate the trouble of preparing all source programs of the script by the editor and in addition can prevent occurrence of simple coding mistakes.

Object Display Function (Model Editing Tool 420)

The model editing tool 420 enables normal display and display from different viewpoints.

Figure 11:
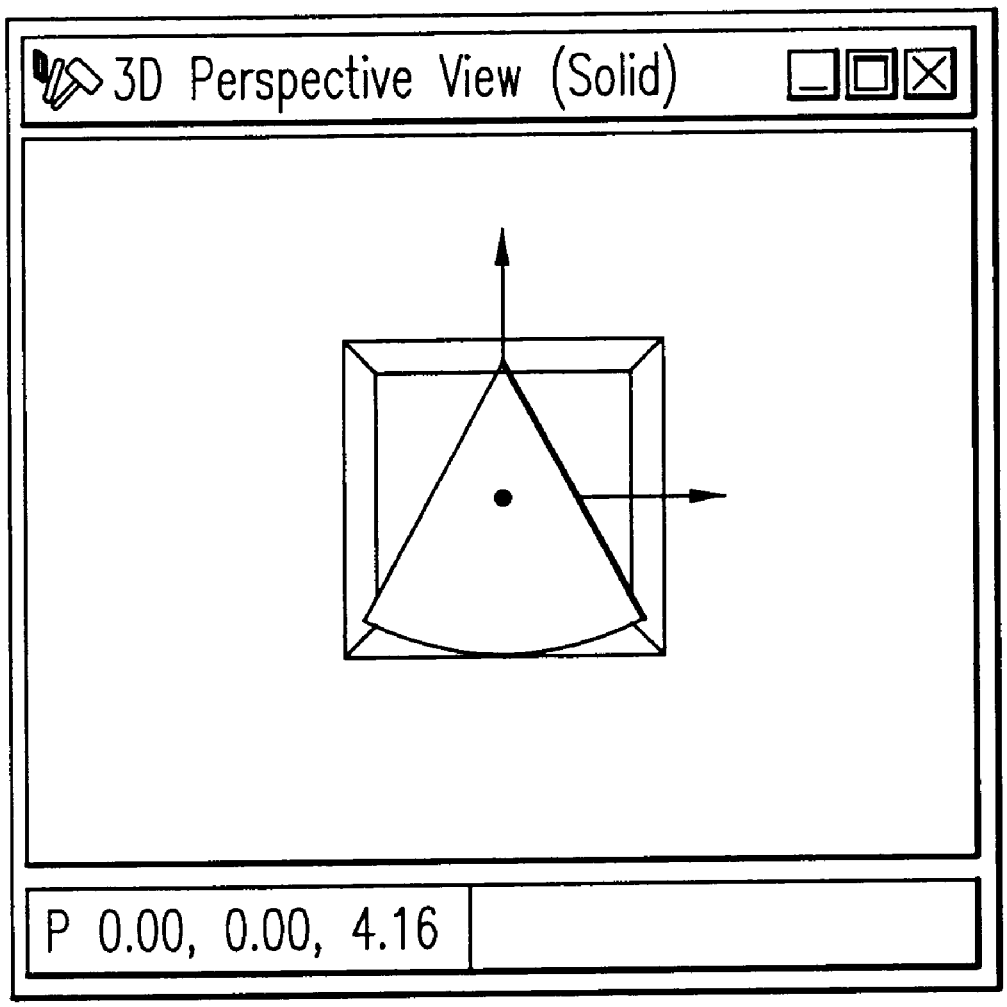
FIG. 11 is a view of an example of the display of a 3D VIEW window (editing window) illustrated in FIG. 9.

FIG. 11 is a view of an example of an object displayed in the "3D View" window of a GUI screen of the display device 24.

The model editing tool 420 displays a three-dimensional perspective projection view (3D perspective view) of the object indicated by the prepared graphic data in the "3D View" window in the GUI screen (FIG. 9). Below, this will be called the "3D View" window. In this state, if the user clicks and selects an object in the "3D View" window and clicks and selects one of a "Rotate" button, "Move", "Navigate", or "Scale" button displayed in the "Conductor" window of the GUI screen shown in FIG. 10A to change the rotation, motion, or viewpoint motion operation mode and further if the user depresses the left button of the mouse 262 and drags on the inside of the "3D View" window or clicks on it by the left button of the mouse 262, the model editing tool 420 displays an image (object) obtained by rotating or moving the selected object (model) on the display device 24 in accordance with the mouse mode (rotation, motion) and the operation of the user with respect to the "3D View" window. When the user selects "Navigate (viewpoint motion)" as the operation mode, the model editing tool 420 uses the position in the "3D View" window clicked by the user as the viewpoint and displays the image when viewing the selected object from this viewpoint. Therefore, according to the above processing of the model editing tool 420, it is possible to view the object from various viewpoints. That is, by using this function, it is possible for the user to view the object from various viewpoints.

Note that when viewing an object from these different viewpoints, it is preferable in terms of the simplicity of the operability that the object concerned be positioned at the center of the window. Therefore, in the present embodiment, in the processing for changing the viewpoint, the object concerned is automatically made to move to the center of the window.

Figure 12B:
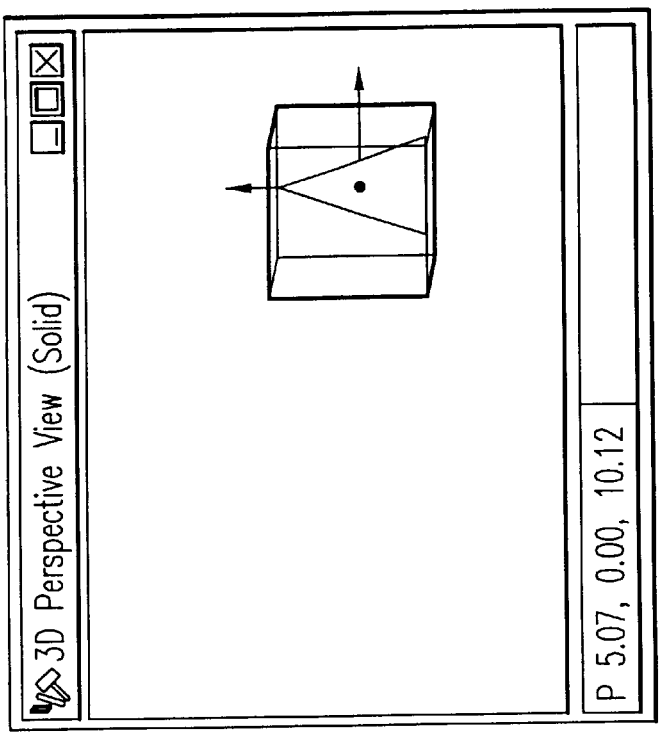
FIG. 12 to FIG. 14 are views of the graphic of POINT OF INTEREST in a window of a screen of a display device.
Figure 12A:
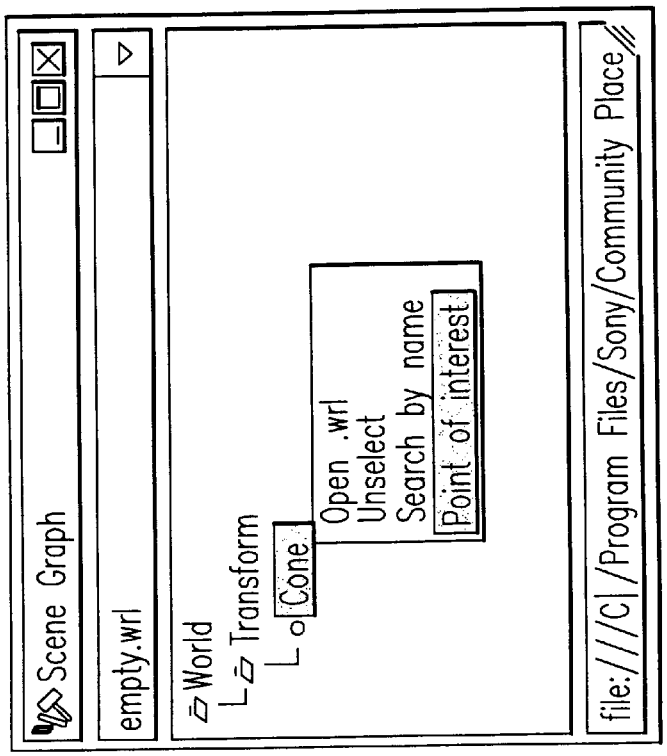
Figure 13B:
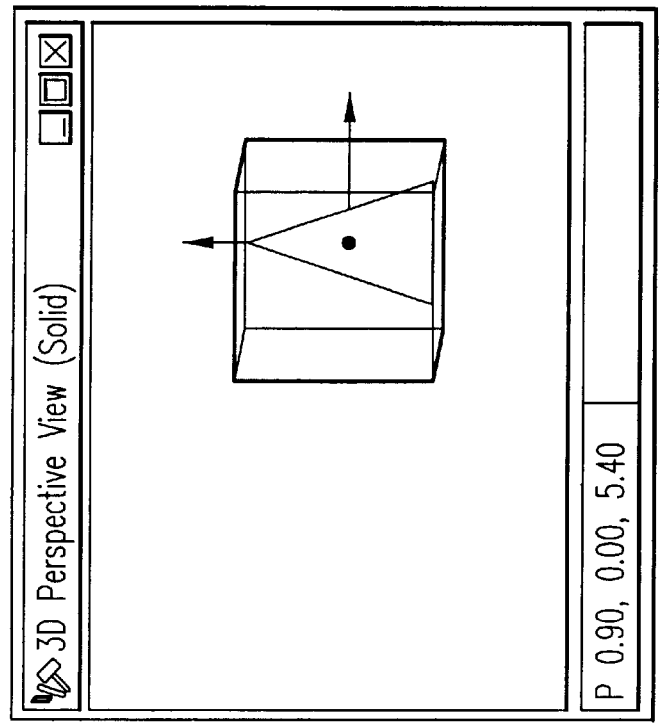
Figure 13A:
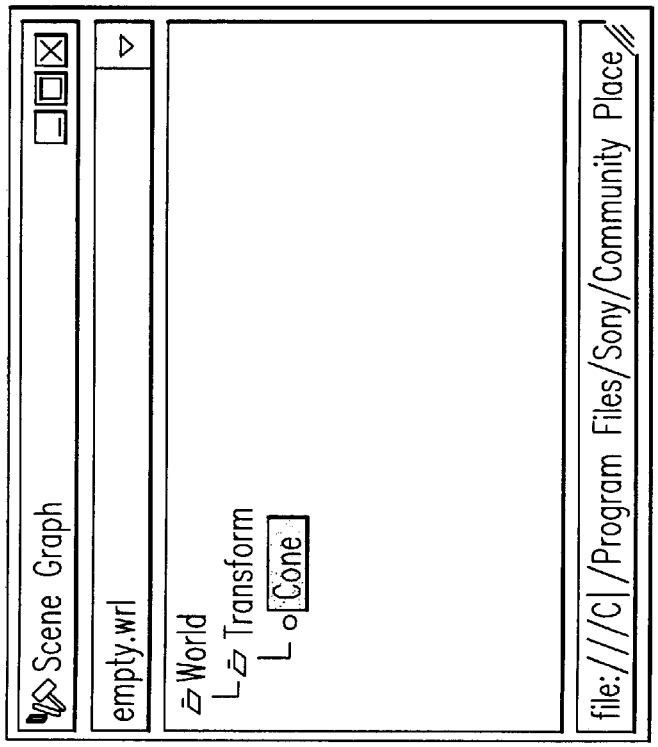
Figure 14B:
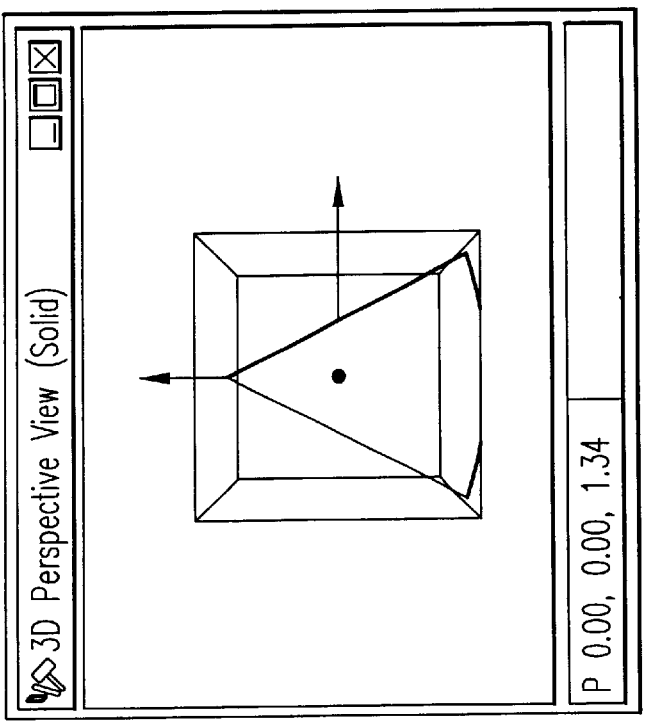
Figure 14A:
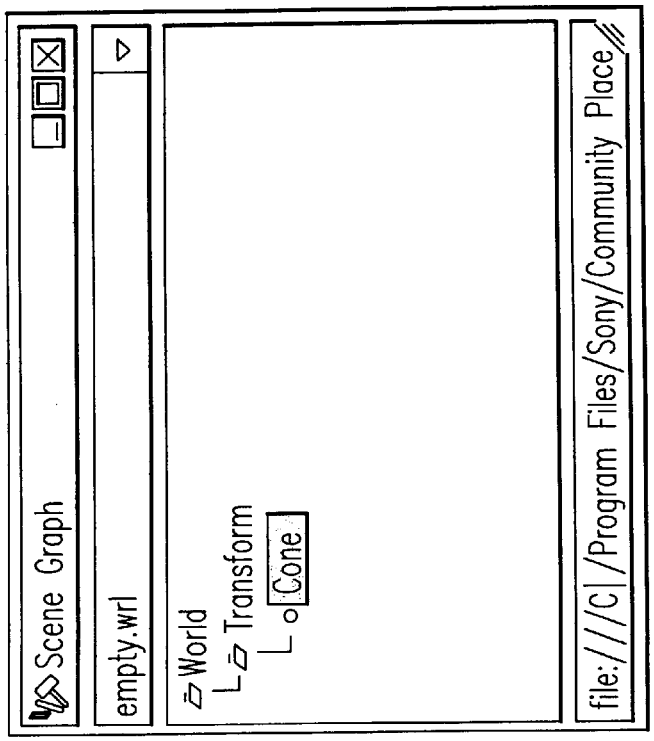

Further, there is a POI (point of interest) mode in the operation modes of the mouse 262 as shown in FIG. 12. When the user selects the object (model: cone) in the "3D View" window by pointing by the mouse 262, the model editing tool 420 matches the viewpoint to the selected object (model) and displays the same at the center of the "3D View" window as shown in FIG. 11 and FIG. 14.

Scaling Function of Object (Model Editing Tool 420)

If making the operation mode of the mouse 262 the "scale" in the "Conductor" window shown in FIG. 10A and, for example, the user moves the cursor while depressing a predetermined button of the mouse 262 or inputting an operation for instructing a modification of the size of the object or data showing the size after the modification from the keyboard 260, the model editing tool 420 modifies the dimensions (size) of the object in accordance with the motion of the cursor and displays the same. When the user releases the button of the mouse 262, the model editing tool 420 finally sets the size of the model and modifies the content of the graphic data of the object so as to display the object of the size at the time of the final setting in the three-dimensional virtual space.

Note that it is possible for the user to combine the modification of the mouse mode and the operation of the mouse 262 to make for example the routing editing tool 422 rotate and move the object and also enlarge (reduce) and display the changed image in the "3D View" window. That is, this processing is effective when viewing an object from different viewpoints.

Further, if the user for example releases the predetermined button of the mouse 262 or performs another operation for instructing modification of the graphic data, the model editing tool 420 modifies the content of the graphic data of the object (model) in accordance with the object displayed on the display device 24.

Region Display and Setting Function of Sensor Node (Model Editing Tool 420 and Browser Emulator 460)

A sensor is provided in the Primitive Bar illustrated in FIG. 10A and FIG. 10C for generating an event when the user clicks and points to an object in a virtual space displayed in a window of the screen of the display device 24. When the sensor generates an event, script routed to the sensor is executed, and when the cursor moves outside the region (boundary box) of the sensor node, the script stops being executed.

The sensor node region display and setting function is a function for confirming and modifying the range of a valid region in a touch sensor given to an object for generating an event in accordance with an operation by the mouse 262 etc., a sound node outputting a sound in accordance with an operation of the mouse 262 etc., or other three-dimensional virtual space.

Figure 15:
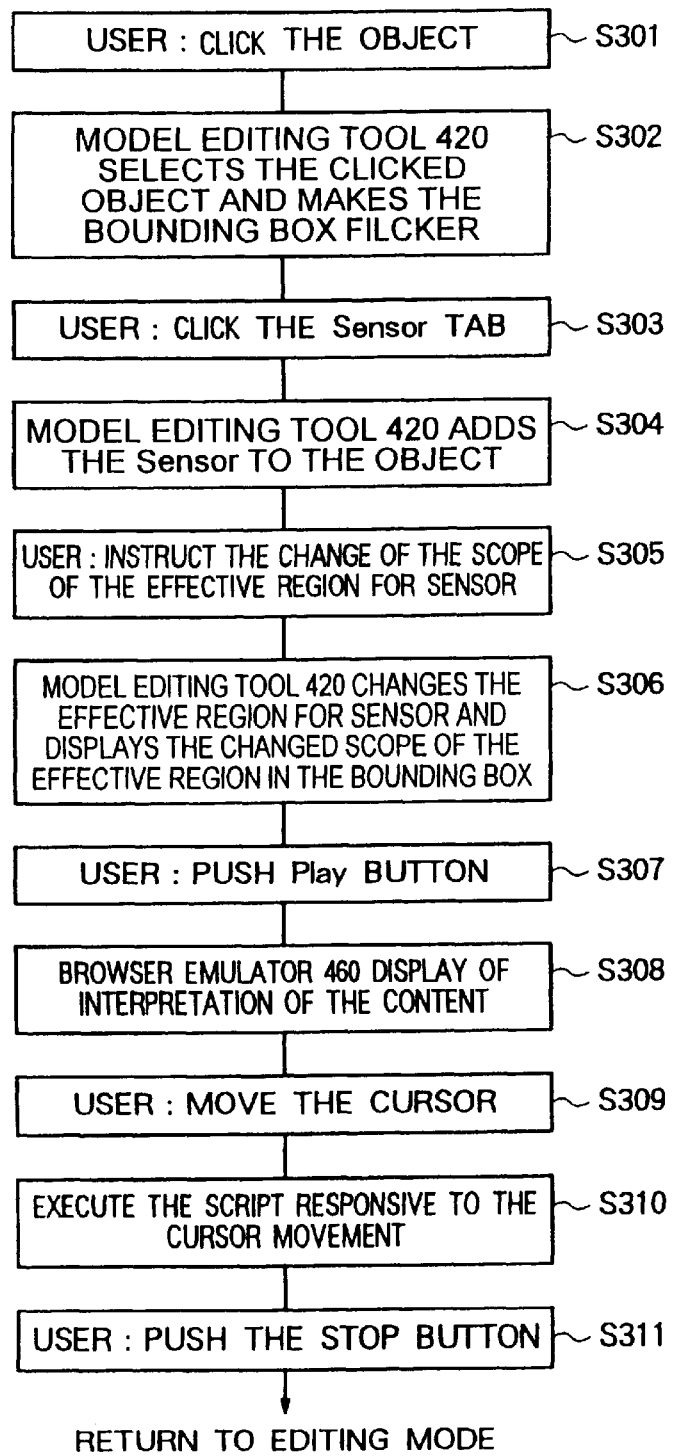
FIG. 15 is a flow chart of the processing for displaying and setting regions of the sensor node.

An explanation will be made of the sensor node region display and setting function referring to FIG. 15.

S301: The user clicks on an object in the "3D View" window using the mouse 262.

S302: The model editing tool 420 operates in response to the above operation of the user. The model editing tool 420 selects the clicked object and causes the bounding box surrounding the selected object to blink.

S303: Further, the user clicks on the "Sensor" tab of the "Conductor" window in the menu screen to designate for example a touch sensor (TouchSensor) or the like.

S304: The model editing tool 420 adds a touch sensor etc. to the object in accordance with the operation of the user.

In this initial stage, the range indicated by the bounding box indicating the selection of the object becomes the range of the valid region of the touch etc.

S305: Further, the user inputs a command for instructing a modification of the range of the valid region of a sensor from the keyboard 260 and data showing the range of the valid region after the modification or uses the mouse 262 to point to the range of the valid region after the modification.

S306: The model editing tool 420 modifies the range of the valid region of the sensor etc. and displays the range of the valid region of the sensor etc. after the change by the bounding box in accordance with the operation of the user. Note, in the following embodiments showing as the examples, the shape of the bounding line is represented as the box-like shape (i.e., the bounding box), but, the shape of the bounding line is not limited to the bounding box-like shape, for mediating-out the embodiments of the present invention.

The display function and scaling function mentioned above are possible also with respect to the following line (the bounding box). The user can make the model editing tool 420 perform rotation, motion, and enlarged or reduced display of the bounding box by the above operation. The model editing tool 420 sets the range defined by the bounding box modified by these operations as the range of the valid region of the sensor etc. after modification.

S307: Further, the user depresses the "Play" button displayed in the "Conductor" window by the mouse 262 for confirming the substance after the modification.

S308: The browser emulator 460 operates in response to the operation of the user. The browser emulator 460 executes the operation for analyzing and displaying the content. Note that preferably, as explained in the above section "Confirmation Operation", the backup manager 466 is also activated simultaneously with the browser emulator 460 so as to enable storage and restoration of the field values due to a moving object while confirming the VRML content by the browser emulator 460.

S309, S310: In the state with the browser emulator 460 operating, for example if the user moves the cursor of the mouse 262 into the bounding box, the sensor generates the event and the script routed to the sensor is executed. If moving the cursor to the outside of the bounding box, the execution of the script is stopped.

S311: The execution of the VRML content by the browser emulator 460 is stopped by the user depressing the "Stop" button displayed in the "Conductor" window to return the operation of the content preparation software tool 4 to the preparation mode.

Parallel View Function (Model Editing Tool 420)

Figure 16:
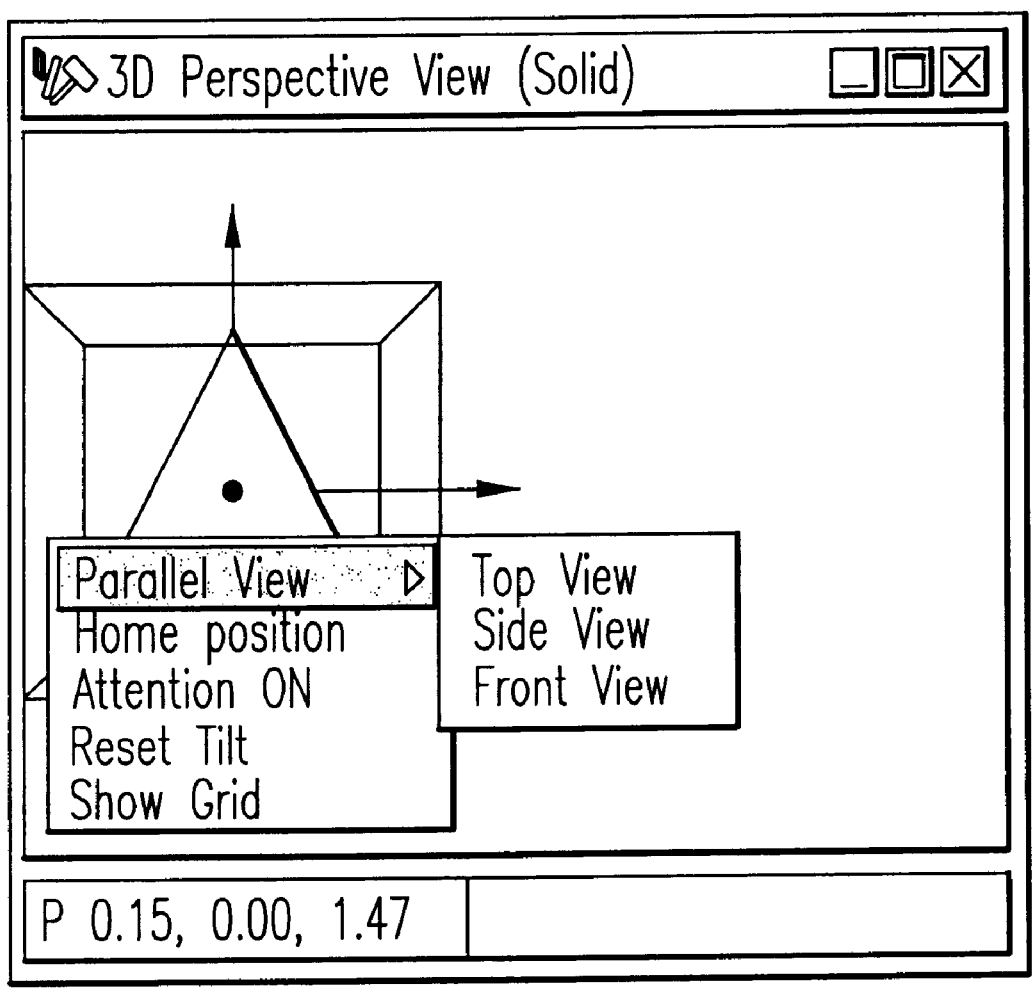
FIG. 16 and FIG. 17 are views of examples of display by a PARALLEL VIEW function.
Figure 17A:
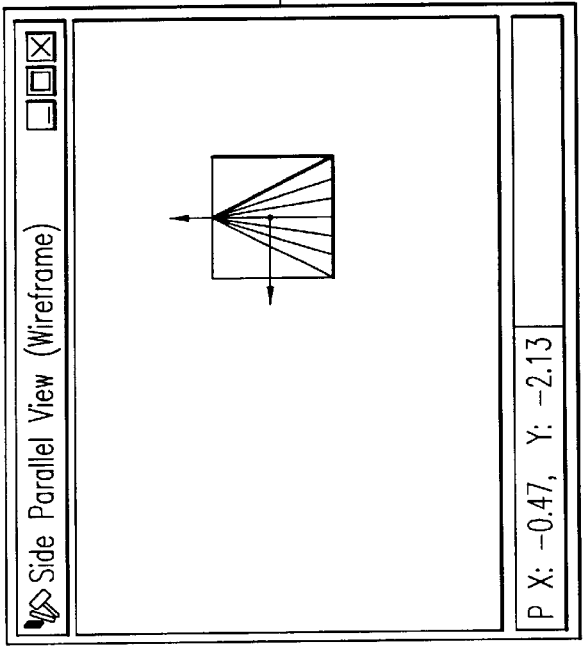
Figure 17B:
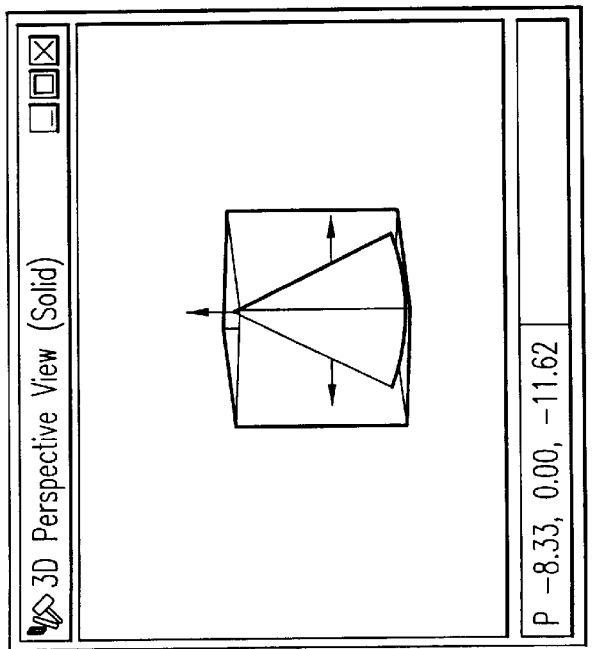
Figure 17D:
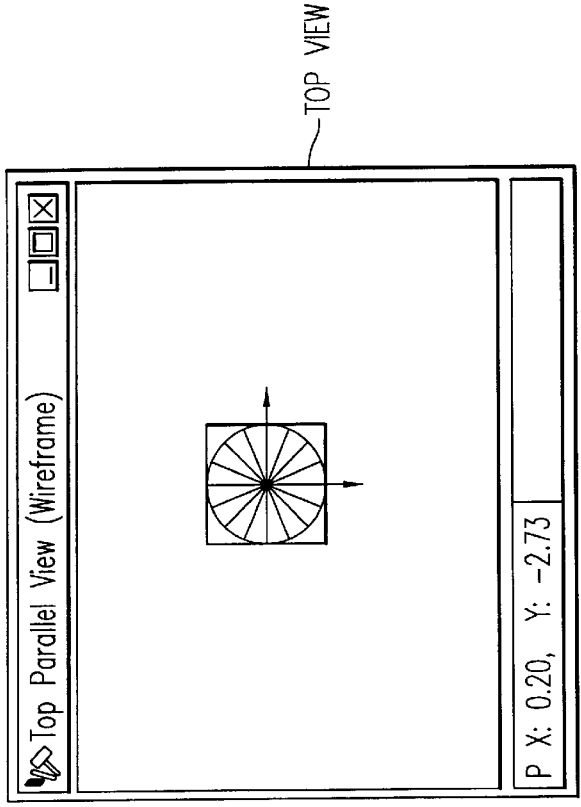
Figure 17C:
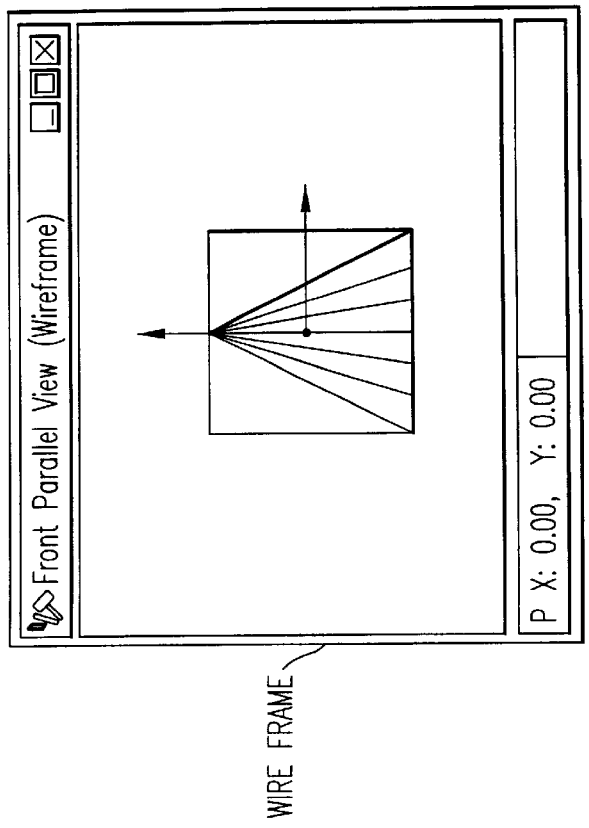

FIG. 16 is a view of a pop-up menu displayed in the "3D View" window of the display device 24. FIG. 17 is a view of the parallel view function.

If the user clicks on a predetermined button of the mouse 262 (right button of mouse) in the "3D View" window in a state where the browser emulator 460 is stopped, as shown in FIG. 16, the model editing tool 420 displays the pop-up menu in the "3D View" window. If the user selects one item from the pop-up menu, the model editing tool 420 two-dimensionally displays a side view of the object, a top view, or a view by a wire frame in the "Parallel View" window in the menu screen of the display device 24.

Attention Function (Model Editing Tool 420)

The attention function is a function used for confirming the shape of an object displayed in the "3D View" window. It arranges and displays objects as the user sees them from a viewpoint designated in the content preparation software tool 4 in the three-dimensional virtual space around one among the one or more objects selected by the user by the mouse 262 in the "3D View" window.

The model editing tool 420 displays one or more objects prepared in the "3D View Window" arranged in a three-dimensional virtual space.

Figure 18A:
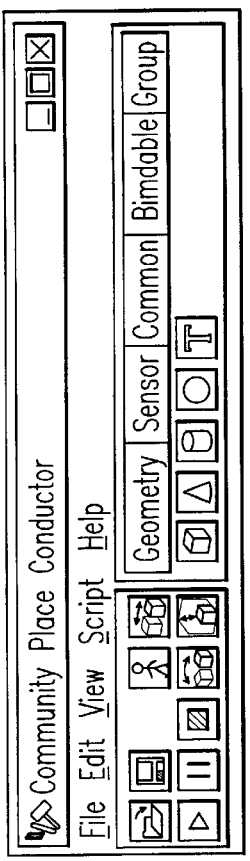
FIG. 18 to FIG. 22 are views of examples of display by an ATTENTION function.
Figure 18C:
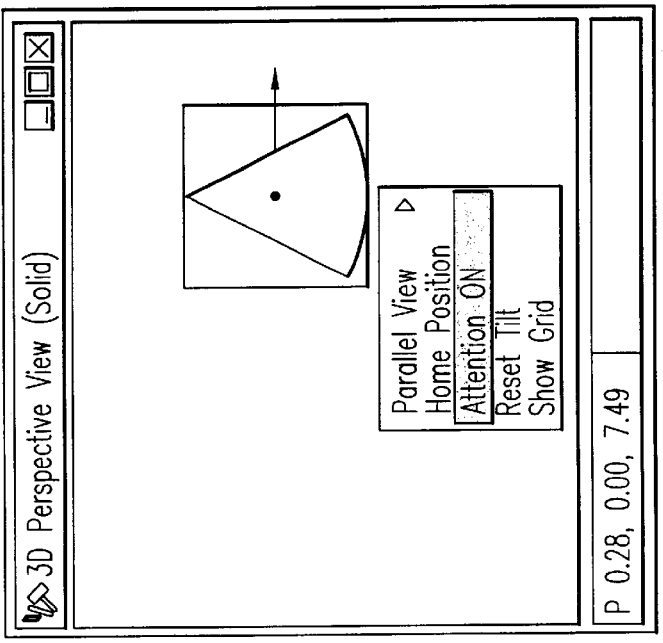
Figure 18B:
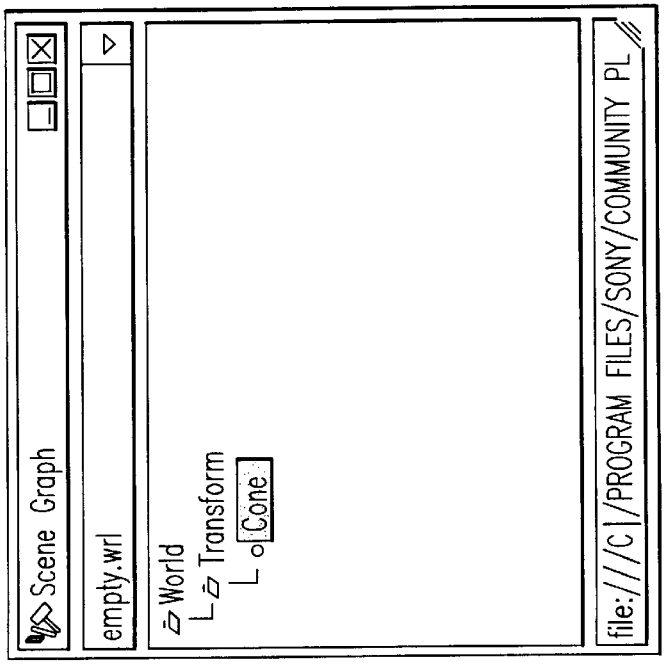
Figure 19A:
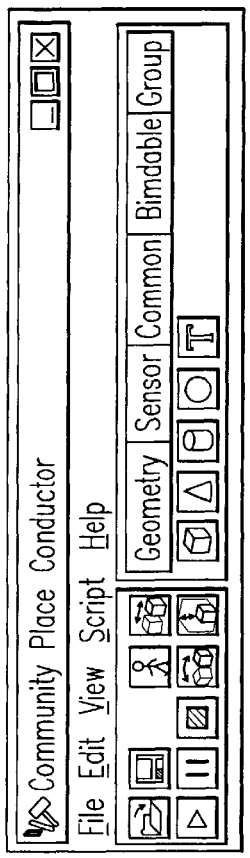
Figure 19C:
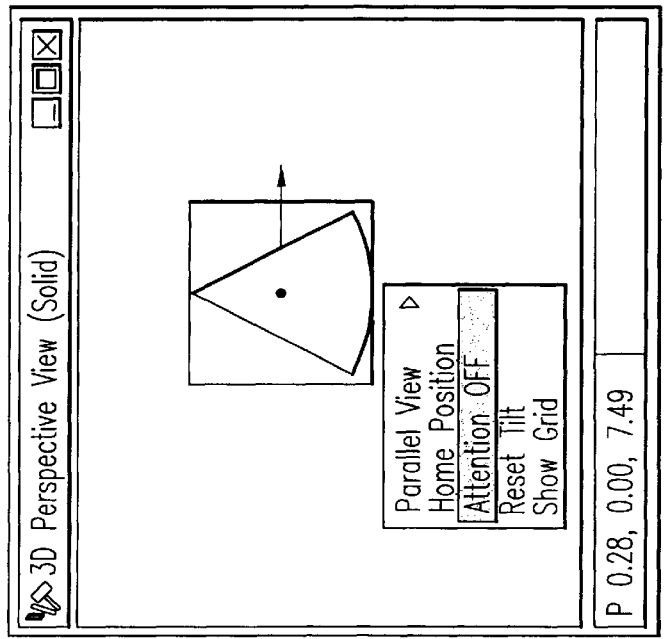
Figure 19B:
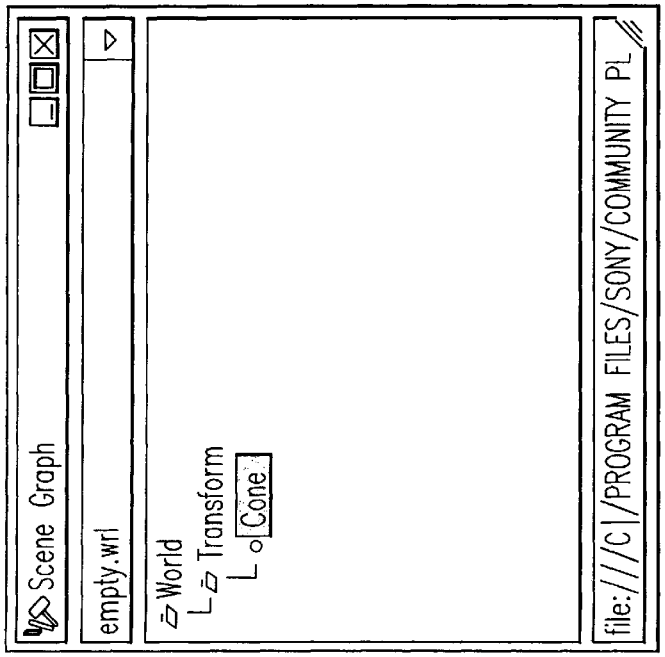
Figure 20:
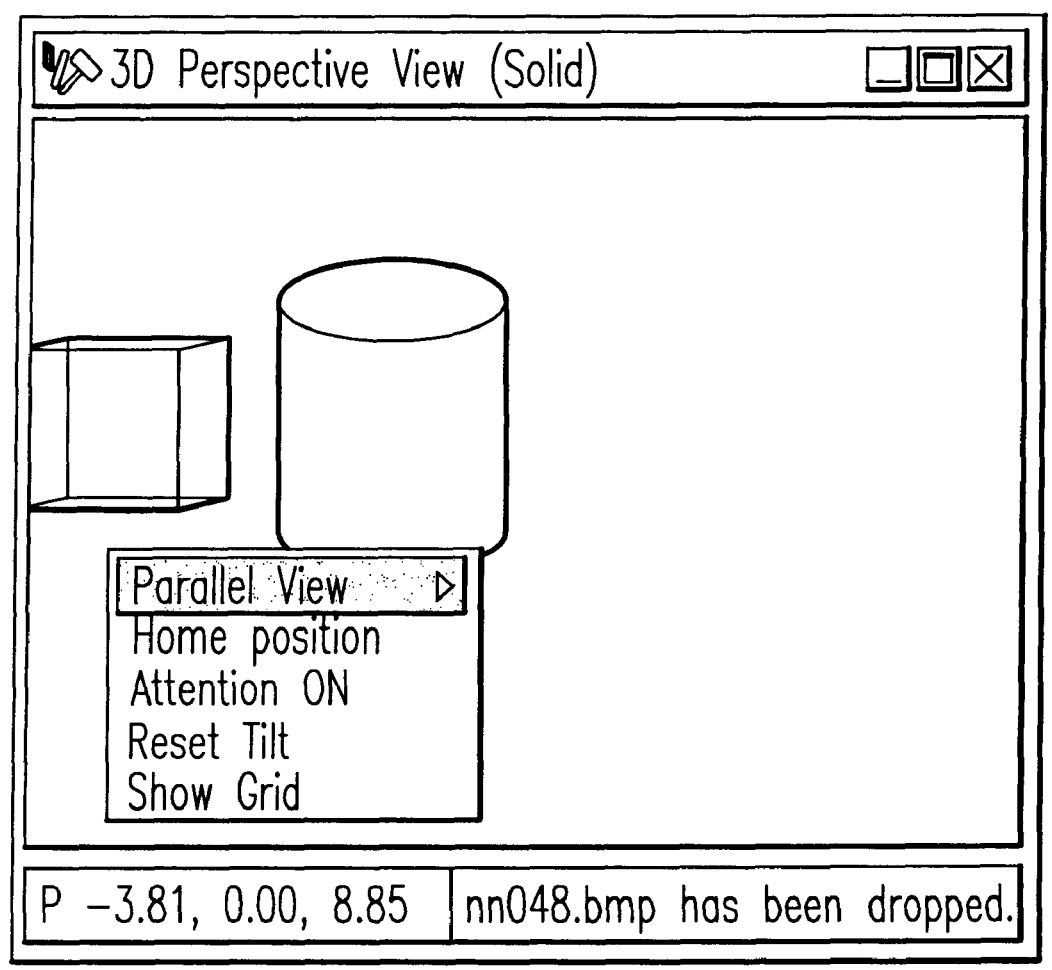
Figure 21:
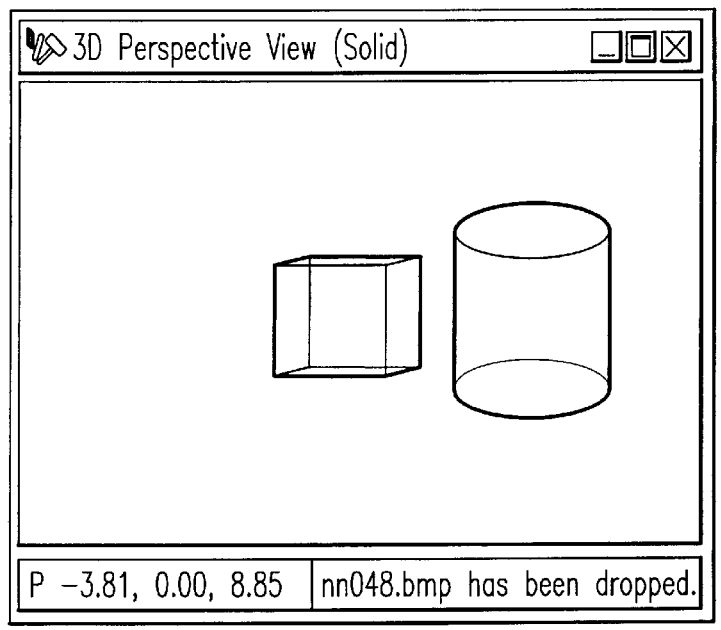
Figure 22:
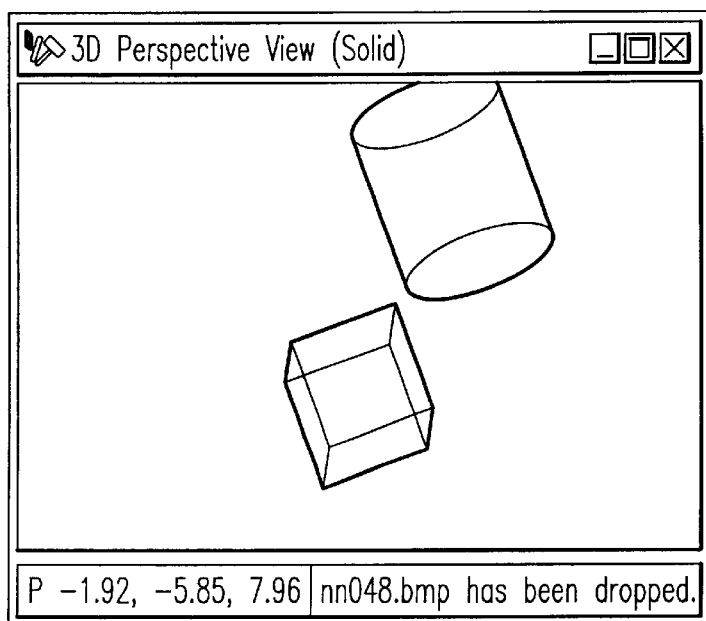

As the menu screen displayed on the display device 24, that illustrated in FIG. 18 and FIG. 19 is shown. FIG. 20 to FIG. 22 are views of objects displayed in the "3D View" window as first to third examples showing the attention function. The objects shown in FIG. 18 to FIG. 19 are cones, but the objects displayed in FIG. 20 to FIG. 22 are embellished cones.

Figure 23:
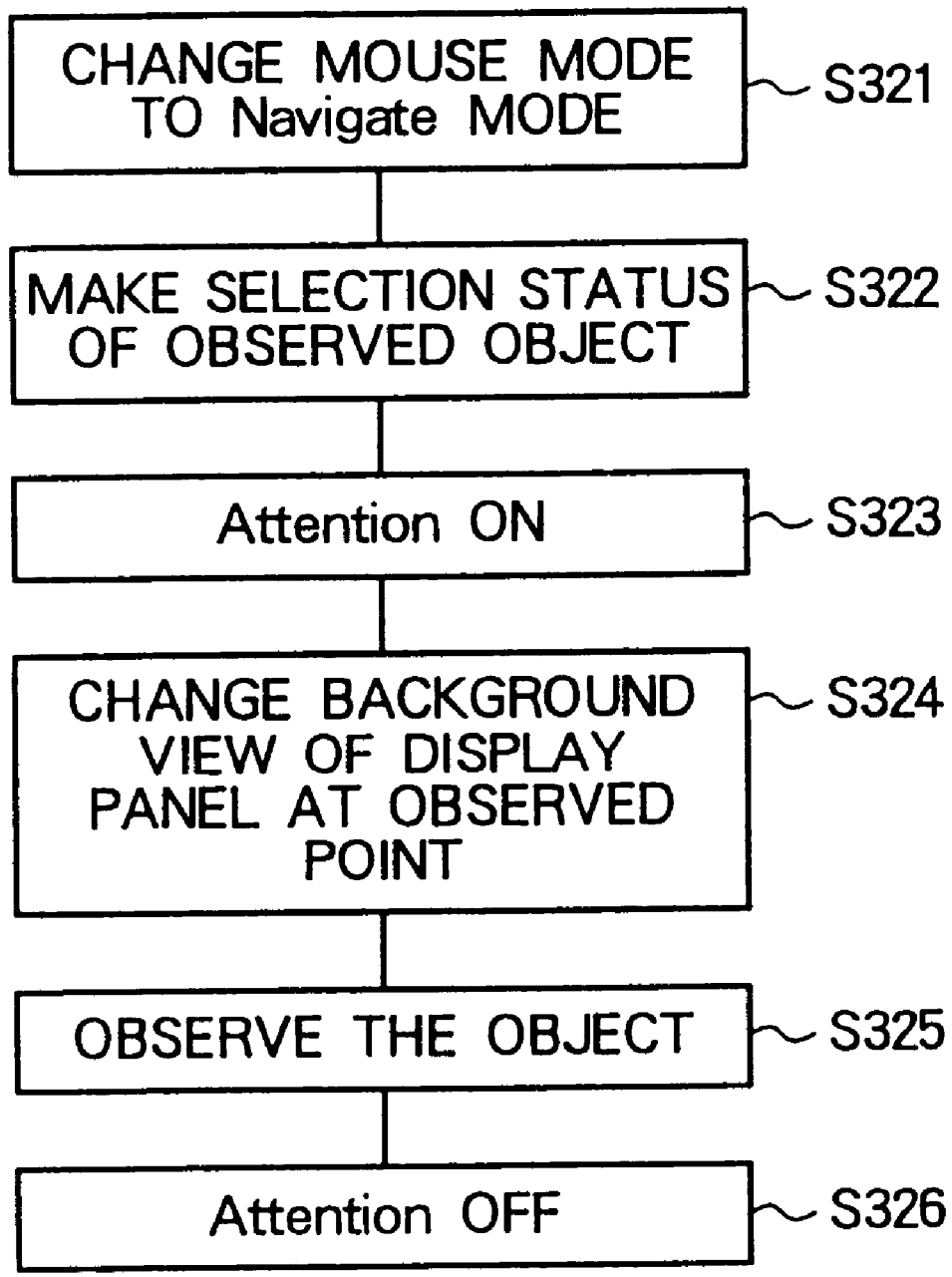
FIG. 23 is a flow chart of the processing of an ATTENTION function.

The attention function will be explained with reference to the flow chart of FIG. 23.

S321: The user clicks the "Navigate" button by the mouse 262 in the "Conductor" window as shown in FIG. 18 to enter the viewpoint motion (Navigate) mode.

S322: The user clicks on and selects a conical object by the left button of the mouse 262 as shown in FIG. 18 or FIG. 20 in a "3D View" window displaying for example the conical object shown in FIG. 18 or the conical object and the embellished cylindrical object shown in FIG. 20. The model editing tool 420 surrounds the selected conical object by the bounding box to indicate that it has been selected.

S323, S324: The user selects "Attention On" of the pop-up menu displayed by clicking the right button of the mouse 262 as shown in FIG. 18. Due to this, the model editing tool 420, as shown in FIG. 19 or FIG. 21, changes the background of the viewpoint position display panel to yellow and changes the direction of the line of sight so that the selected object is at the center of the "3D View" window. The position of the viewpoint does not change, however, so the distance to the object remains the same.

S325: When the user depresses the left button of the mouse 262 and drags around the object, as illustrated in FIG. 22, the position of the viewpoint and the direction of the line of sight of the object change accordingly, so it is possible to view the object from various directions. That is, the model editing tool 420 changes the substance of the display of the "3D View" window in accordance with the designation of the user to an image of the conical object and cylindrical object as seen when using the position designated in the three-dimensional virtual space as the viewpoint. In this way, by using the attention function, the user can view not only the object itself rotated, but also the entire scene actually displayed in the "3D View" window rotated in the three-dimensional virtual space and therefore can easily obtain a grasp of the entire image of the object.

S326: When finishing viewing, the user, as shown in FIG. 19, selects "Attention OFF" in the pop-up menu. By this, the attention function of the model editing tool 420 is ended.

Routing Editing Function: Setting of Type of Input Data (Routing Editing Tool 422)

In VRML 2.0, it is possible to define the transfer of events between fields of the nodes by the route text such as the following:

ROUTE NODE1.field1 TO NODE2.field2

In this example, it is defined to send an event to a field given the field name (eventOut) of "field1" of the node given the node name (NodeName) of "NODE1". In this route text, it is necessary that the data type (Data Type) preset for the file name (eventOut) of the side outputting the event and the data type (Data Type) preset for the file name (eventOut) of the side inputting the event match.

When the user selects the field names of nodes on the side inputting an event, the routing editing function displays just field names matching the data type preset for the field name of the node of the side outputting the already selected event as a pull down list (drop down list) in the ComboBox. By presenting to the user just the field names for which routing is possible in this way, the user can avoid the problem of describing mistaken route text and therefore the work of the describing the routing is made easier for the user.

The routing editing function will be further explained with reference to FIG. 24 and FIG. 25 to FIG. 27.

Figure 24:
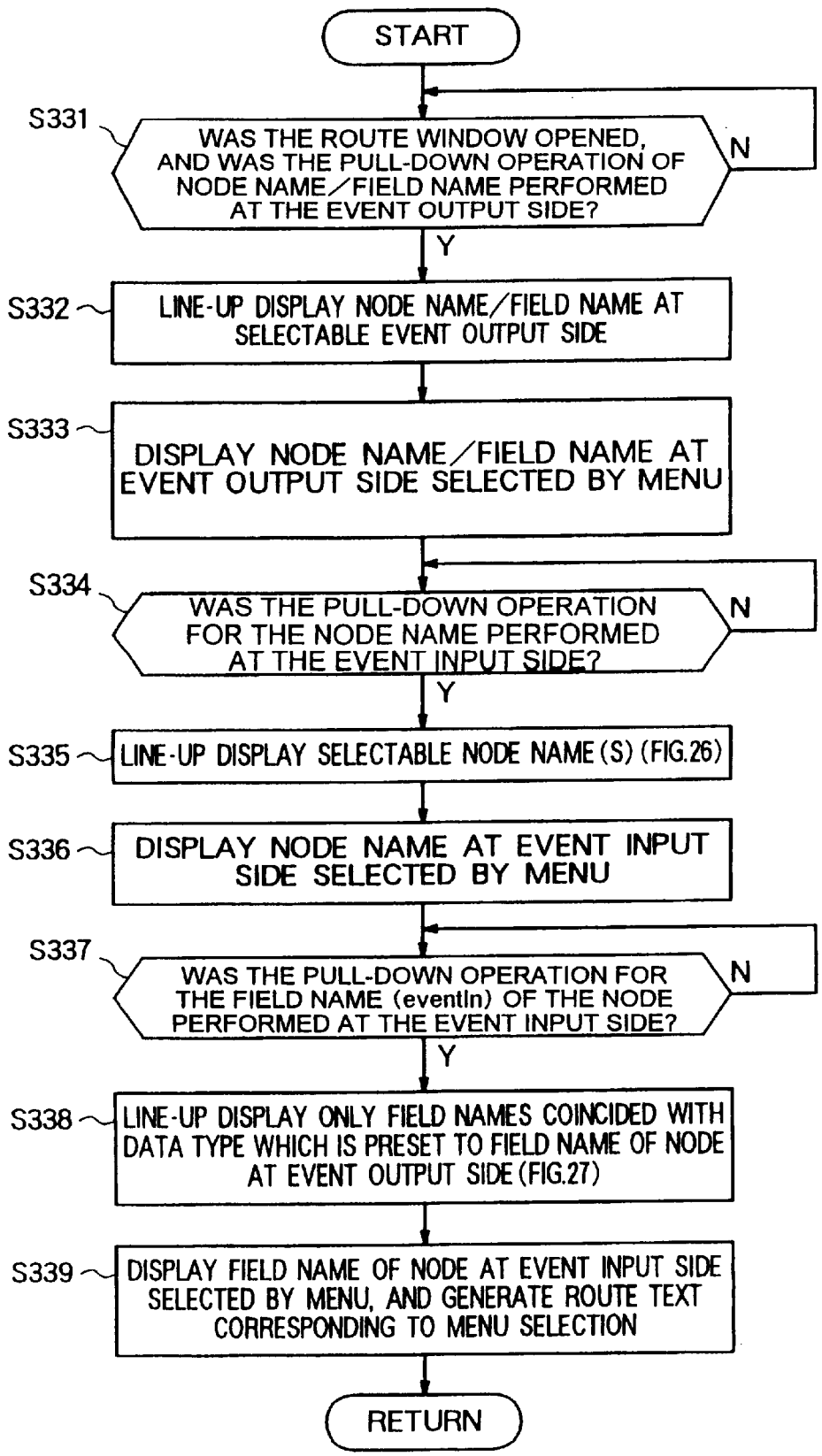
FIG. 24 is a flow chart of a routing editing processing.

FIG. 24 is a flow chart of the processing of the routing editing function.

Figure 25:
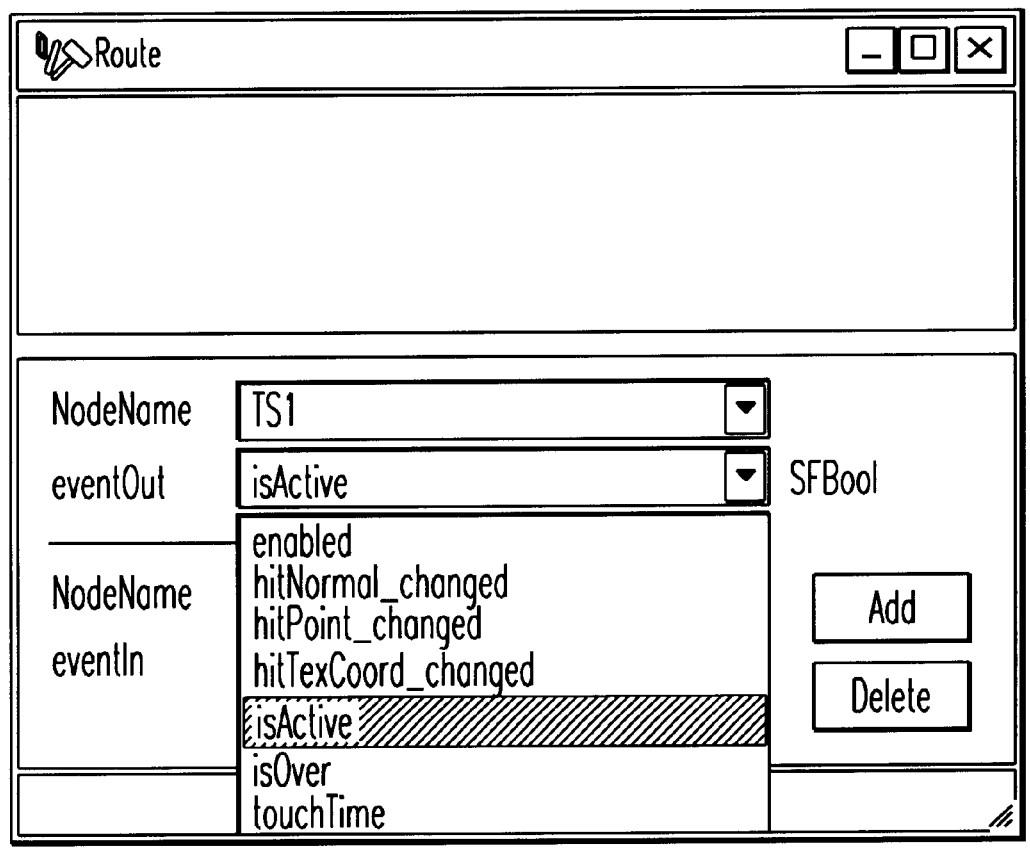
FIG. 25 to FIG. 27 are views of examples of display in routing editing processing.
Figure 26:
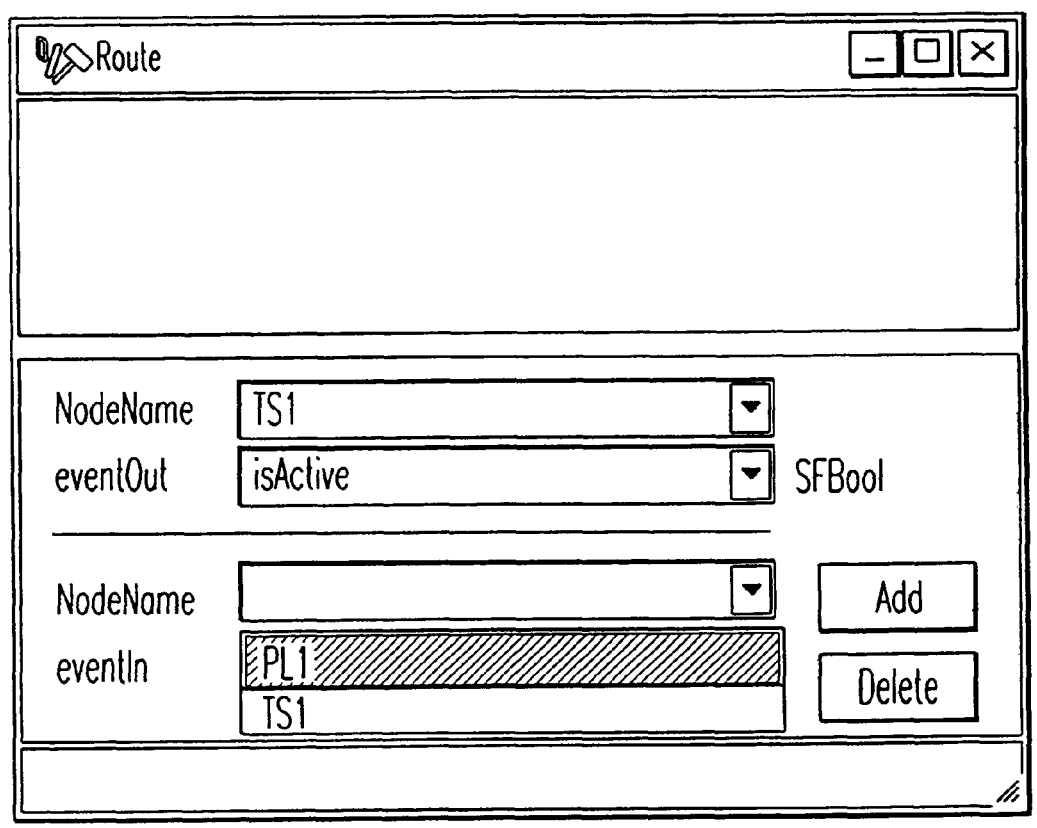
Figure 27:
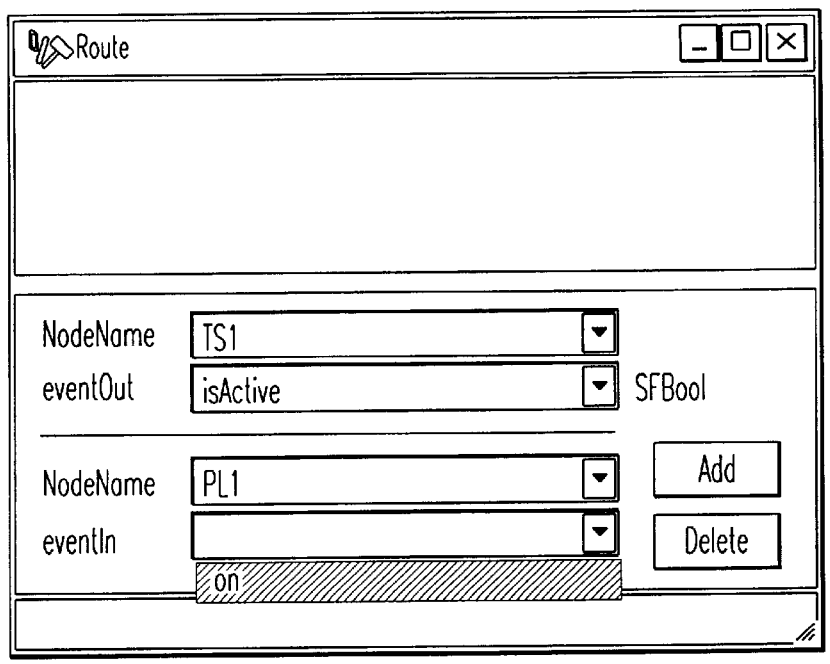

FIG. 25 to FIG. 27 are views of the "Route" window showing an example of the routing editing function.

The routing editing function, in other words, the processing for setting the type which may be input, will be explained with reference to FIG. 24. The following processing is executed by interactive manner of the routing editing tool 422 with the user.

S331: The "Route" window is opened by the user and the routing editing tool 422 judges if the mouse has been operated to display the pull down list (drop down list) of the node names (NodeName) or their field names (eventOut) of the upper side outputting events.

S332: The routing editing tool 422 extracts the node names (NodeName) or their field names (eventOut) of the side outputting events which can be selected and displays the same as a pull down list (also called a ComboBox).

S333: "TS1" for example is displayed by the routing editing tool 422 as the node name (NodeName) of the side outputting the event selected by the operation of the user to select from the menu using the mouse and "isActive" for example is displayed by the routing editing tool 422 as the field name (eventOut) from the pull down list displayed as shown in FIG. 25. The data type (Date Type) preset for the selected field name, for example SFBool (Boolean value showing true or false, taking one of value of FALSE (0) or TRUE (1)), is displayed as reference in the right adjoining region of the field name (eventOut) by the routing editing tool 422.

S334: Whether or not there has been a mouse operation by the user for displaying the pull down list of the node names (NodeName) of the lower side inputting the event is judged by the routing editing tool 422.

S335: As shown in FIG. 26, for example, "PL1" and "TS1" are displayed by the routing editing tool 422 in the pull down list as node names (NodeName) of the input side of the event which may be selected.

S336: The node name (NodeName) of the side inputting the event selected by the operation of the user to select from the menu using the mouse 262 is displayed by the routing editing tool 422 from the pull down list shown in FIG. 26.

S337: Whether or not there has been a mouse operation by the user for displaying the pull down list of the field names (eventIn) of the lower side inputting the event is judged by the routing editing tool 422.

S338: As shown in FIG. 27, just the field names (eventOut) of the side inputting the event which can be selected are displayed in a pull down list by the routing editing tool 422. In this case, only the field names named "on", that is, the field names which match the data type preset for the field name of the node of the side outputting the event already selected by the user (in this case, which match SFBool), are displayed in the pull down list by the routing editing tool 422.

S339: The field name (eventOut) of the node of the side inputting the event selected by the menu selection operation by the mouse from the pull down list shown in FIG. 27 is displayed by the routing editing tool 422 and the route text corresponding to the node names and the field names for transferring the event selected by the above menu operation is generated at the routing editing tool 422.

In this way, according to the routing editing function, since just the file names of the nodes matching the type of the data of the event to be transferred between the fields of the nodes are displayed to the user, the user can select one of the file names displayed to set the type of the routing. Therefore, it becomes easy to set the type of data of the routing and mismatches of the types of data between nodes due to careless error etc. and other problems can be prevented.

Routing is deleted by selecting the routing desired to be deleted and then depressing the "Delete" button. The routing editing tool 422 deletes the routing concerned in accordance with this operation.

Script Editing Function (Text Editor 426)

When the user modifies the value of the input/output of the script node ("eventIn", "eventOut), the text editor 426 automatically modifies the source program of the script corresponding to the script node so as to be compatible with the value of the input/output after the modification.

File Scope Function (Scene Graph Editing Tool 424)

When the user selects the VRML file to be edited in the "Conductor" window etc. of the menu screen of the display device 24, the scene graph editing tool 424 displays the nodes referred to by the selected VRML file to be edited in the "Scene Graph" window in the form of for example a hierarchical tree. The set of nodes referred to by the VRML file to be edited in this way will also be referred to as a "file scope".

The scene graph editing tool 424 limits the nodes for routing, script preparation, and other editing to the file scope displayed in the "Scene Graph" window. Further, the content of the file scope and the nodes which may be edited are changed to the nodes referred to by the VRML file after modification in accordance with modification by the user of the VRML file to be edited.

Note that the script editing function is valid throughout the nodes in the same VRML file (in file scale). When the user modifies the value of the input/output of the script node in the same VRML file ("eventIn", "eventOut), the text editor 426 automatically changes the source programs of the script corresponding to the script node in the same VRML file (displayed in the same file scope) to be compatible with the value of the input/output after the modification so as to maintain the match of the descriptions between the script nodes (Inline management function). Further, in the VRML file, the name of the node must be unique, therefore the text editor 426 automatically changes the node name so that the name of the copied and pasted node becomes unique in the same VRML file so as to avoid overlapping of the node name (naming function at paste).

Basic Method of Preparation of VRML Content

An explanation will next be given of an example of the preparation of VRML content by the content preparation software tool 4.

Figure 28:
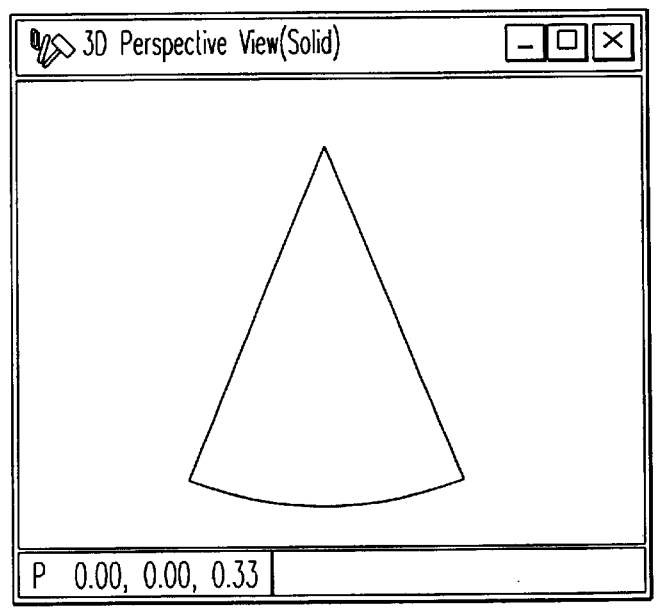
FIG. 28 shows an example of the display of an object for preparing VRML content.

FIG. 28 is a view of an example of a conical object prepared by the content preparation software tool 4.

An explanation will be made of the case of preparing the content (first content) for attaching a sensor to the conical object shown in FIG. 28 and making the cone bright or dark (turning ON/OFF the light) in accordance with pointing to the sensor as a first specific example of preparation of content of three-dimensional virtual space (VRML content) using the content preparation software tool 4.

Figure 29:
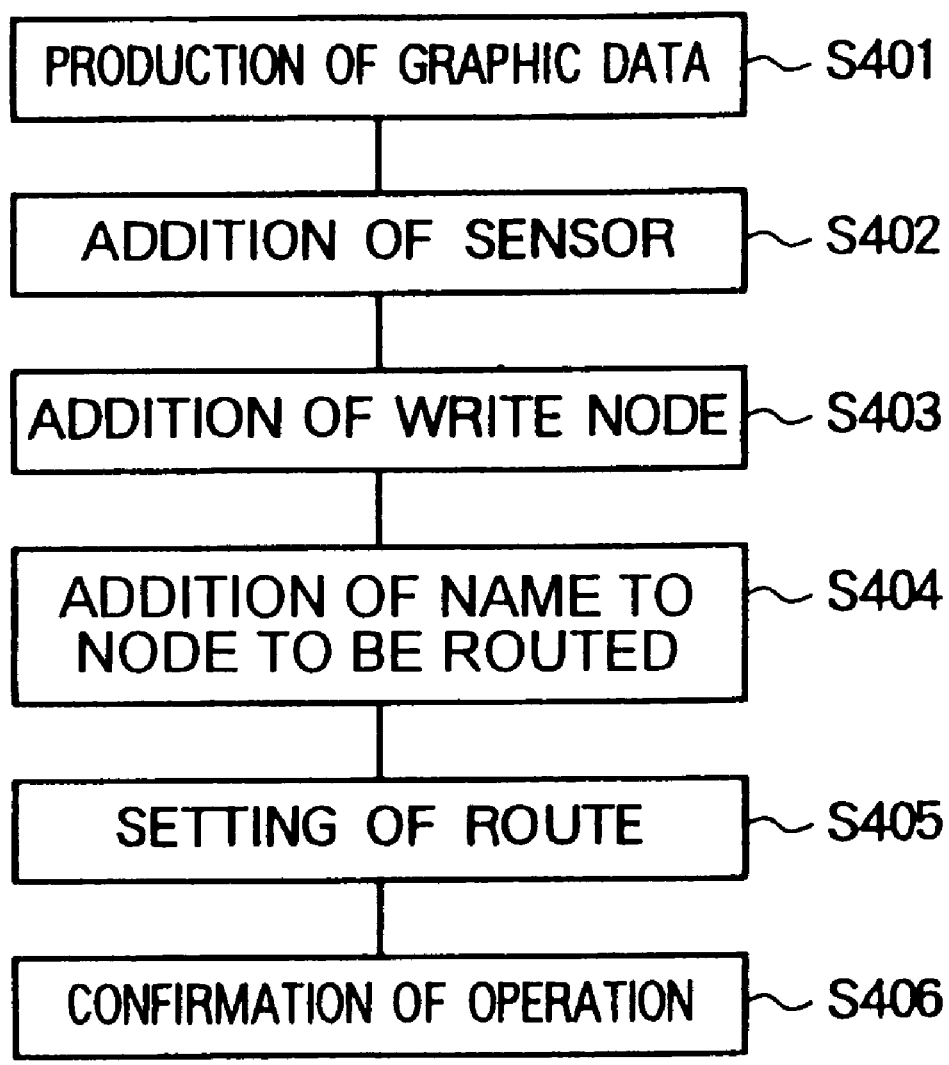
FIG. 29 is a flow chart of the processing for preparing first VRML content.

The VRML content is prepared by the process illustrated in FIG. 29. That is,

S401: Preparing the graphic data [arranging the geometry node of the object {geometry node (cone)}]

S402: Adding the sensor [arranging the sensor node (TouchSensor)

S403: Attaching a light node [arranging a node prescribed by VRML {common node (PointLight)}

S404: Naming the node being routed

S405: Setting the route

S406: Confirming the operation

Details of the process will be explained below:

S401: Preparation of GraDhic Data [Arrangement of Geometry Node (Cone)]

The user arranges the object in the three-dimensional virtual space (world) to construct the entire setup. The object which can be arranged in the three-dimensional virtual space as the object by using the content preparation software tool 4 is provided by for example a basic node of VRML 2.0 or library window.

It is also possible for the content preparation software tool 4 to read the graphic data of an object prepared by other modeling software by converting this to a file format compatible with VRML 2.0.

When the user activates the content preparation software tool 4, the graphical user interface (GUI) 40 displays the GUI menu screen shown in FIG. 9 on the display device 24. When the user selects the item of "File/New" in "Conductor" window by using the mouse 262 etc., the model editing tool 420 of the content preparation software tool 4 newly prepares an empty world.

The user performs the work for placing the conical object (cone) in the prepared empty world. When the user selects "Cone" from the "Geometry" tab of the "Conductor" window and clicks on the window for the graphic data preparation (hereinafter described as the "3D View" window), the model editing tool 420 of the editing tool 42 prepares the graphic data of the object (cone) and displays the conical shape (cone) shown in FIG. 28 in the "3D View" window. Note that, at this time, it is also possible for the user to use the attention function of the content preparation software tool 4 to display the image visible when moving the periphery of the object (cone) in the three-dimensional virtual space in the "3D View" window and confirm the shape of the object (cone).

S402: Addition of Sensor [Arrangement of Sensor Node (TouchSensor)]

In order to add motion to the object in the three-dimensional virtual space or make this react with the operation of the user, it is necessary to add a sensor to the object, detect a constant condition for the operation of the user with respect to the object, and transmit the change thereof as the event to the other nodes.

Below, this will be explained by taking as an example the addition of the touch sensor (TouchSensor) for detecting a pointing operation by the mouse 262 with respect to the object.

The sensor is added to the object by placing the object in the selection state and then generating the sensor (TouchSensor).

(1) First, when the user clicks on the object (cone) in the "3D View" window, the model editing tool 420 selects the clicked object and makes the bounding box surrounding the selected object blink.

(2) Further, when the user clicks on the "Sensor" tab of the "Conductor" window, selects the touch sensor (TouchSensor) located at the rightmost side of the "Sensor" tab, and clicks on the "3D View" window, the model editing tool 420 adds the touch sensor to the object and adds the data thereof to the graphic data of the object. Note that, at this stage, as mentioned above, it is also possible for the user to use the keyboard 260 or the mouse 262 to modify the range of the valid region of the sensor (TouchSensor).

Figure 30:
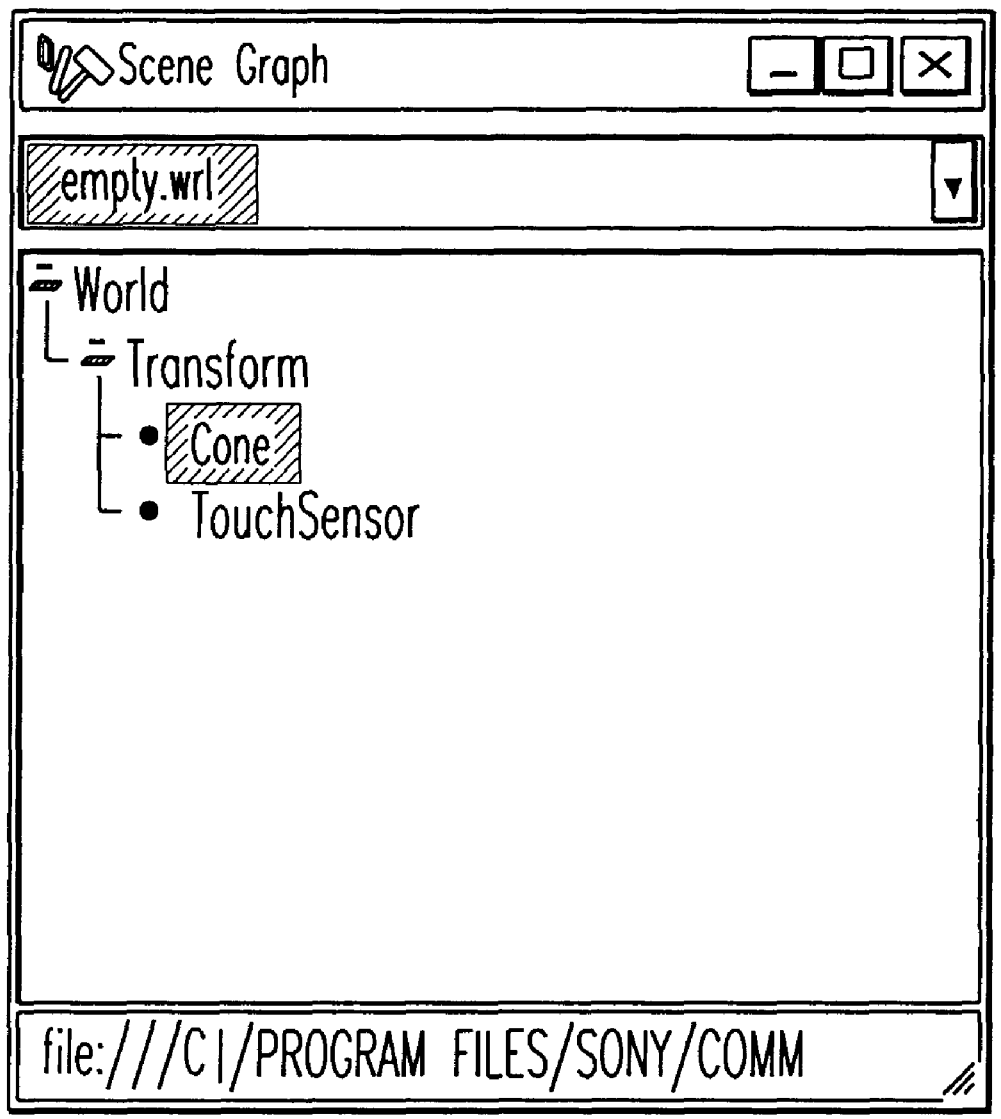
FIG. 30 to FIG. 34 show examples of the display in a window when preparing first VRML content.

FIG. 30 is a view of the "Scene Graph" window in the menu screen.

The scene graph editing tool 424 modifies the content of the display of the "Scene Graph" window in the menu screen as shown in FIG. 30 in accordance with the addition of the touch sensor to the object. The user can confirm that the touch sensor (TouchSensor) was added to the object, in this example a cone, by referring to the "Scene Graph" window shown in FIG. 30.

This example shows a case of adding a sensor (TouchSensor) to a simple object such as a cone, but it is also possible to add a sensor (TouchSensor) to a more complex object than a cone by a similar operation of the user.

S403: Addition of Common Node (PointLight)

In VRML 2.0, the operation is described by the flow of transmitting the event detected by the sensor (sensor node) to another node and having the node receiving the event modify its state.

Below, this will be explained by taking as an example a case when a common node (PointLight) for making the light blink is added as the node receiving the event.

The common node (PointLight) lies in the "Common" tab of the "Conductor" window. However, when producing a light at the same position as the object while maintaining the illustrated display as it is, it becomes invisible, therefore it is necessary to move the viewpoint in advance.

Figure 31:
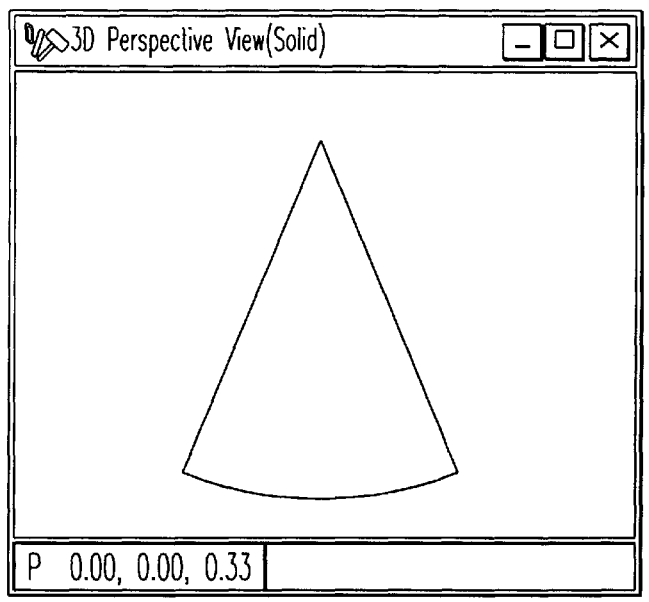

When the user makes the "3D View" window active and for example depresses a down arrow key ↓ of the keyboard 260, the model editing tool 420 displays the object seen from a position slightly away from the viewpoint in the "3D View" window. When selecting the common node (PointLight) in this state, the model editing tool 420 displays the object (cone) brightly as shown in FIG. 31.

S404: Naming of Node to be Routed

Next, the user carries out routing between nodes, for example, establishes correspondence from the sensor (TouchSensor) to the common node (PointLight).

The "routing" means the connection of the two for transmitting the event among nodes, for example, from the sensor to the script.

In order to perform this routing, it is necessary to first add a name (DEF name) to the sensor.

Figure 32:
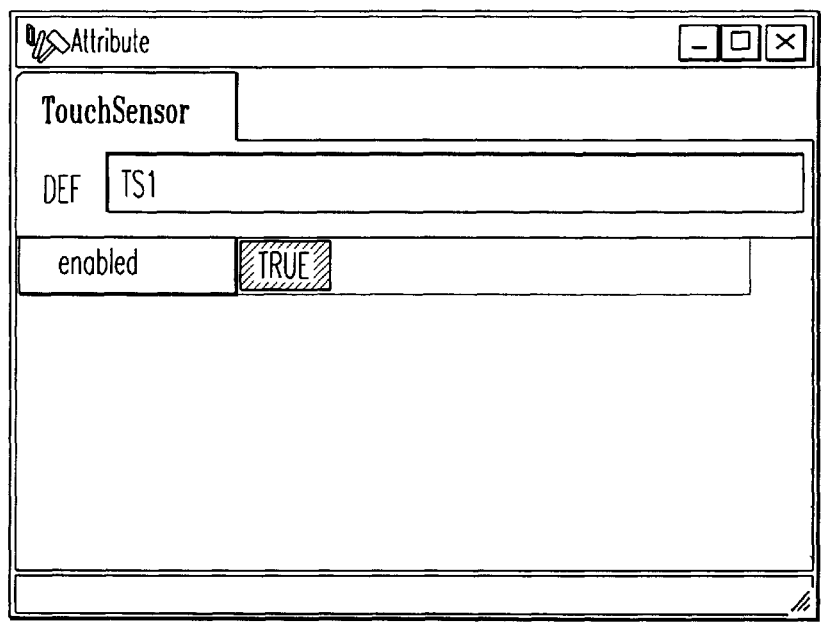
Figure 33:
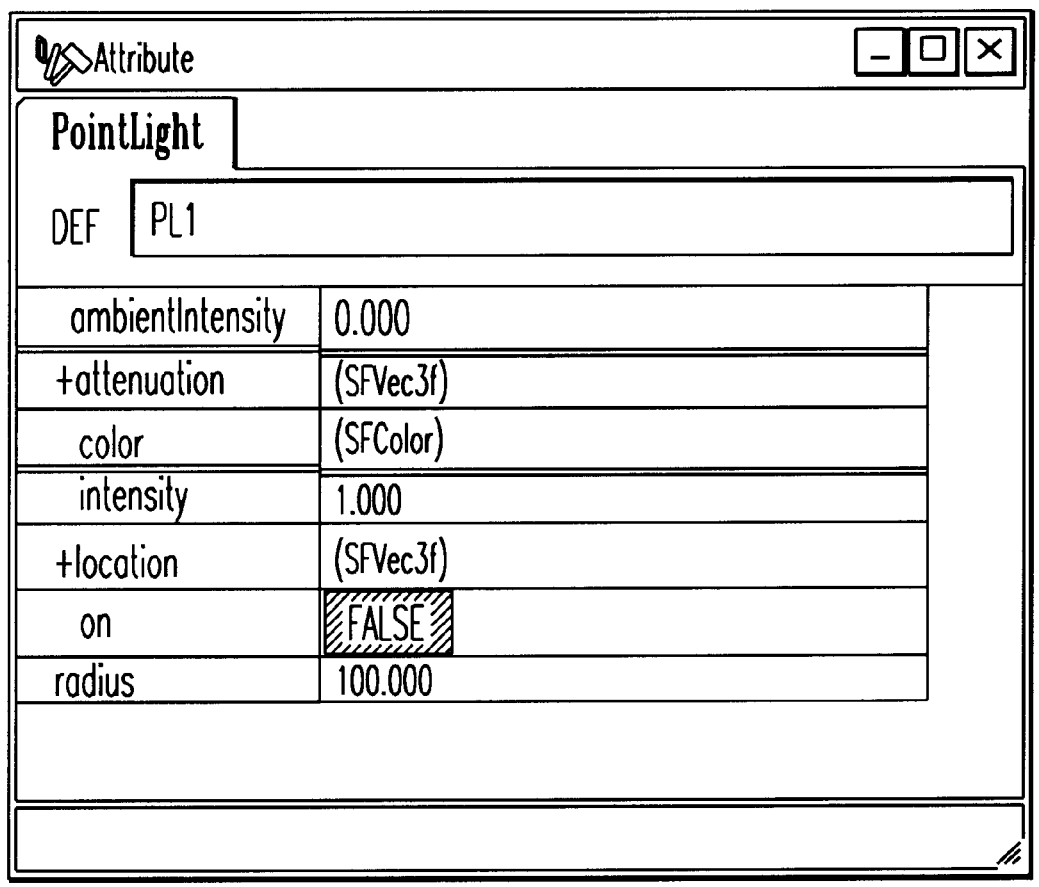

FIG. 32 and FIG. 33 are views of the work of naming the sensor node by the "Attribute" window.

The "Attribute" window is a window for modifying an attribute of the selected object. The name (DEF name) is added to the node by an operation with respect to the "Attribute" window. Here, this will be explained by taking as an example a case where the user selects the sensor (TouchSensor) from the "Scene Graph" window and adds the DEF name (TS1, PL1) in the "Attribute" window.

As shown in FIG. 32, when the user designates the position of the "DEF name" in the "Attribute" window, types "TS1" from the keyboard 260, and pushes the return key and, further, as shown in FIG. 33, selects the common node (PointLight) from the "Scene Graph" window, types "PL1", and pushes the return key, the scene graph editing tool 424 adds the DEF names "TS1" and "PL1" to the sensor (TouchSensor) and the common node (PointLight), respectively.

Further, when the user double clicks for example the "On" field of the common node (PointLight) of the "Attribute" window, the text editor 426 turns off the initial state of the light and adds the same to the graphic data of the object.

S405: Setting of Route

Figure 34:
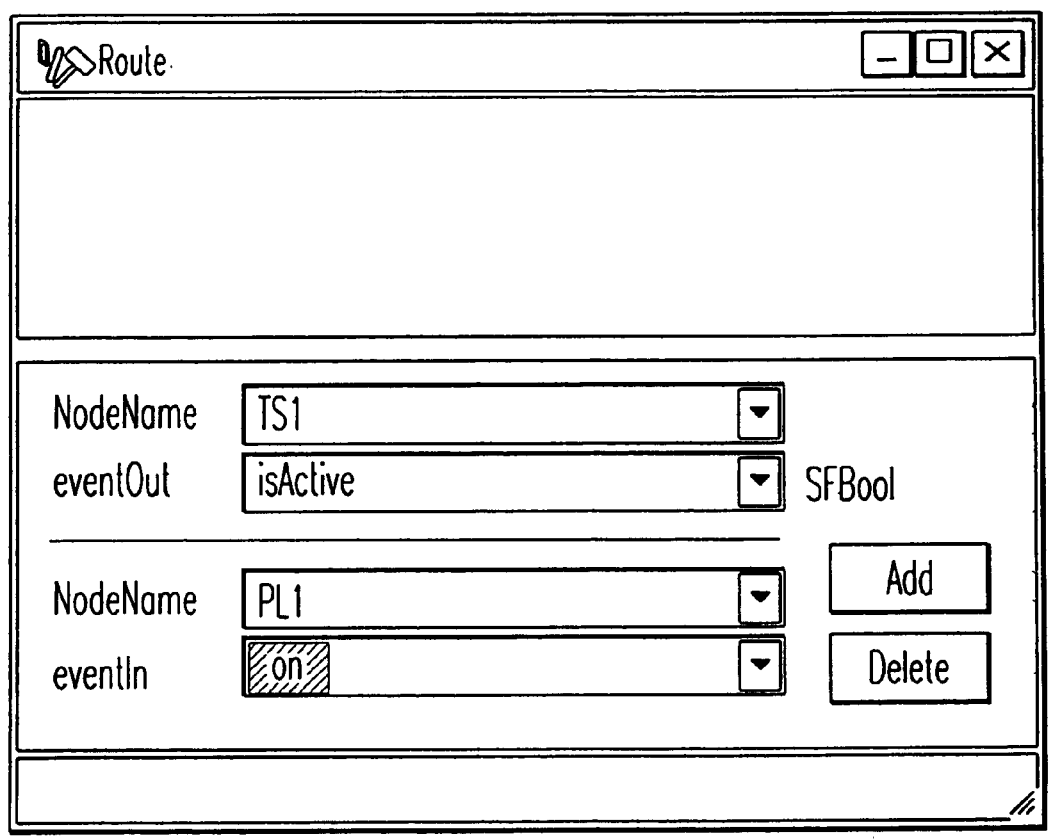

FIG. 34 is a view of an example of the "Route" window used for setting the routing between nodes.

The user performs sets the routing so as to transmit the event generated in the sensor (TouchSensor; TS1) to the common node (PointLight; PL1). The content preparation software tool 4 sets the routing by the "Route" window shown in FIG. 34.

In the "Route" window illustrated in FIG. 34, the upper "NodeName" position is used for setting the node name on the output side, while the lower "NodeName" position is used for setting the node name on the input side. Since the event is to click on the sensor (TouchSensor) and then turn the light on/off, when the user sets TS1 in "NodeName" on the output side and selects "isActive" for "eventOut", the format "SFBool" is displayed on the right side. Note that the display of "SFBool" on the right side indicates that the format of the event transferred in "isActive" is SFBool.

The user sets PL1 in "NodeName" and sets "on" in "eventIn" as the setting on the input side.

In accordance with the setting by the user, the routing editing tool 422 modifies the display of the "Route" window of the display device 24 as shown in FIG. 34.

When the above setting is ended and the user depresses the "Add" button, the routing editing tool 422 establishes correspondence between the sensor (TouchSensor) and common node (PointLight) for the routing and adds the route among nodes.

S406: Confirmation of Operation

When the user depresses the "Play" button displayed on the display device 24, this is input to the graphical user interface (GUI) 40 of the content preparation software tool 4 and the operation of the VRML browser 308 is emulated by the browser emulator 460 of the content preparation software tool 4. Therefore, it is possible to confirm the VRML content at any time during the work for preparation of the VRML content without activating the VRML browser 308.

Further, when the user depresses the "Play" button displayed on the display device 24, the normal content preparation work is returned to.

Below, the work for confirmation of the content will be explained.

When depressing the "Play" button (button with right facing triangle mark) located at the bottom left of the "Conductor" window by the mouse 262, the content preparation software tool 4 emulates the operation of the browser by the browser emulator 460 from the operation for preparation of the content (preparation mode) and then shifts to the operation for confirming the prepared content (simulation mode).

When shifting to the simulation mode, the backup manager 466 stores the states of the nodes of the VRML content at this point of time and the viewpoint of the user. The browser emulator 460 then executes the VRML content and displays the same on the display device 24. When the user depresses the object (cone) displayed in the "3D View" window by the mouse 262 while the browser emulator 460 executes and displays the VRML content, the object is displayed bright (Light ON) when depressed and the object is displayed dark (Light OFF) when not depressed.

In this way, in the simulation mode, when the user clicks on the object (cone) by the mouse 262, the sensor (TouchSensor) attached to the object detects the click and the event is generated. The generated event is transmitted to the common node (PointLight) by the setting of the routing, the common node (PointLight) changes the state, the object is turned ON, the event is generated by the similar flow even at the end of the click, and the common node (PointLight) turns off the light of the object.

Further, when the user depresses the "Stop" button (button with square mark) of the "Conductor" window by the mouse 262, the content preparation software tool 4 returns to the usual content preparation mode.

When returning to the VRML content preparation mode, the backup manager 466 returns the state of the content to the stored initial state at the point of time when it enters into the simulation mode and further returns the viewpoint of the user to the position at the point of time when it enters into the simulation mode. The model editing tool 420 displays the graphic data of the initial state in the "3D View" window.

Storage of Prepared VRML Content

When storing the file, when the user designates the file name by the "File/Save As" menu of the menu screen, the file input/output unit 462 records the file of the VRML content stored in the scene graph data base 44 in an external recording medium 28 via the hard disk drive 214 or the floppy disk drive 216 and the MO disk drive device 218. It is also possible for the user to open and view the file of the recorded content by the browser 308.

As explained above, it will be understood that, when preparing and confirming simple content for displaying the conical object bright or displaying it dark in accordance with a click by the mouse 262, it is possible to add the graphic data of the object, add a sensor, and add the routing by an interactive operation by the graphical user interface 40 without programming by input of a complex character train command.

Preparation of Complex Content

Below, an explanation will be made of the case of preparing VRML content (second content) changing the color of the object when the mouse cursor comes over the object as a second specific example of preparation of content of three-dimensional virtual space (VRML content) using the content preparation software tool 4.

The above VRML content was comprised to transmit an event generated by a sensor (TouchSensor) attached to the object to another node [common node (PointLight)], but in VRML 2.0, script is interposed between the sensor and the other node and further complex motion can be realized.

For example, in order to realize the second content by VRML 2.0, the color of the object (cone) is designated by the material attribute. This material attribute includes a plurality of fields. By setting diffuse color as the material attribute, the color of the object can be changed. In such a case, it is necessary to set the material attribute "diffuse color" in accordance with the generation of the event. In such a case, diffusecolor can be set by interposing the script.

Figure 35:
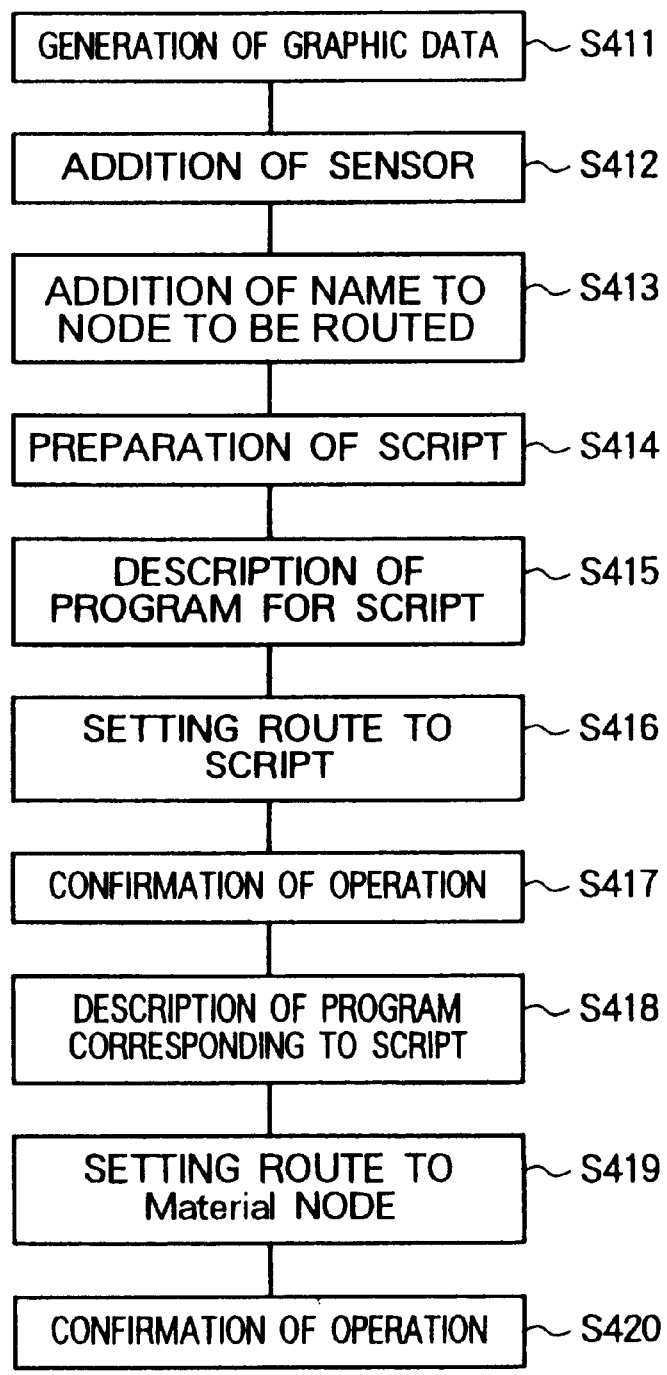
FIG. 35 is a flow chart of the processing for preparing second VRML content.

The work of preparing the second content becomes the routine illustrated in FIG. 35. That is, S411: Preparing the graphic data [arranging the geometry node (cone)]

S412: Adding a sensor [arranging a sensor node (TouchSensor)]

S413: Naming the node to be routed

S414: Preparing the script

S415: Describing a program corresponding to the script (only debug code)

S416: Setting a route to the script

S417: Confirming the operation

S418: Describing a program corresponding to the script (setting the color)

S419: Setting the route to the material node

S420: Confirming the operation

Note that, the operation of steps 411 and 412 is the same as the operation of steps 201 and 202 described with reference to FIG. 29, so the explanation will be omitted.

Below, the work of the preparation of the second content will be explained.

S413: Naming Node to be Routed

In VRML 2.0, in order to perform the routing, it is first necessary to add names. In the preparation of the first content, as mentioned above, names (TS1 and PL1) were added to the sensor (TouchSensor) and common node (PointLight). In the preparation of the second content, it is necessary to further name the material attribute.

Figure 36:
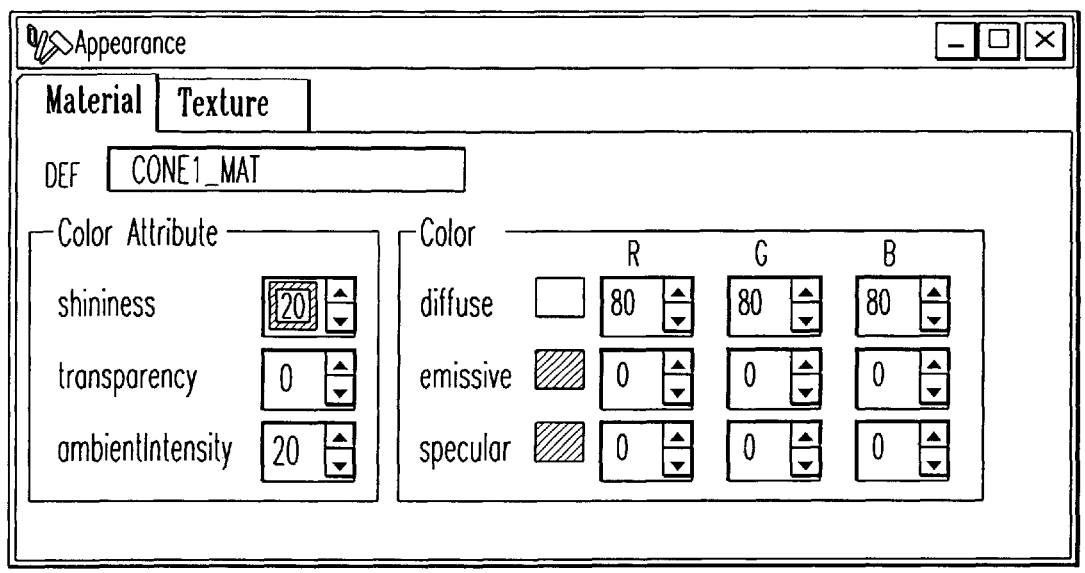
FIG. 36 and FIG. 37 show examples of the display in a window when preparing second VRML content.

FIG. 36 is a view of the "Appearance" window in the menu screen.

In VRML 2.0, the material attribute is contained in the appearance node for setting an attribute such as the color added to the object and the bit map data. In the content preparation software tool 4, the "Appearance" window of the menu screen is used for the editing of the appearance (including material, texture, etc.) of the graphic data of the object selected in the "3D View" window.

When giving a name to the material attribute of the object, the user first clicks on and selects the object by the mouse 262, selects the "Material" tab of the "Appearance" window shown in FIG. 36, and gives a name, for example, "CONE1_MAT".

S414: Preparation of Script Node

In VRML 2.0, there is a node for interfacing with the script program referred to as a script node. This script node is contained in the VRML file and enables the description of a complex operation by using a script described by for example the Java language. However, the script node has an interface function, has a close relationship with the opposing script for the interfacing and further enables definition of a plurality of inputs/outputs. Therefore, it becomes difficult for the user to understand this.

For this reason, in the content preparation software tool 4, there is a function referred to as a "Script Expert" for simplifying the description of the script.

According to the "Script Expert" function, by defining the input/output of the script, the template of the script program can be automatically generated and further also the input/output field can be edited by using the "Attribute" window.

Figure 37:
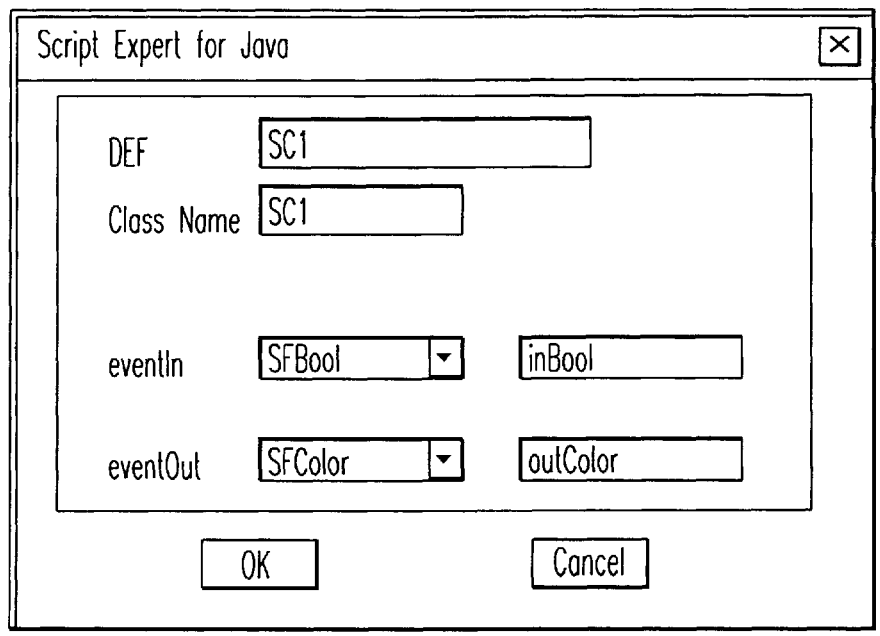
Figure 38A:
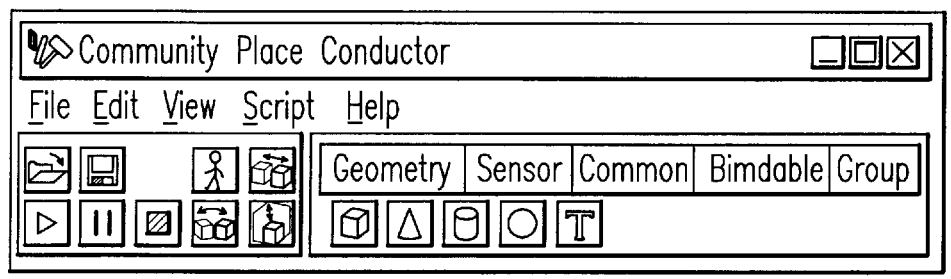
Figure 38B:
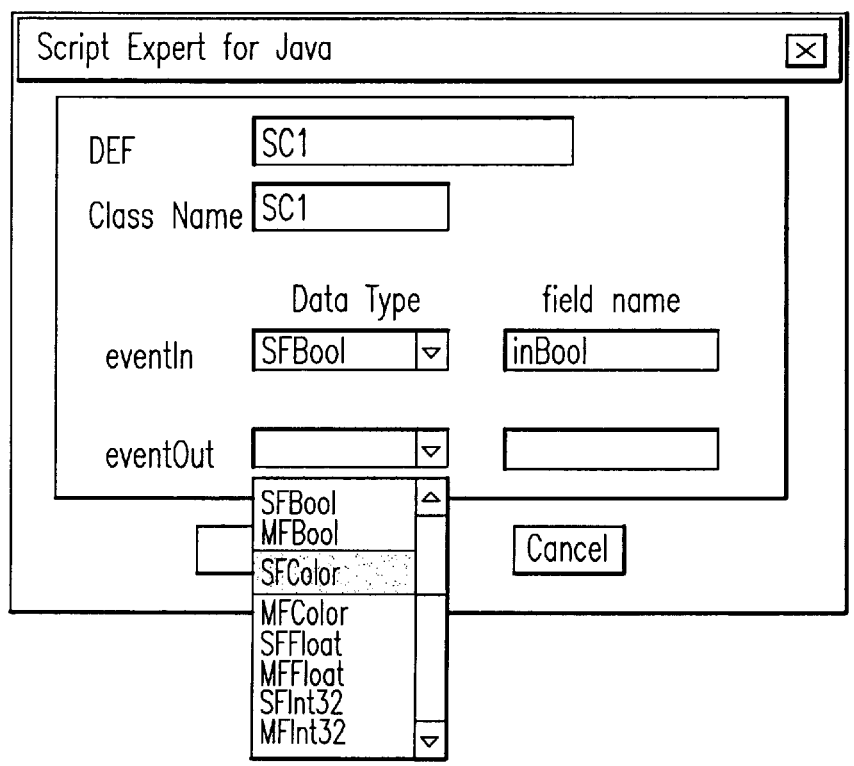

FIG. 37 and FIG. 38 are views of an example of the interactive operation for preparing the script. FIG. 38 shows the interactive operation at the time of pop-up.

When the user selects "Script/Expert" by the mouse 262 in the menu screen of the content preparation software tool 4, the template preparation tool 428 opens the interactive operation for preparing the script shown in FIG. 37 and FIG. 38.

In this interactive operation, "DEF" of the uppermost position is used for naming the script node used for the routing to the VRML file of the script. The user inputs for example "SC1" to this position as the name of the script node.

"ClassName" of the position under "DEF" of the interactive operation is used for attaching a class name to the script of the Java language. The user attaches for example the temporary name "SC1" to the script.

Further, the user defines the input/output of the script node at the further lower position in the interactive operation. In the preparation of the second content, the event generated by the sensor (TouchSensor) is input to the script, therefore the user changes "DataType" on the "eventIn" side from the sensor (TouchSensor) to "SFBool" compatible with the format when transferring the event from the sensor (TouchSensor) and changes "field name" to "inBool".

The output of the sensor is transferred to the script for controlling the color of the material, therefore the user changes "DataType" on the "eventOut" side to "SFColor" and changes "field name" to "outColor".

The substance of the display of the interactive operation at the point of time when the user ends the set-up necessary for the preparation of the script node is as shown in FIG. 37.

Further, when the user depresses the "OK" button at the bottom portion in the interactive operation shown in FIG. 37 by the mouse 262, the template preparation tool 428 prepares the script node and prepares the template of the script corresponding to the script node.

S415: Description of Debug Code

The content preparation software tool 4 further has a function of supporting and executing the description of the script by the Java language. That is, the template preparation tool 428 prepares the template of the program corresponding to the script node, outputs the same to the text editor 426, and supports the description of the script by the user. When using the content preparation software tool 4, the user can prepare the script by just editing and making modifications to the template prepared by the template preparation tool 428 by using the text editor 426, therefore the trouble required for the preparation of source program of the script may be made very small.

Further, the user can use the Java compiler 474 to compile the script program prepared by the template preparation tool 428 and the text editor 426. Accordingly, the trouble of stopping the content preparation software tool 4 and activating the compiler for the Java language whenever the source program of the script is prepared becomes unnecessary.

By the work up to this point of time, the newly defined template of the script is prepared and the editing of the script becomes possible. However, the template prepared by the template preparation tool 428 is only defined by the basic part of the input/output at this point of time and does not contain a program for actually realizing the event. Further, it is also possible for the user to edit the template by using the text editor 426 by the script description support and execution function to immediately prepare the script for modifying the color of the object, but it is desirable to confirm whether or not the prepared template actually operates by the debug code before this.

FIG. 39 is a view of the screen of the editor displayed by the text editor 426.

In accordance with the operation of the user, the text editor 426 displays the template prepared by the template preparation tool 428 in the window for text editing of the display device 24 shown in FIG. 39.

As shown in FIG. 39, the field name on the output side defined in the work heretofore is defined as the private variable (part of private SFColor m_outColor). In the initialize( ) method, the code for initializing this variable is embedded. A method such as _inBoolCB( ) is called up when there is an input event. A program operated by the input from the sensor (TouchSensor) is described in this method [_inBoolCB( )].

For example, when the code for viewing the value of the input from the sensor is added to the template, the following debug code is added to the _inBoolCB( ) method.

Table 1

System.out.println("_inBoolCB( ) called: "+ev.getValue( ));

When this debug code is added and the user clicks on the right button and selects "Compile" from the pop-up menu, the Java compiler 474 is activated, the templates (source programs of scripts) to which the debug code was added are compiled, and the message in the compilation is displayed at the lower part of the editor.

Note that, when the user depresses the "Play" button for confirmation of operation, the Java compiler 474 automatically compiles the source programs of the prepared script to prepare the object program, and the browser emulator 460 executes the automatically prepared object program. Note, in this case, if an error is generated during the compilation, the browser emulator 460 does not execute the VRML content.

When the compilation normally ends, the Java compiler 474 displays the word "Finished" on the screen of the editor. When the compilation abnormally ends, a compilation error is displayed. When a compilation error is displayed, the user uses the text editor 426 to confirm again whether or not there is a typing error and amend the program (template), then executes the compilation again, whereby the error can be eliminated.

At the time of the debugging by the Java debugger 472, the data indicated by the debug code is displayed in the "Route" window, therefore, in this case, the user can understand the value of the data input from the sensor at the time of execution of the script.

Figure 40:
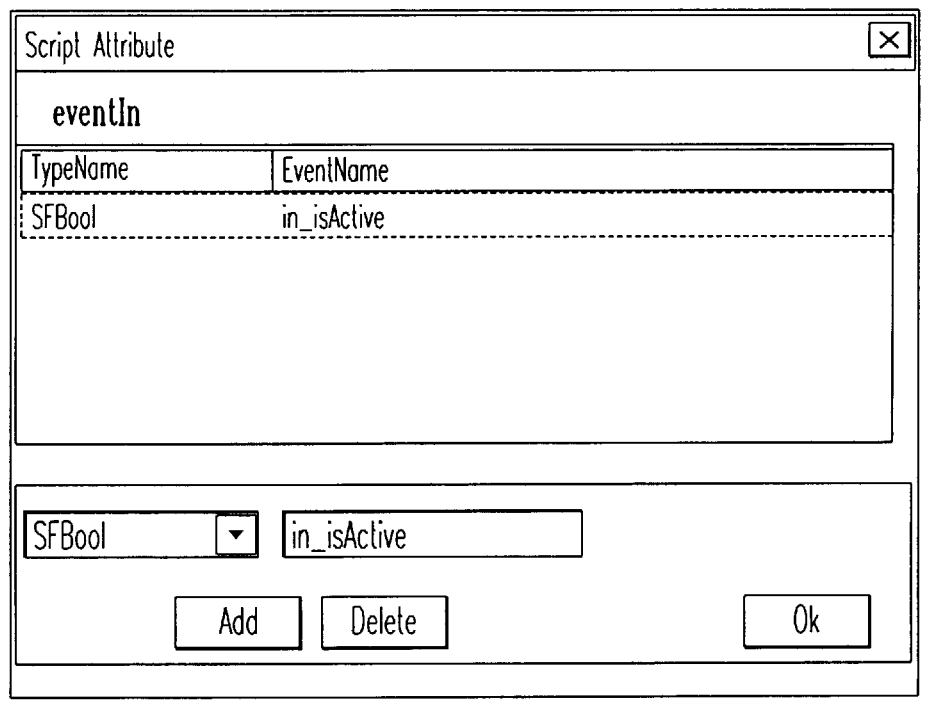

FIG. 40 is a view of an example of the script "Attribute" window able to be used for the editing of the "eventIn" and "eventOut" of the script node. Note that, for the editing of "eventIn" and "eventOut of the script node, the "Script Attribute" window shown in FIG. 40 is used.

When "eventIn" or "eventOut of the "Attribute" window of the menu screen is depressed in a state where the user selects the script node, the "Script Attribute" window shown in FIG. 40 opens.

When the "format" and "name" are set in the input field of the "Script Attribute" window and the "Add" button is depressed by the mouse 262, the text editor 426 adds a field to the script and further modifies the script node in the scene graph data base 44.

Further, when the user displays the input/output attribute of the script in a table in the "Script Attribute" window, designates a field, and depresses the "Delete" button by the mouse 262, the text editor 426 erases the description of the field from the script.

Further, when modifying the "format" and "name" of the field of the script, the field of the script is erased once, then they are newly added.

When the script node is modified by the above operation, the text editor 426 automatically modifies the source program of the script so as to be compatible with the state after modification.

A concrete example of the automatic modification of a source program will be given next.

For example, when the user displays the "eventOut" side in the "Script Attribute" window shown in FIG. 40, designates the "TypeName" side as "SFBool", designates the "EventName" side as "outColor", and depresses the "Delete" button, the text editor 426 automatically erases the 10th row of the script shown in FIG. 39 (private SFColor m_outColor;) to reflect the modification.

S416: Setting of Route to Script Node

Figure 41:
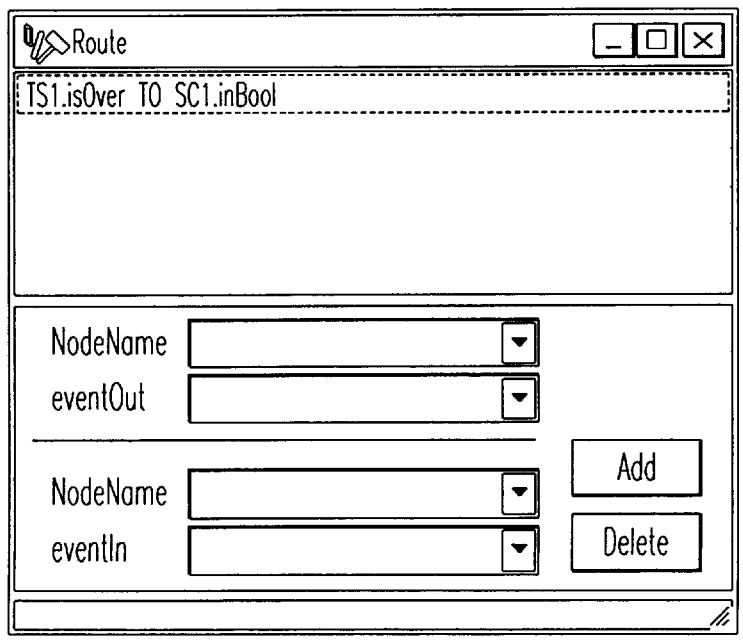

FIG. 41 is a view of an example of the content of the "Route" window.

As mentioned above, in order to make the script operate, routing is necessary. In the second script, in the "Route" window shown in FIG. 41, the event generated by the sensor (TouchSensor) is routed to the script node, and the color of the object (cone) is modified.

Figure 42:
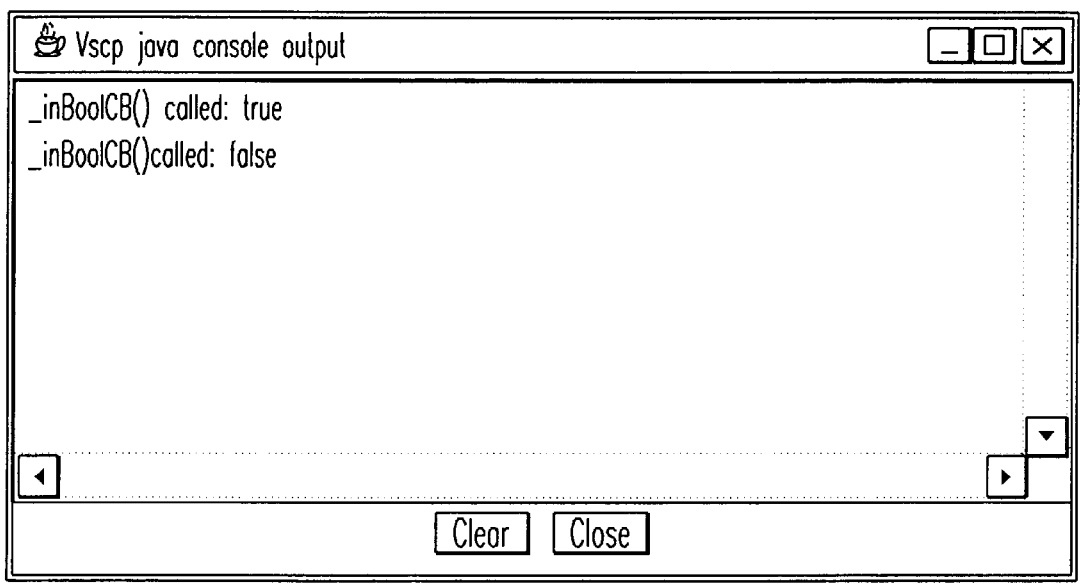

FIG. 42 is a view of the substance of the "Java Console" window displayed by the browser emulator 460.

Figure 43:
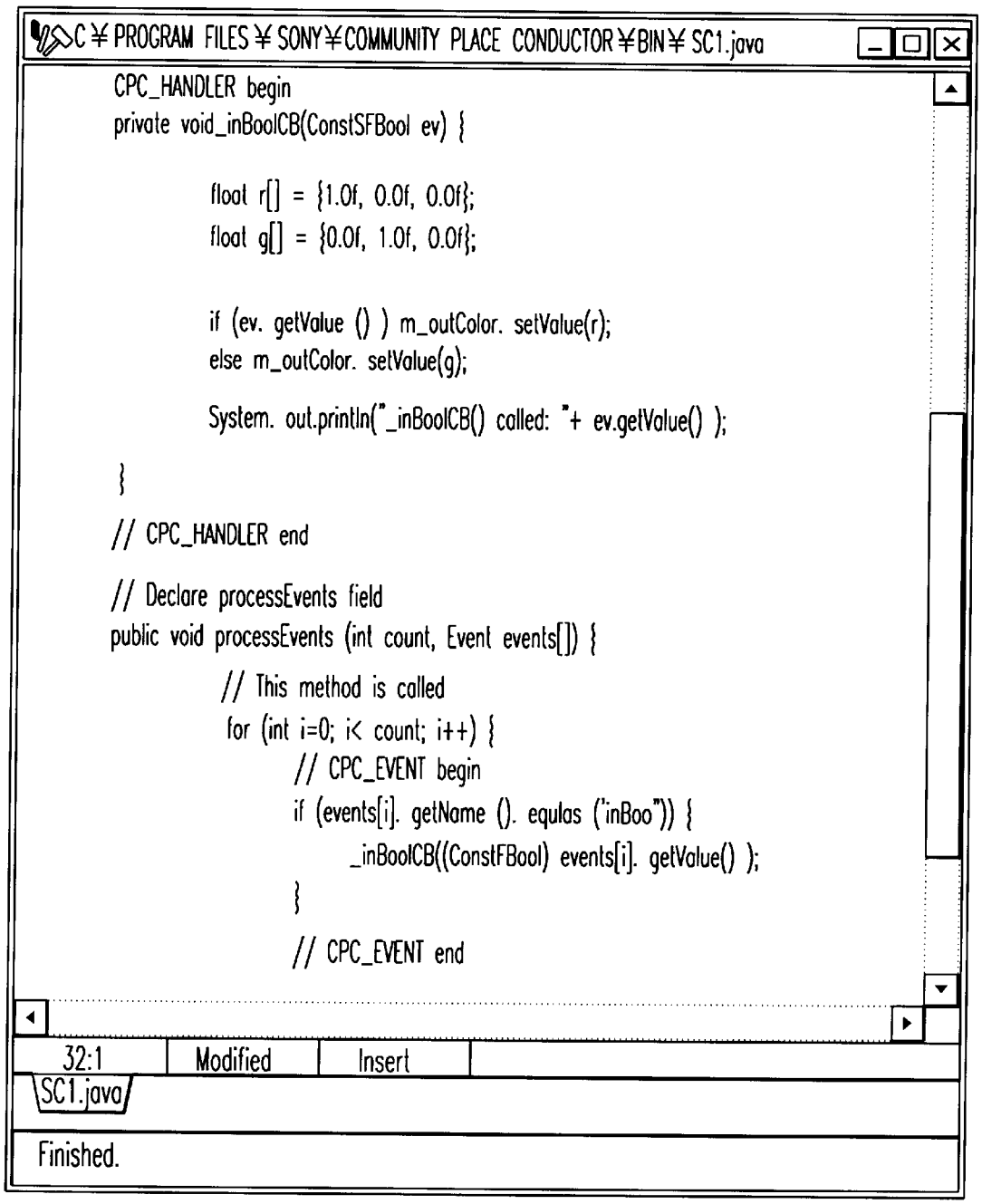

When the cursor of the mouse 262 passes through the object (cone), if the routing is performed making the event generated by the sensor (TouchSensor) "isOver" and the field of the script node receiving the event "inBool" designated by using the "Script Expert" function, the Java debugger 472 displays for example a message of the content shown in FIG. 43 in the "Java Console" window.

S417: Confirmation of Operation

In the work of describing the debug code of step 415 (S415), the debug code is added to the script, therefore when the message shown in FIG. 43 is displayed in the "Java Console" window, the user can confirm whether or not the script operates without error. Further, in order to confirm the operation of the second content, the user may depress the "Play" button of the display device 24 in the same way as at the time of confirmation of operation of the first content.

Further, when there is a necessity for displaying the value of the output of the script, when the user selects the "View/Java Console" menu of the menu screen, the browser emulator 460 displays the "Java Console" window shown in FIG. 43.

Further, when the user depresses the "Play" button of the menu of the display device 24, the browser emulator 460 emulates the operation of the VRML browser 308 and displays the object (image) of the three-dimensional virtual space indicated by the VRML content in the "3D View" window. Further, when the user moves the cursor in the "3D View" window to the object by the mouse 262, as shown in FIG. 41, the Java debugger 472 displays the message "true" in the "Java Console" window, while when the user moves the cursor away from the object, the message "false" is displayed.

The substance of the display of the "Java Console" window shown in FIG. 43 shows that, when the cursor of the mouse 262 comes to the object, the sensor (TouchSensor) attached to the object detects this state and generates an event, this is transmitted to the script node, and the script node receives the event. The display in the "Java Console" window is carried out by the execution of system.out.printin( ) in the method.

Note that, even in a case when the cursor of the mouse 262 is moved away from the object, the event is similarly transmitted and the result of the operation is displayed in the "Java Console" window.

When the user debugs the script, as mentioned above, it can be confirmed whether or not the event is being normally transmitted to the script by adding the debug code to the script.

S418: Description of Program Corresponding to Script

Figure 44:
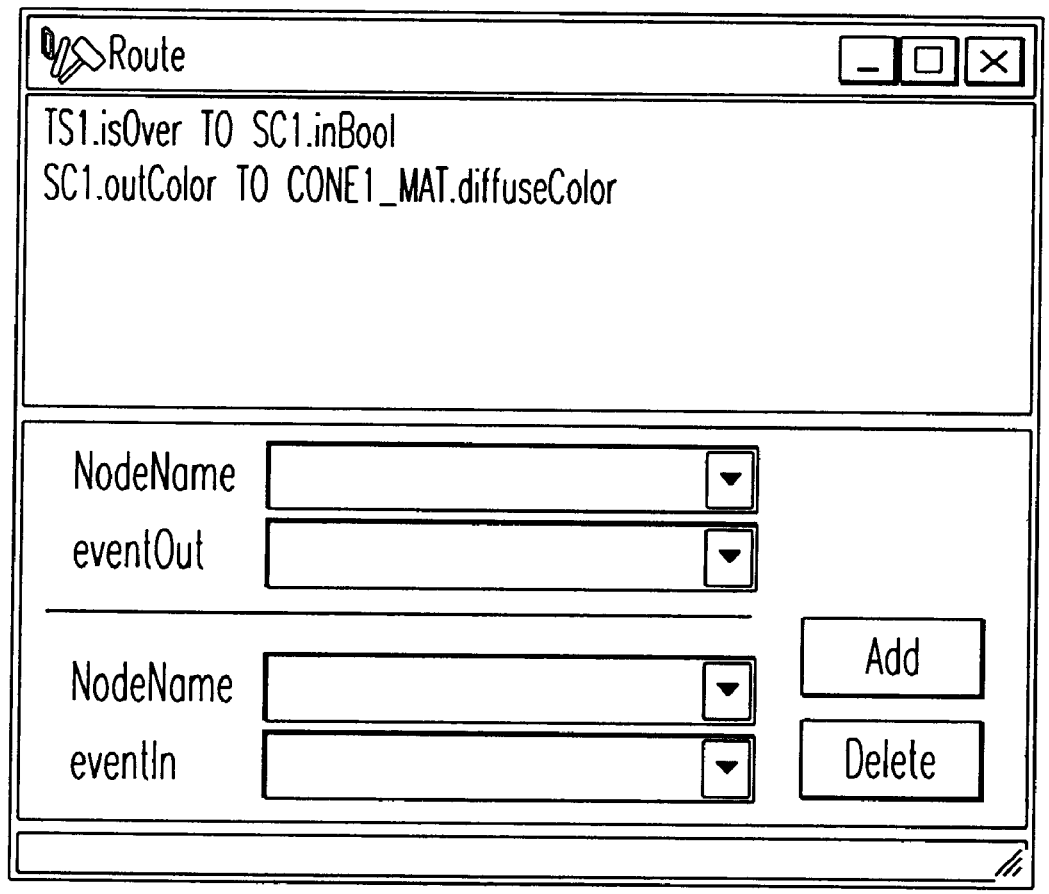

FIG. 44 is a view of an example of the script obtained by adding codes for changing the color of the object (cone).

The color of the object is modified by writing a value in the field of the output side of the script shown in FIG. 44 (variable name "m_outColor") and routing to the material attribute. In order to add codes for changing the color of the object to the script, the following codes are added to the method [_inBoolCB( )].

Table 2 float r[ ]=(1.0f, 0.0f, 0.0f);
float g[ ]=(0.0f, 1.0f, 0.0f);
if (ev.getValue( )) m_outColor.setValue (r);
else m_outColor.setValue(g);

By the addition of these codes, in the emulation operation by the browser emulator 460, when the cursor of the mouse 262 enters the object, ev.getValue( ) of the code becomes "true" and red is output from the script (SC1), while when the cursor leaves it, ev.getValue( ) of the code becomes "false" and green is output from the script.

S419: Setting of Route to Material Node

In order to actually change the color of the object (cone), it is necessary to perform routing from the script node to the material attribute.

FIG. 36 is a view of the substance of the display of the case when "outColor" of the script program (SC1) is routed to "diffuseColor" of the material attribute (CONE1_MAT) in the "Route" window.

When the user routes "outColor" of the script node (SC1) to "diffuseColor" of CONE1_MAT in the "Route" window, the flow of the event of the propagation of the event from the sensor (TouchSensor) to the script (SC1) corresponds with the routing set heretofore and further the propagation of the event from the script node to the material attribute (CONE1_MAT) is completed.

When the above work is ended, if the user depresses the "Play" button of the "Conductor" window and moves the cursor of the mouse 262 onto the object (cone), the color of the object becomes red, while when it moves the cursor away from the object, the color of the object becomes green.

In the same way as when confirming the operation of the first content, the backup manager 466 holds the initial state of the content and the viewpoint of the user at the start of the confirmation of the operation. When the user depresses the "Stop" button and the operation of the browser emulator 460 is ended, the model editing tool 420 restores and displays the content of the initial state held in the backup manager 466 in the "3D View" window in a state when it is seen from the viewpoint of the user at the start of the confirmation of the operation.

For example, when the substance of the display of the initial state of the VRML content at the start of the confirmation of the operation is as shown in FIG. 28 and the substance of the display of the content at the end of the confirmation of operation is as shown in FIG. 31, the model editing tool 420 returns the display of the object (cone) in the "3D View" window to the content shown in FIG. 28 based on the initial state held by the backup manager 466.

The operation of the content in the confirmation of operation explained here is as follows.

When the cursor moves to the object, the sensor (TouchSensor) attached to the object detects this and the event is generated. The generated event is transmitted to the script node by the setting of the routing, and the script node executes the method. During the method, when receiving the input event (true), red is set in the output field, the color written in the output field is set for the material attribute of the object (cone) by the routing, and the color of the object (cone) in the three-dimensional virtual space becomes red. Similarly, when the cursor is moved away from the object (cone), the event (false) is transmitted from the sensor (TouchSensor) to the script node, and the method sets green in the field of output and changes the object (cone) to the green color.

Clicking of Object (Cone) to Make Sound

An explanation will now be made of the case of preparing a VRML content (third content) of producing a sound when clicking on the object (cone) by the mouse 262 as a third specific example of preparation of the content of three-dimensional virtual space (VRML content) using the content preparation software tool 4.

Below, an explanation will be made of the work for preparation of the third content.

In VRML 2.0, it is possible to use a sound node to output a sound. The content preparation software tool 4 has the function of dragging and dropping a sound node from the sound library to add the sound node to the world.

Figure 45:
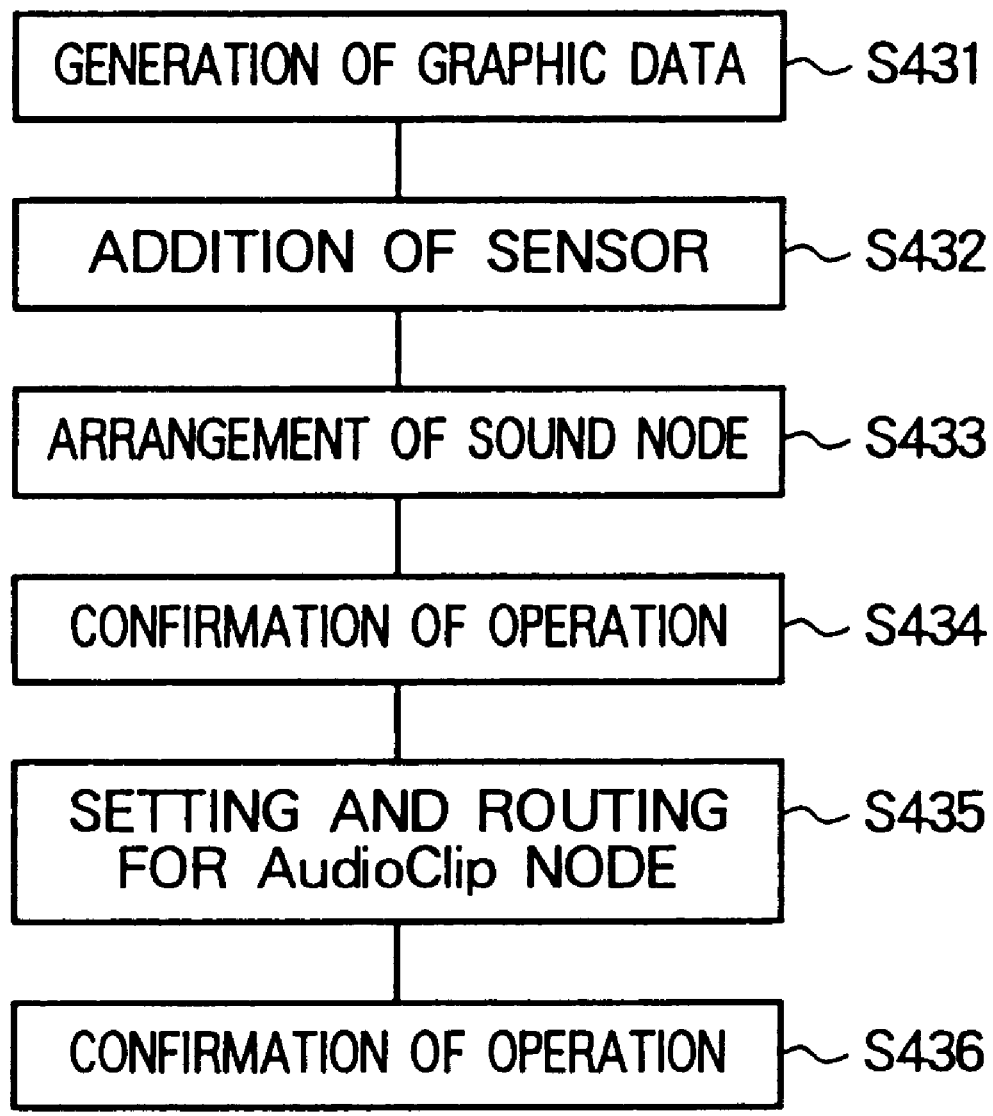
FIG. 45 is a flow chart of the processing for preparing third VRML content.

The work for preparing the third content is carried out by the following process illustrated in FIG. 45:

S431: Preparing the graphic data of the object (cone) [arranging the geometry node (cone)]

S432: Adding a sensor [arranging a sensor node (TouchSensor)]

S433: Arranging a sound node

S434: Confirming the operation

S435: Setting and routing the AudioClip node

S436: Confirming the operation

The operation of step 431 and step 432 is the same as with preparation of the first content and preparation of the second content, so the explanation will be omitted. Here, a name "TS1" is attached to the sensor (TouchSensor). Next, the operation of the default of the sound node is confirmed, the modification of the attribute and routing are carried out, and the sound is confirmed by clicking on the object.

S433: Arrangement of Sound Node

Figure 46:
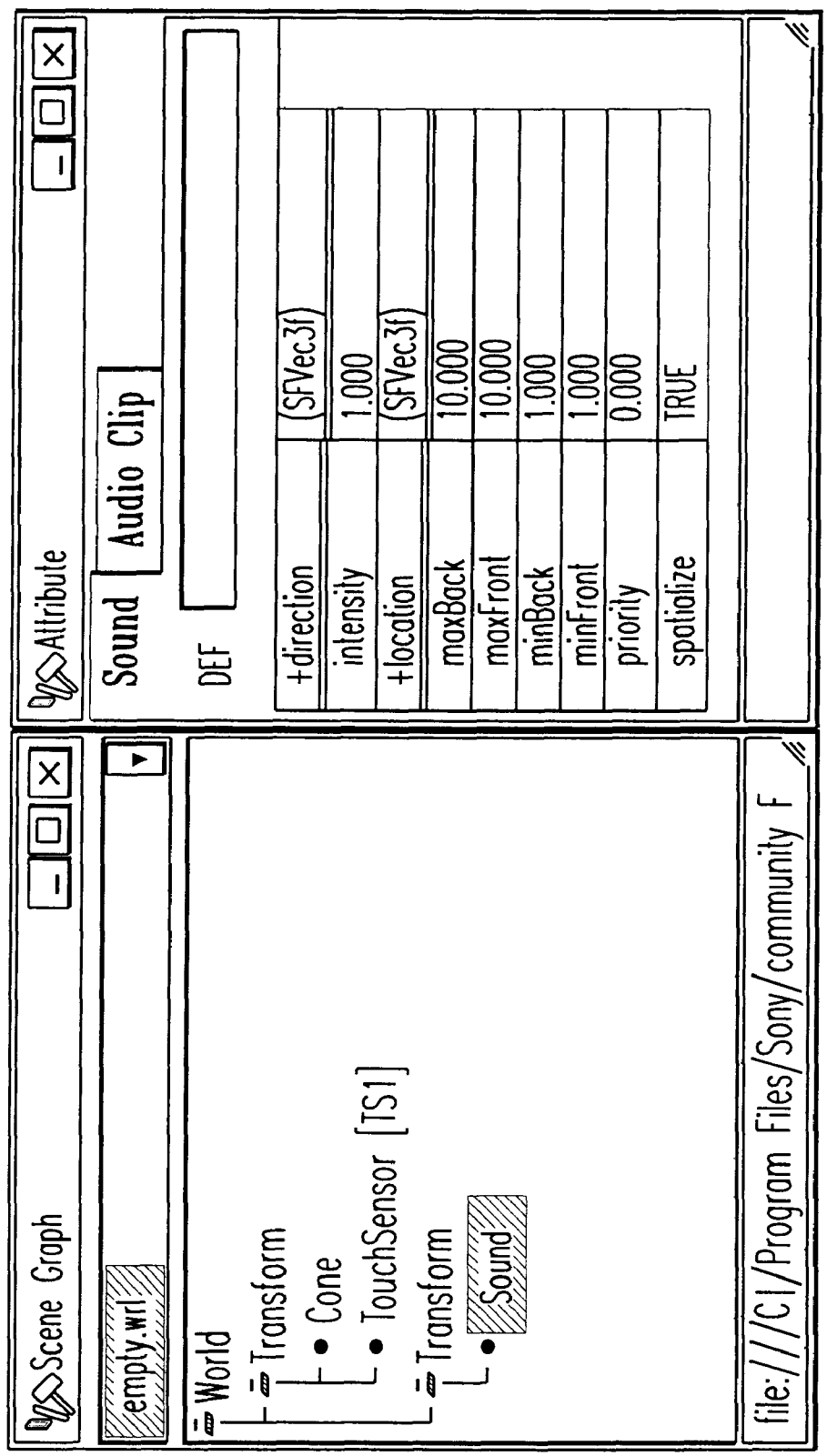
FIG. 46 to FIG. 49 show examples of the display in a window when preparing third VRML content.

FIG. 46 is a view of the "Scene Graph" window and the "Attribute" window when arranging the sound node.

In VRML, to output a sound, it is necessary to arrange a sound node. The content preparation software tool 4 is constituted so as to add a sound node by the user clicking on the first "Sound" tab of the "Resource Library" window shown in FIG. 9 by the mouse 262 to open the sound library and dropping a sound node from the sound library.

First, the user views the "3D View" window and confirms that nothing has been selected. When a certain object is selected, the user selects "Unselect" by the pop-up menu of the "Scene Graph" window shown in FIG. 46 to instruct the release of the selection to the model editing tool 420.

Further, the user confirms that the object (cone) is visible in the "3D View" window. When it selects "Classic" from the sound library of the "ResourceLibrary" window and drops this into the "3D View" window, the model editing tool 420 adds the sound node to the graphic data of the object.

Figure 47B:
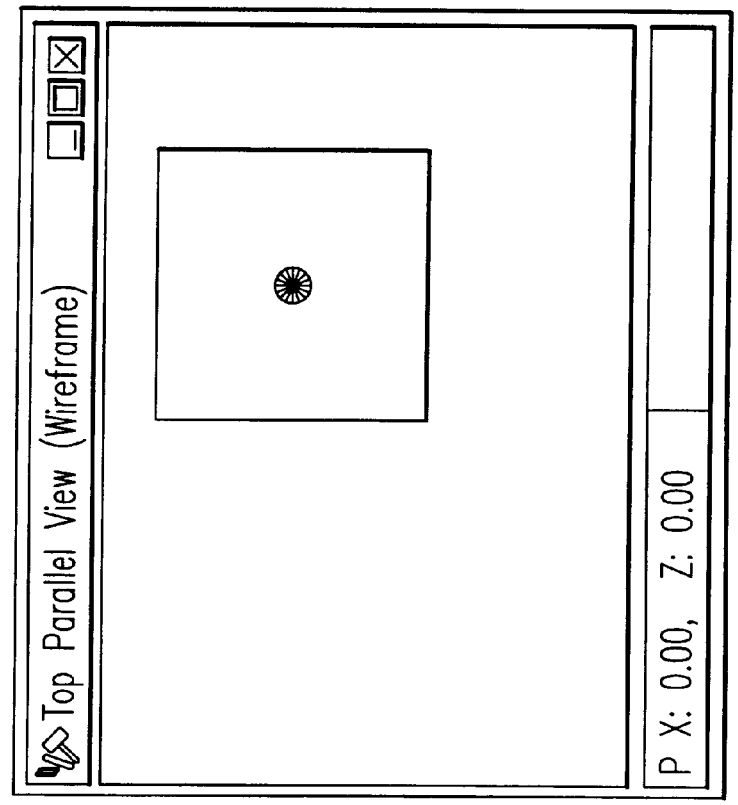
Figure 47A:
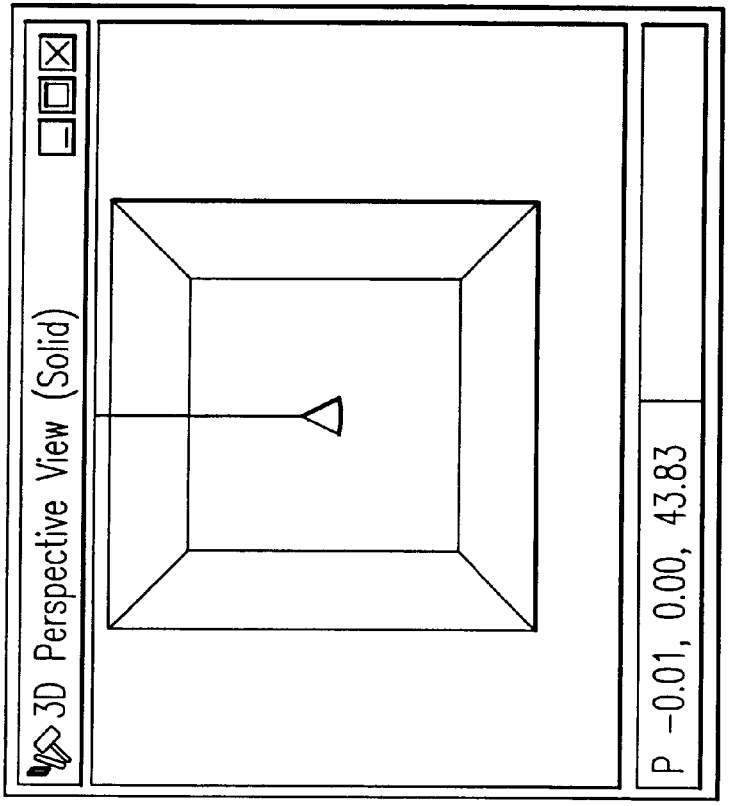

When the user clicks on the tree displayed in the "Scene Graph" window, the scene graph editing tool 424 displays the content shown in FIG. 47 and indicates to the user that the sound node has been added.

In the sound node, it is possible to designate the region of the sound by a "maxBack", "maxFront", or other field. Note that, in the default state when dropped from the library, "maxBack"="maxFront"=10 is set so that the sound is output when the cursor of the mouse 262 enters the region.

S434: Confirmation of Operation

The user can confirm the sound node by depressing the "Play" button. In the content preparation software tool 4, the cursor of the mouse 262 is set to already enter the region of the sound immediately after the sound node is dropped, therefore when the user depresses the "Play" button, the set sound (classiced music in this example) is output.

Further, in the content preparation software tool 4, the "spatialize" field of the sound node is set to "TRUE" in the default state. When moving (navigating) in the three-dimensional virtual space by using the mouse 262 in the "3D View" window, the magnitude of the sound and the left and right pans change in accordance with the position of the cursor of the mouse 262.

Next, when the user depresses the "Stop" button of the display device 24 to return to the preparation mode and selects "Sound" in the "Scene Graph" window, the model editing tool 420 displays a blinking bounding box showing the region where the sensor (TouchSensor) generates the event outputting the sound around the object (cone) shown in the "3D View" window on the left side and the "ParallelView" window on the right side as shown in FIG. 47, so the user can visually confirm the region of the sound.

Further, when the user selects "Parallel View/Tip View" from the pop-up menu of the "3D View" window, the model editing tool 420 three-dimensionally displays the image of the object (cone) from the front surface in the "3D View" window on the left side of FIG. 47 and two-dimensionally displays the image of the object (cone) seen from above in the "ParallelView" window on the right side.

Figure 48B:
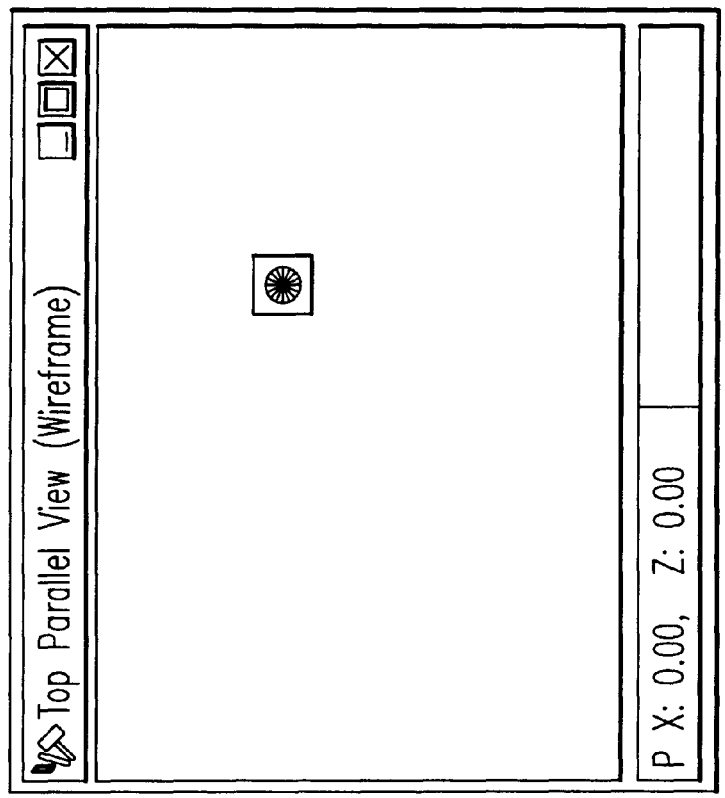
Figure 48A:
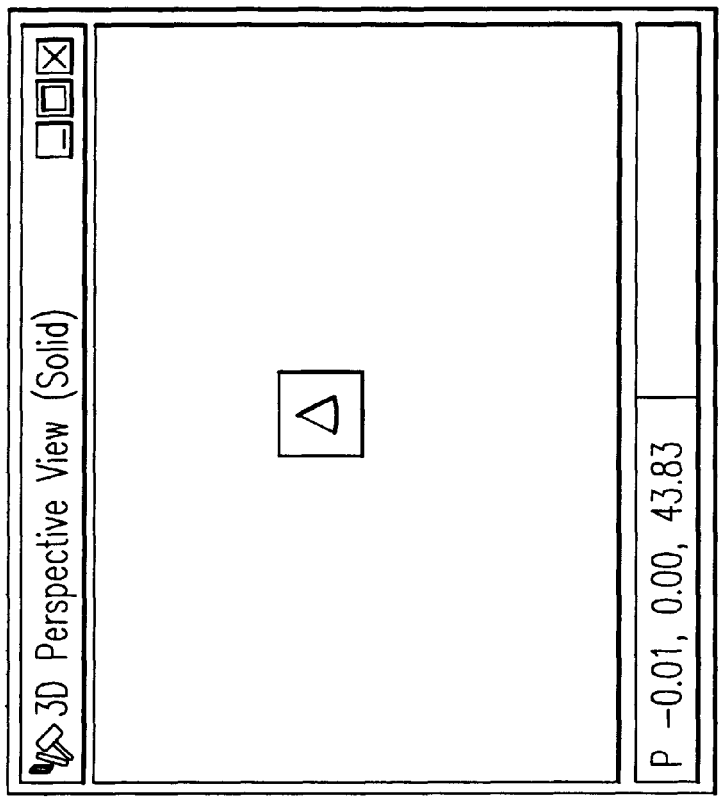

When the user moves the viewpoint so as to see the whole object and bounding box in the "ParallelView" window shown in FIG. 48, if it depresses the shift key of the keyboard 260 and the left button of the mouse 262 (not illustrated) and drags the "ParallelView" window in the downward direction, the model editing tool 420 displays the image of the object from a far away viewpoint in the "ParallelView" window.

When the user pushes the "Play" button and then moves the cursor of the mouse 262 in the "3D View" window, a sound is output when the cursor enters the region indicated by the bounding box shown in FIG. 46. The output of the sound is stopped when the cursor leaves this region.

FIG. 48 is a view of an example of modification of the size of the region for outputting the sound shown in FIG. 47.

In the content preparation software tool 4, it is possible to numerically designate the region indicated by the bounding box in the "Attribute" window or switching the mouse mode on the menu screen shown in FIG. 9, as shown in FIG. 47, so as to move, rotate, and scale this region by using the mouse.

S435: Setting and Routing of AudioCliP Node

When adding the sound node by the above work, the sound is automatically output when the cursor of the mouse 262 enters into the region of sound indicated by the bounding box in FIG. 34 and FIG. 35. This is related to the setting of "startTime"=0,"stopTime"=0, and "loop"="TRUE" of the AudioClip node attached to the sound node.

In VRML 2.0, "startTime" of the AudioClip node represents the start time and outputs sound in the case of "startTime">="stopTime". Further, it is also possible to repeatedly output the sound by setting "loop"="TRUE". Further, in FIG. 47 and FIG. 48, when modification is made so as not to give off a sound until the region indicated by the bounding box is clicked by the mouse 262, "startTime"=−1 is set. Further, in order to stop the output of the sound when the region indicated by the bounding box is clicked, the clicked time is assigned for "startTime".

Figure 49:
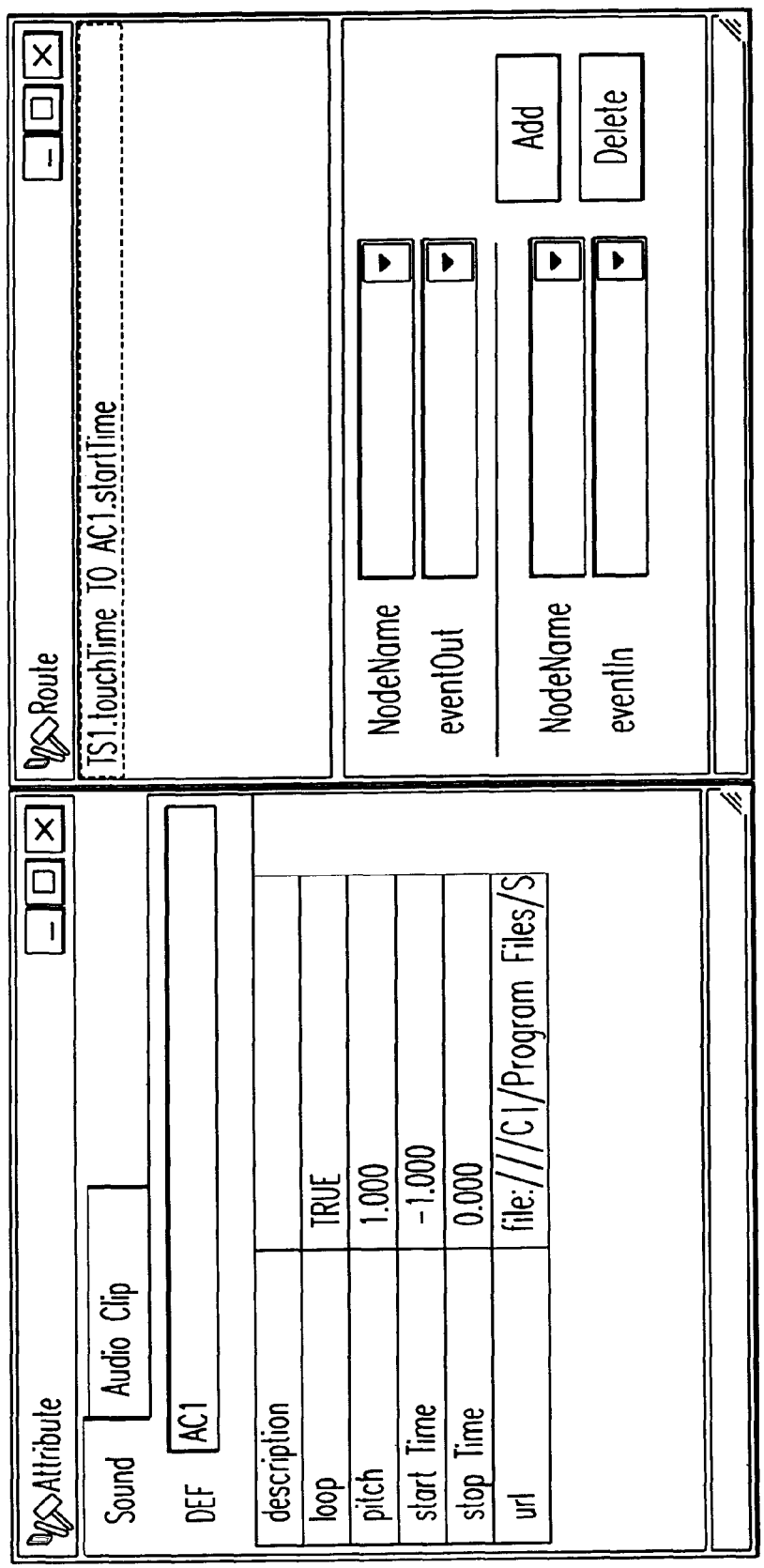

FIG. 49 is a view of an example of the modification of AudioClip node and the routing from the sensor (TouchSensor) to the AudioClip node.

For example, in order to set the stopping of the output of the sound when the region defined by the bounding box is clicked, as shown in FIG. 48, the user must select the first "AudioClip" tab of the "ResourceLibrary" window, attach a name "AC1" to the AudioClip node, and further perform the routing from "touchTime" of the sensor (TouchSensor;TS1) to "startTime" of the AudioClip node in the "Route" window.

S436: Confirmation of Operation

When the user depresses the "Play" button by the mouse 262 and clicks the object (cone) displayed in the "3D View" window, the output of the sound is started by the browser emulator 460.

The operation of the third content is as follows.

When the user clicks on the object (cone) in the "3D View" window by the mouse 262, the event "touchTime" is generated from the sensor (TouchSensor) attached to the object. In this event, the clicked time (in VRML 2.0, the relative time from 00:00:00 GMT Jan. 1, 1970) is transferred to "startTime" of AudioClip, "startTime" is set, and the output of the sound is commenced. Note that, in this example, the loop field of the AudioClip node is set to "TRUE", therefore the sound (music) is repeatedly reproduced and output.

With this setup, the output of the sound cannot be stopped unless the cursor is moved to the outside of the region of the sound, therefore when stopping the output of the sound, the user must use the text editor 426, etc., to modify the program so as to stop the output of the sound under predetermined conditions.

Note that, in the embodiment, the explanation was given by taking as an example the case of preparing the graphic data of a conical object, attaching a touch sensor to the graphic data, and modifying the common node (light) or color or outputting a sound, but the content preparation software tool 4 of the present embodiment is not limited to this. Needless to say the VRML content can be prepared by using all nodes supported by VRML 2.0.

Further, the content preparation software tool 4 can handle languages for describing three-dimensional virtual space other than VRML by suitable modification.

Effect of the Invention

According to the present invention, the switching of file scopes can be performed reliably without error in a state ensuring a match. Further, the processing for switching file scopes of the present invention can be realized by an easy-to-operate interactive manner.

Further, according to the present invention, the following effects are obtained.

According to the graphic data generating apparatus, graphic data generation method, and medium of the same of the present invention, it is possible to comprehensively perform work such as the preparation of graphic data showing the shape of a graphic of an object in virtual space, the position in a three-dimensional space, etc., program an event (script) in the virtual space, and establish correspondence between the pointing to an object and the activation of a script (routing).

Further, according to the graphic data generating apparatus, graphic data generation method, and medium of the same of the present invention, the model, script, routing, and other result of work can be immediately confirmed.

Further, according to the graphic data generating apparatus, graphic data generation method, and medium of the same of the present invention, the preparation of software enabling operations in the three-dimensional virtual space to be performed by an interactive manner is made easy.

Further, according to the graphic data generating apparatus, graphic data generation method, and medium of the same of the present invention, the shape of a three-dimensional object displayed in the virtual space can be correctly grasped by a two-dimensional screen display.

Further, according to the graphic data generating apparatus, graphic data generation method, and medium of the same of the present invention, it is possible to visually and easily set the range of the valid region of a sensor generating an event in accordance with an operation with respect to the object and to confirm the valid region of the set sensor. Moreover, it is easy to confirm the operation of the event generated in accordance with an operation with respect to the sensor.

INDUSTRIAL APPLICABILITY

The graphic data generating apparatus, graphic data generation method, and medium of same of the present invention can be used widely as authoring tools for content in a three-dimensional graphic description language expressing an object in a three-dimensional virtual space.

LIST OF REFERENCES

1 . . . net work system
   10 . . . in house net work
      100 . . . hard disk drive
      102 . . . server device
   12 . . . Internet system
   14 . . . Internet provider
   16 . . . ISDN net
2 . . . client (subscriber) system
   20 . . . computer
   24 . . . display device
   26 . . . input device
      260 . . . keyboard
      262 . . . mouse
   28 . . . recording medium
      280 . . . floppy disk
      282 . . . MO disk
4 . . . content preparation software tool
   40 . . . graphical user interface unit (GUI)
   42 . . . editing tool
      420 . . . model editing tool
      422 . . . routing editing tool 424 . . . scene graph editing tool
426 . . . text editor
44 . . . scene graph data base
46 . . . working tool
  460 . . . browser emulator
  462 . . . file input/output unit
  464 . . . file scope management unit
  466 . . . backup manager
47 . . . script preparation unit
  470 . . . Java emulator
  472 . . . Java debugger
  474 . . . Java compiler

I claim:

1. A graphic data generating apparatus comprising:
   a display processing means for displaying a three dimensional object in an editing window of a display device;
   an operation instructing means for giving an operation instruction for a displayed object;
   a file scope processing means for processing a file scope comprising a set of nodes of a program referred to by a file to be edited, the file scope processing means co-operating with the display processing means and processing the file scope based on an operation instruction given by the operation instructing means, wherein the display processing means displays the three dimensional object according to data in an edited file; and
   a file scope management unit configured to manage objects and nodes based on a change in any of the objects and nodes within a scope referring to other objects and other nodes, or referred to by other objects and other nodes, to maintain compatibility between said objects and said nodes and said other objects and said other nodes.

2. The graphic data generating apparatus of claim 1, further comprising:
   browser emulating means for causing the display processing means to confirm an operation of the edited file.

3. A graphic data generating apparatus as set forth in claim 1, wherein the file scope is defined as a hierarchical tree structure.

4. A graphic data generating apparatus as set forth in claim 1, wherein the file scope processing means limits the node covered by the editing to the file scope displayed in the window.

5. A graphic data generating apparatus, comprising:
   a display processing means for displaying a three-dimensional object in an editing window of a display device;
   an operation instruction means for giving an operation instruction for a displayed object; and
   a file scope processing means for processing a file scope comprising a set of nodes of program referred to by a file to be edited, the file scope processing means co-operating with the display processing means and processing the file scope based on an operation instruction given by the operation instruction means, wherein editing covers editing at a time of routing and preparing a script; and
   a file scope management unit configured to manage objects and nodes based on a change in any of the objects and nodes within a scope referring to other objects and other nodes, or referred to by other objects and other nodes, to maintain compatibility between said objects and said nodes and said other objects and said other nodes.

6. A graphic data generating apparatus as set forth in claim 5, wherein the file scope is defined as a hierarchical tree structure.

7. A graphic data generating apparatus as set forth in claim 5, wherein the file scope processing means limits the nodes covered by the editing to the file scope displayed in the window.

8. A graphic data generating apparatus as set forth in any one of claims 5 to 7, wherein the file is a VRML file.

9. A graphic data generating apparatus comprising:
   a display processing means for displaying a three dimensional object in an editing window of a display device;
   an operation instructing means for giving an operation instruction for a displayed object;
   a node preparing means for preparing nodes of a program for realizing an event generated in response to an operation instruction from the operation instructing means with respect to a displayed object; and
   a file scope management unit configured to manage objects and nodes based on a change in any of the objects and nodes within a scope referring to other objects and other nodes, or referred to by other objects and other nodes, to maintain compatibility between said objects and said nodes and said other objects and said other nodes.

10. A graphic data generating apparatus as set forth in claim 9, further comprising:
    an editing means for editing the prepared objects and nodes;
    a selecting means for selecting one of the graphic objects and nodes in response to an operation instruction of the operation instructing means; and
    an editing coverage restricting means for restricting the coverage of the editing to within a scope including the selected one of the objects and nodes.

11. A graphic data generating apparatus as set forth in claim 10,
    further comprising a selecting means for selecting one of the graphic objects and nodes in response to an operation instruction of the operation instructing means,
    the display processing means operating linked with the selecting means and displaying the objects and nodes in the scope including the selected one of the objects and nodes.

12. A graphic data generating apparatus as set forth in claim 11, wherein the file scope management unit comprises:
    a first processing means for changing all corresponding data transfer portions of objects and nodes in the same scope to conform with a changed data transfer portion when there is a change in a data transfer portion in one of the graphic objects and nodes transferring data between objects and nodes; and
    a second processing means for changing names of objects and nodes in the same scope so as to be referred to be different names with each reference when objects and nodes are referred to overlappingly by the same node in the said object and node.

13. A graphic data generating apparatus as set forth in claim 12, wherein:
    editing covers editing at a time of routing and preparing a script and
    the file scope is defined as a hierarchical tree structure.

14. A graphic data generating apparatus as set forth in any one of claims 9 to 13, wherein the file is a VRML file.

15. A graphics data generating method comprising the steps of:
  displaying a three-dimensional object in an editing window of a display device;
  processing a file scope, comprised of a set of nodes of a program referred to by a file being edited, wherein the three-dimensional object is displayed according to the processing of the file scope; and
  managing objects and nodes based on a change in any of the objects and nodes within a scope referring to other objects and other nodes, or referred to by other objects and nodes, to maintain compatibility between said objects and said nodes and said other objects and said other nodes.

16. A graphic data generating method as set forth in claim 15, wherein the file scope is defined as a hierarchical tree structure.

17. A graphic data generating method as set forth in claim 15, wherein, in the file scope processing, the nodes covered by the editing are limited to the file scope displayed in the window.

18. A graphic data generating method as set forth in claim 15, wherein the file is a VRML file.

19. A graphic data generating method, comprising the steps of:
  displaying a three-dimensional object in an editing window of a display device;
  processing a file scope comprised of a set of nodes of a program referred to by a file being edited, based on an operation instruction, wherein editing covers editing at a time of routing and preparing a script; and
  managing objects and nodes based on a change in any of the objects and nodes within a scope referring to other objects and other nodes, or referred to by other objects and nodes, to maintain compatibility between said objects and said nodes and said other objects and said other nodes.

20. A graphic data generating method as set forth in claim 19, wherein said file scope is defined as a hierarchical tree structure.

21. A graphic data generating method as set forth in either one of claims 19 to 20, or wherein, in the file scope processing, the nodes covered by the editing are limited to the file scope displayed in the window.

22. A graphic data generating method as set forth in any one of claims 19 to 21, wherein the file is a VRML file.

23. A graphic data generating method comprising the steps of:
  displaying a three-dimensional object in an editing window of a display device;
  preparing a program for realizing an event generated in response to an operation on the displayed object; and
  managing objects and nodes based on a change in any of the objects and nodes within a scope referring to other objects and other nodes, or referred to by other objects and nodes, to maintain compatibility between said objects and said nodes and said other objects and said other nodes.

24. A graphic data generating method as set forth in claim 23, which further including the steps of:
  editing the prepared objects and nodes,
  selecting one of the nodes and nodes in accordance with an operation instruction, and
  including the selected one of the objects and nodes in the coverage of the editing.

25. A graphic data generating method as set forth in claim 24, the method including the steps of:
  selecting one of the objects and nodes in response to an operation instruction and
  displaying objects and nodes in a scope containing the selected one of the objects and nodes.

26. A graphic data generating method as set forth in claim 25, the method comprising the steps of:
  performing a first processing for changing all corresponding data transfer portions of objects and nodes in the same scope to conform with a changed data transfer portion when there is a change in a data transfer portion in one of the graphic objects and nodes transferring data between objects and nodes; and
  performing a second processing for changing names of objects and nodes in the same scope so as to be referred to by different names with each reference when objects and nodes are referred to overlappingly by the same node in the said object and node or performing one of the same.

27. A computer-readable medium having embodied therein a computer program for executing a graphic data generating method comprising the steps of:
  displaying a three-dimensional object in an editing window of a display device;
  processing a file scope comprising a set of nodes of a program referred to by a file being edited based on an operation instruction, wherein the three-dimensional object is displayed according to the file scope processing; and
  managing objects and nodes based on a change in any of the objects and nodes within a scope referring to other objects and other nodes, or referred to by other objects and nodes, to maintain compatibility between said objects and said nodes and said other objects and said other nodes.

28. A computer-readable medium having embodied therein a computer program as set forth in claim 27, wherein the program enables editing at a time of routing a script.

29. A computer-readable medium having embodied therein a computer program as set forth in claim 27, wherein the program enables editing at a time of preparing a script.

30. A computer-readable medium having embodied therein a computer program as set forth in claim 27, wherein the program defines the file scope as a hierarchical tree structure.

31. A computer-readable medium having embodied therein a computer program as set forth in claim 27, displaying the nodes covered by the editing to the file scope displayed in the window the file scope processing.

32. A computer-readable medium having embodied therein a computer program as set forth in claim 27, wherein the file is a VRML file.

33. A computer-readable medium having embodied therein a computer program for executing a graphic data generating method comprising the steps of:
  displaying a three-dimensional object in an editing window of a display device;
  processing a file scope comprising a set of nodes of a program referred to by a file being edited based on an operation instruction, wherein
  editing includes editing at a time of routing and preparing a script and the file scope is defined as a hierarchical tree structure; and
  changing objects and nodes based on a change in any of the objects and nodes within a scope referring to other objects and other nodes, or referred to by other objects and nodes, to maintain compatibility between said objects and said nodes and said other objects and said other nodes.

34. A computer-readable medium having embodied therein a computer program as set forth in claim 33, displaying the nodes covered by the editing to the file scope displayed in the window the file scope processing.

35. A computer-readable medium having embodied therein a computer program as set forth in either one of claim 33 or 34, wherein the file is a VRML file.

36. A computer-readable medium having embodied therein a computer program executing a graphic data generating method comprising the steps of:
   displaying a three-dimensional object in an editing window of a display device;
   preparing nodes of a program for realizing an event generated in response to an operation instruction with respect to a displayed object; and
   managing objects and nodes based on a change in any of the objects and nodes within a scope referring to other objects and other nodes, or referred to by other objects and nodes, to maintain compatibility between said objects and said nodes and said other objects and said other nodes.

37. A computer-readable medium having embodied therein a computer program as set forth in claim 36, wherein the program comprises the steps of:
   editing the prepared objects and nodes;
   selecting one of the objects and nodes in response to an operation instruction; and
   restricting the coverage of the editing to within a scope including the selected one of the objects and nodes.

38. A computer-readable medium having embodied therein a computer program as set forth in claim 37, wherein the program further comprises the step of:
   displaying the objects and nodes in a scope including the one of the objects and nodes selected in response to the operation instruction.

39. A computer-readable medium having embodied therein a computer program as set forth in claim 38, wherein the program further comprises the steps of:
   a first processing for changing all corresponding data transfer portions of objects and nodes in the same scope to conform with a changed data transfer portion when there is a change in a data transfer portion in one of the graphic objects and nodes transferring data between objects and nodes and
   a second processing for changing names of objects and nodes in the same scope so as to be referred to by different names with each reference when objects and nodes are referred to overlappingly by the same node in the said object and node or performs one of the same.

40. A program as set forth in any one of claim 27–34 and 36–39, wherein the program is mediated in a computer system.

41. A computer-readable medium having embodied therein a computer program as set forth in any one of claims 27–34 and 36–39, wherein the program is transferred through a network including a server apparatus.

42. A graphic data generating method, comprising the steps of:
   displaying a three-dimensional object in an editing window of a display device;
   processing a file scope comprising a set of nodes of a program referred to by a file being edited based on an operation instruction, wherein the file is being edited with respect to routing data and script preparation data; and
   managing objects and nodes based on a change in any of the objects and nodes within a scope referring to other objects and other nodes, or referred to by other objects and nodes, to maintain compatibility between said objects and said nodes and said other objects and said other nodes.

43. An apparatus for preparing and editing data used to create three-dimensional graphic images, comprising:
   display means for displaying a graphical user interface for data input by a user and for displaying scene graph data, comprising attribute data of an object in three-dimensional virtual space;
   editing means for providing a user with functions for the preparation of scene graph data;
   database means for storing scene graph data;
   confirmation means for confirming an operation of scene graph data prepared by the editing means; and
   a file scope management unit configured to manage objects and nodes based on a change in any of the objects and nodes within a scope referring to other objects and other nodes, or referred to by other objects and other nodes, to maintain compatibility between said objects and said nodes and said other objects and said other nodes.

44. An apparatus according to claim 43, wherein the display means displays one or more elements from the group consisting of a conductor window, a 3-D perspective view window, a parallel view window, a resource library window, a scene graph window, a world information window, an appearance window, a route window, an attribute window, a script expert window and a script editor window.

45. An apparatus according to claim 43, wherein the editing means comprises one or more elements from the group consisting of a model editing tool, a routing editing tool, a scene graph editing tool, a text editor and a template preparation tool.

46. An apparatus according to claim 43, wherein the confirmation means comprises one or more elements from the group consisting of a browser emulator adapted for displaying three-dimensional spaces, a file input unit, a file output unit, a file scope management unit and a backup restore unit.

47. An apparatus according to claim 43, wherein the database means comprises one or more elements from the group consisting of a random access memory, a floppy disk, an optical disk and a hard drive.

48. An apparatus according to claim 43, further comprising a script preparation means.

49. An apparatus according to claim 43, wherein the confirmation means causes the display means to display the operation of scene graph data prepared by the editing means.

50. An apparatus according to claim 48, wherein the script preparation means comprises one or more elements from the group consisting of an emulator, a debugger and a compiler.

51. A method for facilitating the process of editing data used to create three-dimensional graphic images, comprising the steps of:
   receiving a file of edited model data which corresponds to an attribute or an interaction of a virtual three-dimensional object; automatically compiling the file of edited model data;
   displaying a three-dimensional graphic image corresponding to the file of edited model data without activating a browser; and managing objects and nodes based on a change in any of the objects and nodes within a scope referring to other objects and other nodes, or referred to by other objects and other nodes, to maintain compatibility between said objects and said nodes and said other objects and said other nodes.

52. A graphic data generating apparatus comprising:
a display processor configured to display a three-dimensional object in an editing window of a display device;
an input device configured to give an operation instruction for a displayed object;
a scene graph editing tool configured to process a file scope comprising a set of nodes of a program referred to by a file to be edited, wherein the scene graph editing tool co-operates with the display processor and processes the file scope based on an operation instruction given by the input device, and wherein the display processor displays the three dimensional object according to data in an edited file; and
a management device configured to manage objects and nodes based on a change in any of the objects and nodes within a scope referring to other objects and other nodes, or referred to by other objects and other nodes, to maintain compatibility between said objects and said nodes and said other objects and said other nodes.

53. A graphic data generating apparatus as set forth in claim 52, wherein the file scope is defined as a hierarchical tree structure.

54. A graphic data generating apparatus as set forth in claim 52, wherein the scene graph editing tool limits the nodes covered by the editing to the file scope displayed in the window.

55. A graphic data generating apparatus as set forth in claim 52, wherein the file is a VRML file.

56. A graphic data generating apparatus, comprising:
a display processing means for displaying a three-dimensional object in an editing window of a display device;
an operation instructing means for giving an operation instruction for a displayed object;
a file scope processing means for processing a file scope comprising a set of nodes of a program referred to by a file to be edited, the file scope processing means co-operating with the display processing means and processing the file scope based on an operation instruction given by the operation instructing means, wherein an editing process facilitated by the graphic data generating apparatus includes the editing processes associated with routing and preparing a script; and
a file scope management unit configured to manage objects and nodes based on a change in any of the objects and nodes within a scope referring to other objects and other nodes, or referred to by other objects and other nodes, to maintain compatibility between said objects and said nodes and said other objects and said other nodes.

57. A graphic data generating apparatus as set forth in claim 56, wherein the file scope is defined as a hierarchical tree structure.

58. A graphic data generating apparatus as set forth in claim 56, wherein the file scope processing means limits the nodes covered by the editing to the file scope displayed in the window.

59. A graphic data generating apparatus as set forth in claim 56, wherein the file is a VRML file.

60. A graphic data generating apparatus, comprising:
a display processor for displaying a three-dimensional object in an editing window of a display device;
an input device for giving an operation instruction for a displayed object;
a node preparing device for preparing nodes of a program for realizing an event generated in response to an operation instruction from the input device with respect to a displayed object; and
a management device configured to manage objects and nodes based on a change in any of the objects and nodes within a scope referring to other objects and other nodes, or referred to by other objects and other nodes, to maintain compatibility between said objects and said nodes and said other objects and said other nodes.

61. A graphic data generating apparatus as set forth in claim 60, wherein the management device comprises:
a first processor for changing all corresponding data transfer portions of objects and nodes in the same scope to conform with a changed data transfer portion when there is a change in a data transfer portion in one of the graphic objects and nodes transferring data between objects and nodes; and
a second processor for changing names of objects and nodes in the same scope so as to be referred to by different names with each reference when objects end nodes are referred to overlappingly by the same node in the said object and node.

62. A graphic data generating apparatus as set forth in claim 60, further comprising:,
an editor for editing the prepared objects and nodes;
a selector for selecting one of the graphic objects and nodes in response to an operation instruction of the input device; and
an editing coverage restricting means for restricting the coverage of the editing to within a scope including the selected one of the objects and nodes.

63. A graphic data generating apparatus as set forth in claim 62, wherein the display processor cooperates with the selector and displays the objects and nodes in a scope comprising the selected one of the objects and nodes.

64. A graphic data generating apparatus for facilitating an editing process, comprising:
a display processor configured to display a three-dimensional object in an editing window of a display device;
an input device configured to give an operation instruction for a displayed object;
a scene graph editing tool configured to process a file scope comprising a set of nodes of a program referred to by a file to be edited, the scene graph editing tool co-operating with the display processor and processing the file scope based on an operation instruction given by the input device, wherein editing processes facilitated by the graphic data generating apparatus comprise the editing processes associated with routing and preparing a script; and
a management device configured to manage objects and nodes based on a change in any of the objects and nodes within a scope referring to other objects and other nodes, or referred to by other objects and other nodes, to maintain compatibility between said objects and said nodes and said other objects and said other nodes.

65. A graphic data generating apparatus as set forth in claim 64, wherein the file scope is defined as a hierarchical tree structure.

66. A graphic data generating apparatus as set forth in claim 64, wherein the scene graph editing tool limits the nodes covered by the editing to the file scope displayed in the window.

67. A graphic data generating apparatus as set forth in claim 64, wherein the file is a VRML file.

* * * * *